US012355552B2

(12) United States Patent
Hand

(10) Patent No.: US 12,355,552 B2
(45) Date of Patent: Jul. 8, 2025

(54) DYNAMICALLY SWITCHING QUEUEING SCHEMES FOR NETWORK SWITCHES

(71) Applicant: Infinera Corporation, Sunnyvale, CA (US)

(72) Inventor: Steven J. Hand, Los Gatos, CA (US)

(73) Assignee: Infinera Corporation, San Jose, CA (US)

( * ) Notice: Subject to any disclaimer, the term of this patent is extended or adjusted under 35 U.S.C. 154(b) by 0 days.

(21) Appl. No.: 16/732,108

(22) Filed: Dec. 31, 2019

(65) Prior Publication Data

US 2021/0075536 A1 Mar. 11, 2021

Related U.S. Application Data

(60) Provisional application No. 62/896,052, filed on Sep. 5, 2019.

(51) Int. Cl.
*H04J 14/02* (2006.01)
*H03M 1/00* (2006.01)
(Continued)

(52) U.S. Cl.
CPC ......... *H04J 14/0298* (2013.01); *H03M 1/001* (2013.01); *H04B 10/27* (2013.01);
(Continued)

(58) Field of Classification Search
CPC .... H04J 14/0298; H04J 14/0282; H04J 14/06; H04J 14/0202; H04J 14/0206;
(Continued)

(56) References Cited

U.S. PATENT DOCUMENTS

| 4,483,000 A | 11/1984 | Yamamoto et al. |
| 4,528,565 A | 7/1985 | Hauptmann |

(Continued)

FOREIGN PATENT DOCUMENTS

| EP | 0512642 | 11/1992 |
| EP | 3208957 | 8/2017 |

(Continued)

OTHER PUBLICATIONS

Bosco et al; Advanced Modulation Techniques for Flexible Optical Transceivers: The Rate/Reach Tradeoff; Jan. 2019; Journal of Light wave technology, vol. 37, No. 1; pp. 1-14. (Year: 2019).*

(Continued)

*Primary Examiner* — Amritbir K Sandhu

(57) ABSTRACT

An example node includes a receiver, a switch circuit, and a transmitter. The receiver is configured to receive a first modulated optical signal including a first plurality of optical subcarriers, and supply a plurality of data streams based on the first plurality of optical subcarriers. Each of the data streams is associated with a corresponding one of the plurality of optical subcarriers. The switch circuit is configured to receive the data streams, and supply the data streams to a plurality of switch outputs. The transmitter is configured to receive the data streams, and supply a second modulated optical signal based on the data streams. The second modulated optical signal carries a second plurality of optical subcarriers. Each of the second plurality of optical subcarriers is associated with a corresponding one of the data streams.

12 Claims, 32 Drawing Sheets

(51) Int. Cl.
  *H04B 10/27* (2013.01)
  *H04B 10/50* (2013.01)
  *H04B 10/548* (2013.01)
  *H04B 10/61* (2013.01)
  *H04L 27/20* (2006.01)
  *H04L 41/0896* (2022.01)
  *H04L 43/0882* (2022.01)
  *H04L 49/15* (2022.01)
  *H04Q 11/00* (2006.01)

(52) U.S. Cl.
  CPC ......... *H04B 10/503* (2013.01); *H04B 10/548* (2013.01); *H04B 10/61* (2013.01); *H04J 14/0202* (2013.01); *H04J 14/0206* (2013.01); *H04J 14/0217* (2013.01); *H04J 14/0272* (2013.01); *H04L 27/2096* (2013.01); *H04L 41/0896* (2013.01); *H04L 43/0882* (2013.01); *H04L 49/15* (2013.01); *H04Q 11/0003* (2013.01); *H04Q 11/0005* (2013.01); *H04Q 11/0062* (2013.01); *H04Q 11/0066* (2013.01); *H04J 2203/0003* (2013.01); *H04Q 2011/0041* (2013.01); *H04Q 2011/0052* (2013.01); *H04Q 2011/0069* (2013.01); *H04Q 2011/0086* (2013.01)

(58) Field of Classification Search
  CPC .. H04J 14/0217; H04J 14/0272; H03M 1/001; H04B 10/503; H04B 10/548; H04B 10/61; H04B 10/27; H04L 27/2096; H04L 41/0896; H04L 43/0876; H04L 43/0882; H04L 49/15; H04Q 11/0003; H04Q 11/0005; H04Q 11/0062; H04Q 11/0066; H04Q 2011/0041; H04Q 2011/0052; H04Q 2011/0069; H04Q 2011/0086
  USPC .......................................................... 398/76
  See application file for complete search history.

(56) References Cited

U.S. PATENT DOCUMENTS

| | | | |
|---|---|---|---|
| 5,153,762 A | 10/1992 | Huber | |
| 5,208,692 A | 5/1993 | McMahon | |
| 5,596,436 A | 1/1997 | Sargis | |
| 5,822,094 A | 10/1998 | O'Sullivan | |
| 5,825,857 A | 10/1998 | Reto | |
| 6,046,838 A | 4/2000 | Kou | |
| 6,362,913 B2 | 3/2002 | Ooi et al. | |
| 6,525,857 B1 | 2/2003 | Way | |
| 6,563,880 B1 | 5/2003 | Hunsinger et al. | |
| 6,580,544 B1 | 6/2003 | Lin et al. | |
| 6,687,044 B2 | 2/2004 | Paquet | |
| 7,266,306 B1 | 9/2007 | Harley et al. | |
| 7,466,919 B1 | 2/2008 | Birk et al. | |
| 7,346,284 B2 | 3/2008 | Wan | |
| 7,376,358 B2 | 5/2008 | Roberts et al. | |
| 7,447,436 B2 | 11/2008 | Yee | |
| 7,701,842 B2 | 4/2010 | Roberts et al. | |
| 7,715,710 B2 | 5/2010 | Wan | |
| 7,729,621 B2 | 6/2010 | Nahapetian et al. | |
| 7,756,421 B2 | 7/2010 | Roberts | |
| 7,826,752 B1 | 11/2010 | Zanoni | |
| 8,184,992 B2 | 5/2012 | Kikuchi | |
| 8,203,777 B2 | 6/2012 | Smith et al. | |
| 8,213,794 B2 * | 7/2012 | Wei ................... | H04J 14/0247 398/48 |
| 8,412,047 B2 | 4/2013 | Tanaka | |
| 8,437,645 B2 | 5/2013 | Boffi et al. | |
| 8,472,810 B2 | 6/2013 | Akiyama | |
| 8,477,056 B2 | 7/2013 | Sun et al. | |
| 8,477,656 B2 | 7/2013 | O'Mahony | |
| 8,478,137 B2 | 7/2013 | Komaki et al. | |
| 8,655,190 B2 | 2/2014 | Wu et al. | |
| 8,682,180 B1 | 3/2014 | Nimon et al. | |
| 8,730,079 B2 | 5/2014 | Tudose | |
| 8,768,177 B2 | 7/2014 | Wu et al. | |
| 8,861,977 B2 | 10/2014 | McNicol | |
| 8,929,750 B2 | 1/2015 | Ishihara | |
| 8,965,203 B1 | 2/2015 | Vahdat | |
| 8,971,723 B2 | 3/2015 | Le Taillandier De Gabory | |
| 8,989,593 B2 | 3/2015 | Sun et al. | |
| 9,020,363 B2 | 4/2015 | Yasuda | |
| 9,048,957 B2 | 6/2015 | Nakashima | |
| 9,112,609 B2 | 8/2015 | Kim et al. | |
| 9,154,231 B2 | 10/2015 | Kaneda | |
| 9,166,692 B1 | 10/2015 | Felderman | |
| 9,197,320 B2 | 11/2015 | Vassilieva | |
| 9,244,928 B1 | 1/2016 | Zhang et al. | |
| 9,270,379 B2 | 2/2016 | Huang et al. | |
| 9,281,915 B2 | 3/2016 | Kaneda | |
| 9,363,585 B2 | 6/2016 | Carpini | |
| 9,419,720 B2 | 8/2016 | Akiyama | |
| 9,461,749 B2 | 10/2016 | Jansen et al. | |
| 9,485,554 B1 | 11/2016 | Kim | |
| 9,553,675 B2 | 1/2017 | Karar et al. | |
| 9,608,866 B2 | 3/2017 | Nagarajan | |
| 9,673,907 B1 | 6/2017 | Vassilieva | |
| 9,686,020 B2 | 6/2017 | Mochizuki et al. | |
| 9,705,592 B1 | 7/2017 | Schmogrow | |
| 9,735,881 B1 | 8/2017 | Agazzi et al. | |
| 9,991,953 B1 | 6/2018 | Fludger | |
| 10,014,975 B2 | 7/2018 | Krause et al. | |
| 10,027,424 B2 | 7/2018 | Zhuge et al. | |
| 10,243,653 B2 | 3/2019 | Wiswell | |
| 10,243,688 B2 | 3/2019 | Vassilieva | |
| 10,348,410 B1 | 7/2019 | Charlton | |
| 10,374,623 B1 | 8/2019 | Oveis Gharan | |
| 10,374,721 B2 | 8/2019 | Awadalla | |
| 10,389,447 B1 | 8/2019 | Khandani | |
| 10,397,190 B2 | 8/2019 | Akhavain Mohammadi | |
| 10,491,302 B1 | 11/2019 | Morris | |
| 10,523,315 B2 | 12/2019 | Jiang | |
| 10,547,388 B2 | 1/2020 | Ikeda | |
| 10,574,362 B2 | 2/2020 | Chen | |
| 10,587,358 B1 | 3/2020 | Ebrahimzad | |
| 10,601,520 B2 * | 3/2020 | Sun ....................... | H04B 10/61 |
| 10,742,328 B2 * | 8/2020 | Wu ..................... | H04B 10/675 |
| 10,855,377 B2 * | 12/2020 | Aono ..................... | H04B 10/60 |
| 2002/0003641 A1 | 1/2002 | Hall | |
| 2002/0005971 A1 | 1/2002 | Sasai | |
| 2002/0034194 A1 | 3/2002 | Shattil | |
| 2002/0067883 A1 | 6/2002 | Lo | |
| 2002/0114038 A1 | 8/2002 | Arnon | |
| 2002/0122518 A1 | 9/2002 | Yasuda et al. | |
| 2002/0145783 A1 | 10/2002 | Chang | |
| 2003/0020995 A1 | 1/2003 | Harasawa | |
| 2003/0223751 A1 | 12/2003 | Shimizu | |
| 2004/0016874 A1 | 1/2004 | Rao | |
| 2004/0019459 A1 | 1/2004 | Dietz | |
| 2004/0032643 A1 | 2/2004 | Chimfwembe | |
| 2004/0033074 A1 | 2/2004 | Hsu | |
| 2004/0105682 A1 | 6/2004 | Roberts | |
| 2004/0197103 A1 | 7/2004 | Roberts | |
| 2004/0151109 A1 | 8/2004 | Batra | |
| 2004/0198265 A1 | 10/2004 | Wallace | |
| 2004/0208614 A1 | 10/2004 | Price | |
| 2004/0252996 A1 | 12/2004 | McNicol | |
| 2005/0008085 A1 | 1/2005 | Lee | |
| 2005/0074037 A1 | 4/2005 | Rickard | |
| 2005/0111789 A1 | 5/2005 | Hayes | |
| 2005/0147415 A1 | 7/2005 | Fee | |
| 2005/0169585 A1 | 8/2005 | Aronson | |
| 2005/0175112 A1 | 8/2005 | Pisani | |
| 2005/0175339 A1 | 8/2005 | Herskowits | |
| 2006/0078336 A1 | 4/2006 | McNicol et al. | |
| 2006/0093052 A1 | 5/2006 | Cho | |
| 2006/0159454 A1 | 7/2006 | Bjornstad | |
| 2006/0215540 A1 | 9/2006 | Krishnamoorthi | |
| 2006/0233147 A1 | 10/2006 | Karabinis | |
| 2006/0269295 A1 | 11/2006 | Way | |

(56) References Cited

U.S. PATENT DOCUMENTS

| | | |
|---|---|---|
| 2006/0280510 A1 | 12/2006 | Onaka |
| 2007/0004465 A1 | 1/2007 | Papasakellariou |
| 2007/0025421 A1 | 2/2007 | Shattil |
| 2007/0092263 A1 | 4/2007 | Agazzi |
| 2008/0063409 A1 | 3/2008 | Toliver |
| 2008/0085125 A1 | 4/2008 | Frankel |
| 2008/0232816 A1 | 9/2008 | Hoshida |
| 2008/0267630 A1 | 10/2008 | Qian |
| 2009/0110033 A1 | 4/2009 | Shattil |
| 2009/0154336 A1 | 6/2009 | Green |
| 2009/0190929 A1 | 7/2009 | Khurgin |
| 2009/0196603 A1 | 8/2009 | Zhou |
| 2009/0214224 A1 | 8/2009 | Cho |
| 2009/0232234 A1 | 9/2009 | Du |
| 2009/0238578 A1 | 9/2009 | Taylor |
| 2009/0238580 A1 | 9/2009 | Kikuchi |
| 2009/0257344 A1 | 10/2009 | Huang |
| 2009/0257755 A1 | 10/2009 | Buelow |
| 2009/0092389 A1 | 11/2009 | Wei |
| 2010/0021163 A1 | 1/2010 | Shieh |
| 2010/0021166 A1 | 1/2010 | Way |
| 2010/0028002 A1 | 2/2010 | Qian |
| 2010/0086303 A1 | 4/2010 | Qian |
| 2010/0142964 A1 | 6/2010 | Chang et al. |
| 2010/0142967 A1 | 6/2010 | Perez |
| 2010/0178057 A1 | 7/2010 | Shieh |
| 2010/0189445 A1 | 7/2010 | Nakashima |
| 2010/0215368 A1 | 8/2010 | Qian |
| 2010/0246581 A1 | 9/2010 | Henry |
| 2010/0254707 A1 | 10/2010 | Peng |
| 2010/0329671 A1 | 12/2010 | Essiambre |
| 2010/0329683 A1 | 12/2010 | Liu |
| 2011/0097092 A1 | 4/2011 | Wagner et al. |
| 2011/0135301 A1 | 6/2011 | Myslinski |
| 2011/0142450 A1 | 6/2011 | Tanzi et al. |
| 2011/0150475 A1 | 6/2011 | Soto et al. |
| 2011/0158641 A1* | 6/2011 | Barnard ............ H04J 14/0201 398/25 |
| 2011/0176813 A1 | 7/2011 | Kim |
| 2011/0182577 A1 | 7/2011 | Wu |
| 2011/0249978 A1 | 10/2011 | Sasaki |
| 2011/0255870 A1 | 10/2011 | Grigoryan |
| 2012/0002703 A1 | 1/2012 | Yamashita |
| 2012/0033965 A1 | 2/2012 | Zhang |
| 2012/0045209 A1 | 2/2012 | Boyd |
| 2012/0082466 A1 | 4/2012 | Wu |
| 2012/0093510 A1 | 4/2012 | Zhang |
| 2012/0099864 A1 | 4/2012 | Ishihara |
| 2012/0141130 A1 | 6/2012 | Nakashima |
| 2012/0141135 A1 | 6/2012 | Yang |
| 2012/0148264 A1 | 6/2012 | Liu |
| 2012/0219285 A1 | 8/2012 | Dahan |
| 2012/0251119 A1 | 10/2012 | McNicol |
| 2012/0251121 A1 | 10/2012 | McNicol |
| 2012/0263471 A1 | 10/2012 | Buchali |
| 2012/0269510 A1 | 10/2012 | Hui |
| 2012/0269515 A1 | 10/2012 | Cvijetic |
| 2013/0070785 A1 | 3/2013 | Liu |
| 2013/0070786 A1 | 3/2013 | Liu |
| 2013/0101296 A1 | 4/2013 | Nishimoto |
| 2013/0108271 A1 | 5/2013 | Tang et al. |
| 2013/0136449 A1 | 5/2013 | Liu |
| 2013/0170834 A1 | 7/2013 | Cho et al. |
| 2013/0191877 A1 | 7/2013 | Rakib |
| 2013/0195452 A1 | 8/2013 | Hui |
| 2013/0202303 A1 | 8/2013 | Wilkinson |
| 2013/0251364 A1 | 9/2013 | Pachnicke |
| 2013/0286847 A1 | 10/2013 | Schmidt |
| 2014/0010543 A1 | 1/2014 | Lee |
| 2014/0056371 A1 | 2/2014 | Ji |
| 2014/0072303 A1 | 3/2014 | Pfau |
| 2014/0079390 A1 | 3/2014 | Kim |
| 2014/0079391 A1 | 3/2014 | Kim |
| 2014/0092924 A1 | 4/2014 | Krause et al. |
| 2014/0099116 A1 | 4/2014 | Bai |
| 2014/0126916 A1 | 5/2014 | Ota |
| 2014/0153925 A1 | 6/2014 | Nishihara et al. |
| 2014/0205286 A1 | 7/2014 | Ji et al. |
| 2014/0233963 A1 | 8/2014 | Le Taillandier De Gabory |
| 2014/0241727 A1 | 8/2014 | Lim et al. |
| 2014/0270759 A1 | 9/2014 | Djordjevic |
| 2014/0270761 A1 | 9/2014 | Xu |
| 2014/0270803 A1 | 9/2014 | Olsson |
| 2014/0294381 A1 | 10/2014 | McNicol |
| 2014/0314411 A1 | 10/2014 | Huang |
| 2014/0314416 A1 | 10/2014 | Vassilieva |
| 2014/0341587 A1 | 11/2014 | Nakashima |
| 2014/0363164 A1 | 12/2014 | Kim |
| 2014/0376930 A1 | 12/2014 | Shiba |
| 2015/0063808 A1 | 3/2015 | Xia |
| 2015/0071642 A1 | 3/2015 | Tanaka |
| 2015/0093118 A1 | 4/2015 | Jia |
| 2015/0098700 A1 | 4/2015 | Zhu |
| 2015/0117860 A1 | 4/2015 | Braun |
| 2015/0125160 A1 | 5/2015 | Wen |
| 2015/0188637 A1 | 7/2015 | Tanimura |
| 2015/0188642 A1 | 7/2015 | Sun |
| 2015/0229332 A1 | 8/2015 | Yuan |
| 2015/0229401 A1 | 8/2015 | Tanaka |
| 2015/0280853 A1 | 10/2015 | Sun |
| 2015/0288456 A1 | 10/2015 | Zhu |
| 2015/0289035 A1 | 10/2015 | Mehrvar |
| 2015/0296278 A1 | 10/2015 | Liu |
| 2015/0333860 A1 | 11/2015 | Rahn |
| 2016/0013881 A1 | 1/2016 | Rejaly et al. |
| 2016/0029403 A1 | 1/2016 | Roy et al. |
| 2016/0050021 A1 | 2/2016 | Hua |
| 2016/0057516 A1 | 2/2016 | Hochberg |
| 2016/0094292 A1 | 3/2016 | Mochizuki |
| 2016/0099777 A1 | 4/2016 | Liu |
| 2016/0112141 A1 | 4/2016 | Rahn |
| 2016/0142150 A1 | 5/2016 | Lyubomirsky |
| 2016/0191168 A1 | 6/2016 | Huang |
| 2016/0192042 A1 | 6/2016 | Mitchell |
| 2016/0197681 A1 | 7/2016 | Sun |
| 2016/0218812 A1 | 7/2016 | Okabe |
| 2016/0233963 A1 | 8/2016 | Zhuge et al. |
| 2016/0261347 A1 | 9/2016 | Karar |
| 2016/0277816 A1 | 9/2016 | Yuang |
| 2016/0316281 A1 | 10/2016 | Keyworth |
| 2016/0323039 A1* | 11/2016 | Sun ............ H04J 14/026 |
| 2017/0005747 A1 | 1/2017 | Kim |
| 2017/0019168 A1 | 1/2017 | Menard |
| 2017/0033864 A1 | 2/2017 | Nagarajan |
| 2017/0033999 A1 | 2/2017 | Nagarajan |
| 2017/0041691 A1 | 2/2017 | Rickman |
| 2017/0054513 A1 | 2/2017 | Guo |
| 2017/0070313 A1 | 3/2017 | Kato |
| 2017/0078028 A1 | 3/2017 | Zhang |
| 2017/0078044 A1 | 3/2017 | Hino |
| 2017/0104535 A1 | 4/2017 | Hoshida |
| 2017/0134836 A1 | 5/2017 | Sindhy |
| 2017/0149507 A1 | 5/2017 | Le Taillandier De Gabory |
| 2017/0163347 A1 | 6/2017 | Akiyama |
| 2017/0222716 A1* | 8/2017 | Nakashima ............ H04B 10/25 |
| 2017/0237500 A1 | 8/2017 | Nishimoto |
| 2017/0250775 A1 | 8/2017 | Kato |
| 2017/0324480 A1 | 11/2017 | Elmirghani |
| 2017/0366267 A1 | 12/2017 | Campos |
| 2017/0367061 A1 | 12/2017 | Kim |
| 2018/0034555 A1 | 2/2018 | Goh |
| 2018/0115407 A1 | 4/2018 | Melikyan |
| 2018/0120520 A1 | 5/2018 | Kelly |
| 2018/0145761 A1 | 5/2018 | Zhuge |
| 2018/0198547 A1 | 7/2018 | Mehrvar |
| 2018/0219632 A1 | 8/2018 | Yoshida |
| 2018/0234285 A1 | 8/2018 | Djordjevic |
| 2018/0241476 A1 | 8/2018 | Johnson |
| 2018/0278331 A1 | 9/2018 | Cao |
| 2018/0324717 A1 | 11/2018 | Zhou |
| 2018/0359047 A1* | 12/2018 | Vassilieva ............ H04B 10/5057 |
| 2019/0020409 A1 | 1/2019 | Le Taillandier De Gabory |
| 2019/0097728 A1 | 3/2019 | Frankel |
| 2019/0123819 A1 | 4/2019 | Jiang |

(56) References Cited

U.S. PATENT DOCUMENTS

| | | |
|---|---|---|
| 2019/0149242 A1 | 5/2019 | Torbatian |
| 2019/0149389 A1 | 5/2019 | Torbatian |
| 2019/0253153 A1 | 8/2019 | Sun |
| 2019/0260493 A1 | 8/2019 | Chimfwembe |
| 2019/0288777 A1 | 9/2019 | Ishimura |
| 2019/0312640 A1 | 10/2019 | Binkai |
| 2020/0076508 A1 | 3/2020 | Jia |
| 2020/0177525 A1 | 6/2020 | Morris |

FOREIGN PATENT DOCUMENTS

| | | |
|---|---|---|
| WO | WO 2012100714 | 8/2012 |
| WO | WO 2014114332 | 7/2014 |

OTHER PUBLICATIONS

Bosco et al; Advance Modulation techniques for flexible optical transceivers: The Rate/Reach tradeoff ; Jan. 2019; Journal of light wave technology, vol. 37, No. 1; pp. 1-14. (Year: 2019).*

J. Leuthold et al., "Super Channels Based on Nyquist Multiplexing," 2012 17th Opto-Electronics and Communications Conference (OECC 2012) Technical Digest, Jul. 2012, Busan, Kor.

S. Watanabe et al., "Optical Coherent Broad-Band Transmission for Long-Haul and Distribution Systems Using Subcarrier Multiplexing," Journal of Lightwave Technology, vol. 11, No. 1, Jan. 1993, pp. 116-127.

M. Jinno et al., "Demonstration of Novel Spectrum-Efficient Elastic Optical Path Network with Per-Channel Variable Capacity of 40 GB/s to Over 400 GB/s," ECOC 2008, Sep. 21-25, 2008, Brussels, Belgium, Th.3.F.6.

Y. Chen et al., "Experimental Demonstration of Roadm Functionality on an Optical Scfdm Superchannel," IEEE Photonics Technology Letters, vol. 24, No. 3, Feb. 1, 2012, pp. 215-217.

Adaptive Software Defined Terabit Transceiver For Flexible Optical Networks, Public executive summary of the Final Project Periodic Report, Jun. 16, 2016.

Hillerkus, Single-Laser Multi-Terabit/s Systems, KIT Scientific Publishing, 2013, Chapters 1, 3, and 6.

Hu et al., "Flexible and Concurrent All-Optical VPN in OFDMA PON," IEEE Photonics Technology Journal, vol. 5, No. 6, Dec. 2013.

Bosco et al., "On the Performance of Nyquist-WDM Terabit Superchannels Based on PM-BPSK, PM-QPSK, PM-8QAM or PM-16QAM Subcarriers," Journal of Lightwave Technology, vol. 29, No. 1, Jan. 1, 2011, pp. 53-60.

K. Roberts et al., "Flexible Transceivers," ECOC Technical Digest, 2012, We.3.A.3.

K. Roberts et al., "High Capacity Transport-100G and Beyond," Journal of Lightwave Technology, vol. 33, No. 3, Feb. 1, 2015, pp. 563-578.

J. Reis et al., "Performance Optimization of Nyquist Signaling for Spectrally Efficient Optical Access Networks [Invited]," J. Opt. Commun. Netw./vol. 7, No. 2, Feb. 2015, pp. A200-A208.

R. Ferreira et al., Coherent Nyquist UDWDM-PON With Digital Signal Processing in Real Time, Journal of Lightwave Technology, vol. 34, No. 2, Jan. 15, 2016, pp. 826-833.

A. Shahpari et al., "Coherent Access: A Review", Journal of Lightwave Technology, vol. 35, No. 4, Feb. 15, 2017, pp. 1050-1058.

P. Layec et al., "Rate-Adaptable Optical Transmission and Elastic Optical Networks," Chapter 15, Enabling Technologies for High Spectral-efficiency Coherent Optical Communication Networks, First Edition, 2016 John Wiley & Sons, Inc. Published 2016, pp. 507-545.

J. Altabas, "Cost-effective Transceiver based on a RSOA and a VCSEL for Flexible uDWDM Networks," IEEE Photonics Technology Letters ( vol. 28 , Issue: 10 , May 15, 15 2016, pp. 1111-1114.

K. Roberts et al., "Beyond 100 GB/s: Capacity, Flexibility, and Network Optimization," J. Opt. Commun. Netw./vol. 9, No. 4/Apr. 2017, pp. C12-C24.

Lavery et al., "Digital Coherent Receivers for Long-Reach Optical Access Networks," Journal of Lightwave Technology, vol. 31, No. 4, Feb. 15, 2013, pp. 609-620.

V. Vujicic, "Optical Multicarrier Sources for Spectrally Efficient Optical Networks," A Dissertation submitted in fulfilment of the requirements for the award of Doctor of Philosophy (Ph.D.) to the Dublin City University, Dec. 2015, Chapters 1, 2, and 6.

Straullu et al., "Single-Wavelength Downstream FDMA-PON at 32 Gbps and 34 dB ODN Loss," IEEE Photonics Technology Letters, vol. 27, No. 7, Apr. 1, 2015, pp. 774-777.

Y. Zhang et al., "Digital subcarrier multiplexing for flexible spectral allocation in optical transport network," Oct. 24, 2011 / vol. 19, No. 22 / Optics Express 21882.

R. Schmogrow et al., "Nyquist Frequency Division Multiplexing for Optical Communications," CLEO Technical Digest, OSA 2012, CTh1H.2.

P Khodashenas. "Investigation of Spectrum Granularity for Performance Optimization of Flexible Nyquist-WDM-Based Optical Networks." Journal of Lightwave Technology, vol. 33, No. 23, Dec. 1, 2015 pp. 4767-4774.

Mishra et al., "Flexible RF-Based Comb Generator," IEEE Photonics Technology Letters, vol. 25, No. 7, Apr. 1, 2013, pp. 701-704.

M. Jinno et al., "Multiflow Optical Transponder for Efficient Multilayer Optical Networking," IEEE Communications Magazine • May 2012, pp. 56-65.

Kim Roberts, "100G and Beyond," OFC 2014, OSA 2014, Tu3J.1. Netze 05.—Jun. 5, 2014 in Leipzig, VDE Verlag GMBH • Berlin • Offenbach, Germany, ISBN 978-3-8007-3604-1.

Kottke et al., "Coherent UDWDM PON with joint subcarrier reception at OLT," Optics Express, Jul. 2, 2014.

Lavery et al., "Reduced Complexity Equalization for Coherent Long-Reach Passive Optical Networks," J. Opt. Commun. Netw./ vol. 7, No. 1/Jan. 2015, pp. A16-A27.

Lazaro et al., "Flexible PON Key Technologies: Digital Advanced Modulation Formats and Devices," 2014 16th International Conference on Transparent Optical Networks (ICTON), Tu.B3.2.

Optical Internetworking Forum—Technology Options for 400G Implementation OIF-Tech-Options-400G-01.0, Jul. 2015.

Riccardi et al., "Sliceable bandwidth variable transponder: the Idealist vision," 2015 European Conference on Networks and Communications (EuCNC), pp. 330-334.

Sambo et al., "Next Generation Sliceable Bandwidth Variable Transponders," IEEE Communications Magazine, Feb. 2015, pp. 163-171.

P. Schindler et al., "Colorless FDMA-PON With Flexible Bandwidth Allocation and Colorless, Low-Speed ONUs [Invited]," J. Opt. Commun. Netw./vol. 5, No. 10/Oct. 2013, pp. A204-A212.

Schmogrow et al., "Real-time Nyquist signaling with dynamic precision and flexible non-integer oversampling," Jan. 13, 2014 | vol. 22, No. 1 | DOI: 10.1364/OE.22.000193 | Optics Express 193.

Schmogrow et al., "Real-Time Digital Nyquist-WDM and OFDM Signal Generation: Spectral Efficiency Versus DSP Complexity," ECOC Technical Digest, 2012 OSA, Mo.2.A.4.

Boutaba et al., "Elastic Optical Networking for 5G Transport," J Netw Syst Manage (2017) 25m pp. 819-847 123.

S. Smolorz et al., "Demonstration of a Coherent UDWDM-PON with Real-Time Processing," OFC/NFOEC 2011, PDPD4.

H. Rohde et al. "Coherent Ultra Dense WDM Technology for Next Generation Optical Metro and Access Networks," Journal of Lightwave Technology, vol. 32, No. 10, May 15, 2014 pp. 2041-2052.

Ze Dong et al., "Very-High-Throughput Coherent Ultradense WDM-PON Based on Nyquist-ISB Modulation," IEEE Photonics Technology Letters, vol. 27, No. 7, Apr. 1, 2015, pp. 763-766.

Rohde et al., "Digital Multi-Wavelength Generation and Real Time Video Transmission in a Coherent Ultra Dense WDM PON," OFC/NFOEC Technical Digest, 2013 OSA, OM3H.3.

International Search Report issued in connection with PCT/US2020/023871 mailed Sep. 24, 2020.

(56) References Cited

OTHER PUBLICATIONS

Guo-Wei Lu et al., "Optical subcarrier processing for Nyquist SCM signals via coherent spectrum overlapping in four-wave mixing with coherent multi-tone pump", Optics Express, vol. 26, No. 2, Jan. 22, 2018.
International Search Report issued in connection with PCT/US2020/018180 mailed Sep. 18, 2020.
International Search Report issued in connection with PCT/US2020/036209 mailed Oct. 1, 2020.
International Search Report issued in connection with PCT/US2020/018292 mailed Jun. 4, 2020.
International Search Report issued in connection with PCT/US2020/021024 mailed Aug. 3, 2020.
Wei et al: Mac Protocols for Optical Orthogonal Frequency Division Multiple Access (OFDMA)-based Passive Optical Networks, OFC/NFOEC 2008, paper JWA82, Feb. 24-28, 2008 (Year: 2008).
Cerisola et al., "Subcarrier multiplex of packet headers in a WDM optical network and a nouvel ultrafast header clock-recovery technique", 1995, OFC '95 Technical Digest, pp. 273-274 (Year: 1995).
Michael G. Taylor, "Coherent Detection Method Using DSP for Demodulation of Signal and Subsequent Equalization of Propagation Impairments," IEEE Photonics Technology Letters, vol. 16, No. 2, Feb. 2004, pp. 674-676.
K. Roberts, et al., "Performance of dual-polarization QPSK for optical transport system," JLT, vol. 27, No. 16, pp. 3546-3559, Aug. 2009.
S.J. Savory et al., "Digital equalisation of 40Gbit/s per wavelength transmission over 2480km of standard fibre without optical dispersion compensation," European Conference on Optical Communications (ECOC) 2006, paper Th2.5.5.
H. Sun et al., "Real-time measurements of a 40 GB/S coherent system," Jan. 21, 2008, vol. 16, No. 2, Optics Express, pp. 873-879.
Greshishchev et al., "A 56GS/s 6b DAC in 65nm CMOS with 256x6b Memory", ISSCC 2011/Session 1 0/Nyquist-Rate Converters/1 0.8, 2011 IEEE International Solid-State Circuits Conference, 3 pages.
Bingham, "Multicarrier Modulator for Data Transmission: An Idea Whose Time has Come", IEEE Communications Magazine, pp. 5-14, May 1990, 8 pages.
Yan et al. "Experimental Comparison of No-Guard-Interval-OFDM and Nyquist-WDM Superchannels", OFC/NFOEC Techincal Digest, Jan. 23, 20212, 4 pages.
Zhuge et al., "Comparison of Intra-Channel Nonlinearity Tolerance Between Reduced-Guard-Interval CO-OFDM Systems and Nyquist Single Carrier Systems", OFC/NFOEC Technical Digest, Jan. 23, 2012, 4 pages.
Zhang et al., "3760km, 100G SSMF Transmission over Commercial Terrestrial DWDM ROADM Systems using SD-FEC", OFC/NFOEC Postdeadline Papers, Mar. 2012, 3 pages.
Rahn et al., "250Gb/s Real-Time PIC-based Super-Channel Transmission Over a Gridless 6000km Terrestrial Link", OFC/NFOEC Posteadline Papers, Mar. 2012,3 pages.

\* cited by examiner

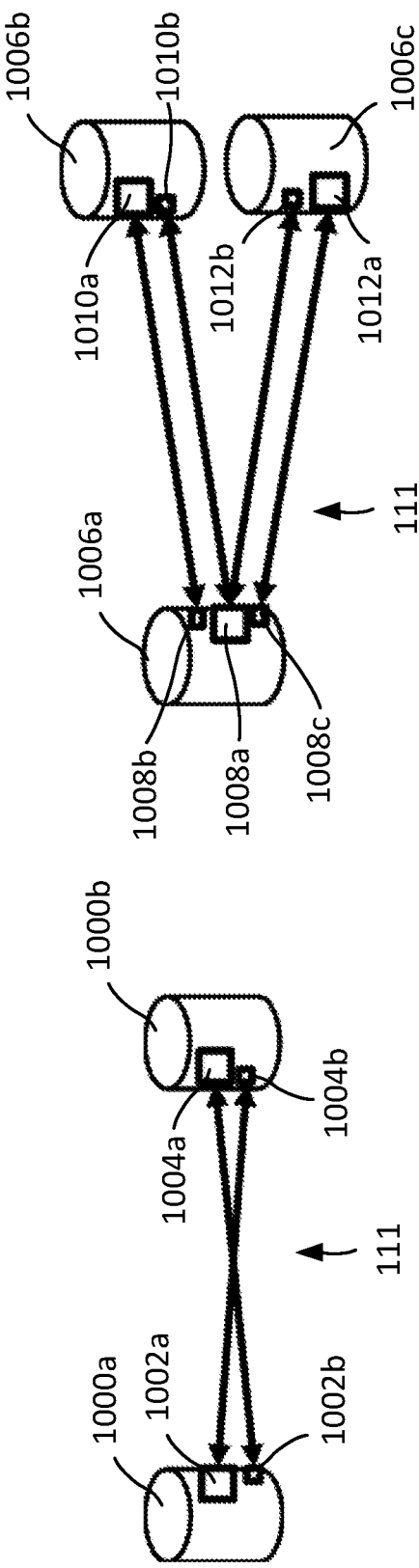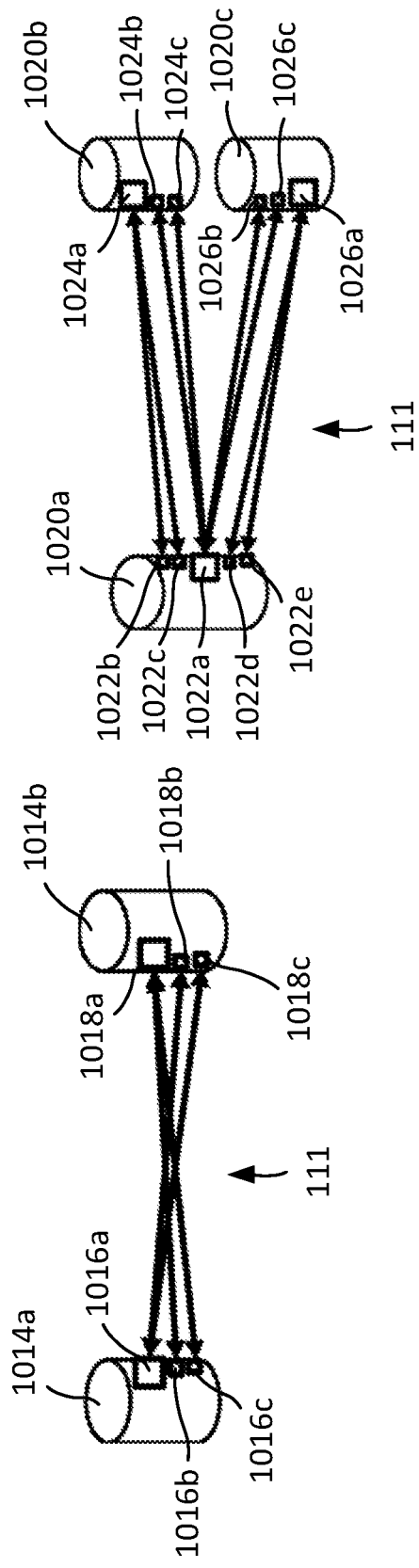

DYNAMICALLY SWITCHING QUEUEING SCHEMES FOR NETWORK SWITCHES

CROSS REFERENCE TO RELATED APPLICATION

This application claims the benefit provisional application No. 62/896,052, filed Sep. 5, 2019, the entire contents of which are incorporated herein by reference in their entirety.

TECHNICAL FIELD

This disclosure relates to transmitting and receiving data over a communications network.

BACKGROUND

Computing devices can exchange information with one another using a communications network. As an example, computing devices can be interconnected to one another via one or more intermediary network devices (e.g., routers, hubs, switches, etc.) and network links (e.g., electrically conductive cables, optical fiber, wireless network interfaces, etc.). The network devices receive data packets from one or more source computing devices, and forward each of the data packets to its respective destination computing device. In some implementations, the communications network can be a local area network (LAN), such as an Ethernet LAN.

SUMMARY

In an aspect, a system includes a first network switch and a plurality of first server computers communicatively coupled to the first network switch. The first network switch includes a first transceiver. The first transceiver is configured to transmit data according to a first maximum throughput. Each first server computer includes a respective second transceiver. Each second transceiver is configured to transmit data according to a second maximum throughput. The first maximum throughput is greater than the second maximum throughput. The first network switch is configured to transmit, using the first transceiver according to the first maximum throughput, first data to each of the first server computers. The first data includes a plurality of first optical subcarriers. Each first optical subcarrier is associated with a different one of the first server computers. Each of the first server computers is configured to receive, using a respective one of the second transceivers, the first data from the first network switch, and extract, from the first data, a respective portion of the first data addressed to the first server computer.

Implementations of this aspect can include one or more of the following features.

In some implementations, each of the first server computer can be configured to extract the respective portion of the first data addressed to the first server computer by extracting a portion of the first data from the first optical subcarrier associated with the sever computer.

In some implementations, the system can further include a second network switch including a third transceiver. The third transceiver can be configured to transmit data according to a third maximum throughput. The system can include a plurality of the first network switches. Each first network switch can include a respective fourth transceiver. Each fourth transceiver can be configured to transmit data according to a fourth maximum throughput. The third maximum throughput can be greater than the fourth maximum through- put. The second network switch can be configured to transmit, using the fourth transceiver according to the fourth maximum throughput, second data to each of the first network switches. The second data can include a plurality of second optical subcarriers. Each second optical subcarrier can be associated with a different one of the first network switches. Each of the first network switches can be configured to receive, using a respective one of the fourth transceivers, the second data from the second network switch, and extract, from the second data, a respective portion of the second data addressed to the first network switch.

In some implementations, each of the first network switches can be configured to extract the respective portion of the second data corresponding to the first network switch by extracting a portion of the second data from the second optical subcarrier associated with the first network switch.

In some implementations, the second network switch can further include one or more fifth transceivers. The second network switch can be configured transmit, receive or both transmit and receive third data from a wide area network using the one or more fifth transceivers.

In some implementations, at least one of the first network switches can be a top of rack network switch.

In some implementations, the second network switch can be a core network switch.

In some implementations, at least one of the first server computers can be configured to transmit, using the second transceiver, second data to the first network switch according to the second maximum throughput. The second data can include a second optical subcarrier. The second optical subcarrier can be associated with the first network switch.

In some implementations, the first data can be transmitted using the first transceiver of the first network switch to each of the second receivers of the first server computers.

In some implementations, the second data can be transmitted using the second transceiver of the at least one of the first server computers to the first transceiver of the first network switch.

In another aspect, a method includes transmitting first data from a first network switch to each of a plurality of first server computers. The first network switch includes a first transceiver. The first transceiver is configured to transmit data according to a first maximum throughput. The plurality of first server computers is communicatively coupled to the first network switch. Each first server computer includes a respective second transceiver. Each second transceiver is configured to transmit data according to a second maximum throughput. The first maximum throughput is greater than the second maximum throughput. The first data includes a plurality of first optical subcarriers. Each first optical subcarrier is associated with a different one of the first server computers. The method also includes receiving, by each of the first server computers using a respective one of the second transceivers, the first data from the first network switch, and extracting, by each of the first server computers from the first data, a respective portion of the first data addressed to the first server computer.

Implementations of this aspect can include one or more of the following features.

In some implementations, each of the first server computer can be configured to extract the respective portion of the first data addressed to the first server computer by extracting a portion of the first data from the first optical subcarrier associated with the sever computer.

In some implementations, a second network switch can include a third transceiver. The third transceiver can be configured to transmit data according to a third maximum throughput. Each first network switch of a plurality of network switches can include a respective fourth transceiver. Each fourth transceiver can be configured to transmit data according to a fourth maximum throughput. The third maximum throughput can be greater than the fourth maximum throughput. The method can further include transmitting, by the second network switch using the fourth transceiver according to the fourth maximum throughput, second data to each of the first network switches. The second data can include a plurality of second optical subcarriers. Each second optical subcarrier can be associated with a different one of the first network switches. The method can further include receiving, by the each of the first network switches using a respective one of the fourth transceivers, the second data from the second network switch, and extracting, by the each of the first network switches from the second data, a respective portion of the second data addressed to the first network switch.

In some implementations, extracting the respective portion of the second data corresponding to the first network switch can include extracting a portion of the second data from the second optical subcarrier associated with the first network switch.

In some implementations, the second network switch can further include one or more fifth transceivers. The method can further include transmitting, receiving or both transmitting and receiving, by the second network switch, third data from a wide area network using the one or more fifth transceivers.

In some implementations, at least one of the first network switches can be a top of rack network switch.

In some implementations, the second network switch can be a core network switch.

In some implementations, the method can further include transmitting, by at least one of the first server computers using the second transceiver, second data to the first network switch according to the second maximum throughput. The second data can include a second optical subcarrier. The second optical subcarrier can be associated with the first network switch.

In some implementations, the first data can be transmitted using the first transceiver of the first network switch to each of the second receivers of the first server computers.

In some implementations, the second data can be transmitted using the second transceiver of the at least one of the first server computers to the first transceiver of the first network switch.

In another aspect, a system includes a plurality of network nodes. Each network node includes one or more respective first transceivers. Each first transceiver is configured to transmit data according to a first maximum throughput. Each network node also includes one or more respective second transceivers. Each second transceiver is configured to transmit data according to a second maximum throughput. The first maximum throughput is greater than the second maximum throughput. A first network node from among the plurality of network nodes is configured to transmit, using a respective one of the first transceivers, first data to two or more second network nodes from among the plurality of network nodes according to the first maximum throughput. The first data includes a plurality of optical subcarriers. Each optical subcarrier is associated with a different one of the two more other network nodes. The two or more other network nodes are configured to receive, using respective ones of the second transceivers, the first data from the first network node.

Implementations of this aspect can include one or more of the following features.

In some implementations, each network node of the plurality of network nodes can be communicatively coupled to each other network node of the plurality of network nodes.

In some implementations, for each network node of the plurality of network nodes, at least one of the first transceivers of the network node can be communicatively coupled to at least one of the second transceivers of each other network node of the plurality of network nodes.

In some implementations, at least one of the network nodes of the plurality of network nodes can be communicatively coupled to only a subset the other network nodes of the plurality of network nodes.

In some implementations, for each network node of the plurality of network nodes, at least one of the first transceivers of the network node can be communicatively coupled to at least one of the second transceivers of only a subset of the other network nodes of the plurality of network nodes.

In some implementations, each of the two more second network nodes can be configured to extract, from the first data, a portion of the first data addressed to the that second network node.

In some implementations, each of the two more other second network nodes can be configured to extract the portion of the first data corresponding to the network node by extracting the portion of the first data from the optical subcarrier associated with that second network node.

In some implementations, at least some of the first transceivers of the first network node can be communicatively coupled to at least two of the second transceivers of the second network node.

In some implementations, first data can be transmitted using the first transceiver of the first network node to each of the second receivers of the two or more second network nodes.

In some implementations, at least one of the two or more second network nodes can be configured to transmit, using the second transceiver, second data to the first network node according to the second maximum throughput. The second data can include a second optical subcarrier. The second optical subcarrier can be associated with the first network node.

In another aspect, a method includes interconnecting a plurality of network nodes. Each network node includes one or more respective first transceivers. Each first transceiver is configured to transmit data according to a first maximum throughput. Each network node also includes one or more respective second transceivers. Each second transceiver is configured to transmit data according to a second maximum throughput. The first maximum throughput is greater than the second maximum throughput. The method also includes transmitting, by a first network node from among the plurality of network nodes using a respective one of the first transceivers, first data to two or more second network nodes from among the plurality of network nodes according to the first maximum throughput. The first data includes a plurality of optical subcarriers. Each optical subcarrier is associated with a different one of the two more other network nodes. The method also includes receiving, by the two or more second network nodes using respective ones of the second transceivers, the first data from the first network node.

Implementations of this aspect can include one or more of the following features.

In some implementations, each network node of the plurality of network nodes can be communicatively coupled to each other network node of the plurality of network nodes.

In some implementations, for each network node of the plurality of network nodes, at least one of the first transceivers of the network node can be communicatively coupled to at least one of the second transceivers of each other network node of the plurality of network nodes.

In some implementations, at least one of the network nodes of the plurality of network nodes can be communicatively coupled to only a subset the other network nodes of the plurality of network nodes.

In some implementations, for each network node of the plurality of network nodes, at least one of the first transceivers of the network node ca be communicatively coupled to at least one of the second transceivers of only a subset of the other network nodes of the plurality of network nodes.

In some implementations, the method can further include extracting, by each of the two more second network nodes, from the first data, a portion of the first data addressed to the that second network node.

In some implementations, extracting, by each of the two more second network nodes, the portion of the first data corresponding to the network node can include extracting the portion of the first data from the optical subcarrier associated with that second network node.

In some implementations, at least some of the first transceivers of the first network node can be communicatively coupled to at least two of the second transceivers of the second network node.

In some implementations, the first data can be transmitted using the first transceiver of the first network node to each of the second receivers of the two or more second network nodes.

In some implementations, the method can further include transmitting, using the second transceiver, second data to the first network node according to the second maximum throughput. The second data can include a second optical subcarrier. The second optical subcarrier can be associated with the first network node.

In another aspect, a method includes monitoring network traffic transmitted between a plurality of network nodes via a communications network, ranking subsets of the network traffic according to one or more ranking criteria, and deploying a mesh network between the plurality of network nodes based on the ranking of the subsets of the network traffic. The mesh network includes a plurality of network links. Each network link communicatively couples a respective network node from among the plurality of network nodes to another respective network node from among the plurality of network nodes.

Implementations of this aspect can include or more of the following features.

In some implementations, the one or more ranking criteria can include a criterion regarding a data size of the network traffic transmitted between respective network nodes from among the plurality of network nodes.

In some implementations, the one or more ranking criteria can include a criterion regarding a frequency by which the network traffic is transmitted between respective network nodes from among the plurality of network nodes.

In some implementations, the one or more ranking criteria can include a criterion regarding a directionality by which the network traffic is transmitted between respective network nodes from among the plurality of network nodes.

In some implementations, the one or more ranking criteria can include a criterion regarding a utilization percentage of the communications network in transmitting the network traffic.

In some implementations, deploying the mesh network between the plurality of network nodes can include determining, a respective rank for each of the subsets of the network traffic. Each of the subsets of the network traffic can be transmitted from a respective source network node from among the plurality of network nodes to a respective destination network node from among the plurality of network nodes. Deploying the mesh network between the plurality of network nodes can also include determining that a first subset of the network traffic has the highest rank from among the subsets of the network traffic, and deploying a network link between the source network node and the destination node corresponding to the first subset of the network traffic.

In some implementations, deploying the mesh network between the plurality of network nodes can include determining that a second subset of the network traffic has the second highest rank from among the subsets of the network traffic, and deploying a network link between the source network node and the destination node corresponding to the second subset of the network traffic.

In some implementations, the method can include transmitting one or more optical subcarriers using the plurality of network links.

In some implementations, at least one of the network links can communicatively couple (i) a first transceiver of a first network node from among the plurality of network nodes and (ii) a second transceiver of a second network node from among the plurality of network nodes. The first transceiver can be configured to transmit data using the at least one of the network links according to a first maximum throughput. The second transceiver can be configured to transmit data according to a second maximum throughput. The first maximum throughput can be greater than the second maximum throughput.

In some implementations, the mesh network can communicatively couple at least one network node from among the plurality of network nodes to only a subset of other network nodes from among the plurality of network nodes.

In some implementations, the method can include removing at least a portion of the communications network after deploying the mesh network.

In some implementations, deploying the mesh network can include deploying network links between the plurality of network nodes until one or more stop criteria are met.

In some implementations, the one or more stop criteria can include a criterion that a number of deployed network links equals to maximum number of network links.

In some implementations, the one or more stop criteria can include a criterion that the subsets of the network traffic associated with the deployed network links account for a threshold percentage of the network traffic.

In some implementations, the one or more stop criteria can include a criterion that an amount of monetary resources allotted or used to deploy the network links meets or exceeds a threshold amount.

In another aspect, a non-transitory, computer-readable storage medium has instructions stored thereon, that when executed by one or more processors, cause the one or more processors to perform certain operations. The operations includes monitoring network traffic transmitted between a plurality of network nodes via a communications network, ranking subsets of the network traffic according to one or more ranking criteria, and determining a deployment of a mesh network between the plurality of network nodes based on the ranking of the subsets of the network traffic. The mesh network includes a plurality of network links. Each network link communicatively couples a respective network node from among the plurality of network nodes to another respective network node from among the plurality of network nodes.

Implementations of this aspect can include one or more of the following features.

In some implementations, determining the deployment the mesh network between the plurality of network nodes can include determining, a respective rank for each of the subsets of the network traffic. Each of the subsets of the network traffic can be transmitted from a respective source network node from among the plurality of network nodes to a respective destination network node from among the plurality of network nodes. Determining the deployment the mesh network between the plurality of network nodes can also include determining that a first subset of the network traffic has the highest rank from among the subsets of the network traffic, and determining that a network link be deployed between the source network node and the destination node corresponding to the first subset of the network traffic.

In some implementations, determining the deployment the mesh network between the plurality of network nodes can include determining that a second subset of the network traffic has the second highest rank from among the subsets of the network traffic, and determining that a network link be deployed between the source network node and the destination node corresponding to the second subset of the network traffic.

In some implementations, the operations can further include transmitting one or more optical subcarriers using the plurality of network links.

In another aspect, a system includes one or more processors, and memory storing instructions that when executed by the one or more processors, cause the one or more processors to perform certain operations. The operations include monitoring network traffic transmitted between a plurality of network nodes via a communications network, ranking subsets of the network traffic according to one or more ranking criteria, and determining a deployment of a mesh network between the plurality of network nodes based on the ranking of the subsets of the network traffic. The mesh network includes a plurality of network links. Each network link communicatively couples a respective network node from among the plurality of network nodes to another respective network node from among the plurality of network nodes.

In another aspect, a system includes a first network node, a second network node communicatively coupled to the first network node, and a third network node communicatively coupled to the second network node. The first network node is configured to generate a first optical subcarrier representing first data, and transmit the first optical subcarrier to the second network node. The second network node is configured to receive the first optical subcarrier from the first network node, generate a second optical subcarrier representing the first data, wherein the second optical subcarrier is different from the first optical subcarrier, and transmit the second optical subcarrier to the third network node.

Implementations of this aspect can include one or more of the following features.

In some implementations, the third network node can be configured to receive the second optical subcarrier from the second network node, and determine the first data based on the second optical subcarrier.

In some implementations, the system can further include a fourth network node communicatively coupled to the second network node. The second network node can be configured to generate a third optical subcarrier representing the first data, where the third optical subcarrier is different from the second optical subcarrier, and transmit the third optical subcarrier to the fourth network node. The fourth network node can be configured to receive the third optical subcarrier from the second network node, and determine the first data based on the third optical subcarrier.

In some implementations, the system can further include a fourth network node communicatively coupled to the third network node. The third network node can be configured to receive the second optical subcarrier from the second network node, generate a third optical subcarrier representing the first data, where the third optical subcarrier is different from the second optical subcarrier, and transmit the third optical subcarrier to the fourth network node. The fourth network node can be configured to receive the third optical subcarrier from the third network node, and determine the first data based on the third optical subcarrier.

In some implementations, the system can further include a fourth network node communicatively coupled to the second network node. The third network node can be associated with the second optical subcarrier. The fourth network node can be associated with a third optical subcarrier, where the third optical subcarrier is different from the second optical subcarrier. The second network node can be configured to transmit the second optical subcarrier to the third network node and the fourth network node concurrently.

In some implementations, the second network node can be configured to generate a third optical subcarrier representing second data, and transmit the third optical subcarrier to the third network node and the fourth network node concurrently.

In some implementations, the second network node can be configured to transmit the second optical subcarrier and the third optical subcarrier concurrently to each of the third network node and the fourth network node.

In some implementations, the second network node can be configured to transmit the second optical subcarrier to the third network node and the fourth network node at a first time, and transmit the third optical subcarrier to the third network node and the fourth network node at a second time different from the first time.

In some implementations, the first network node can include a first laser configured to generate the first optical subcarrier by modulating an output of the first laser according to a first carrier frequency.

In some implementations, the second network node can include a second laser configured to generate the second optical subcarrier by modulating an output of the second laser according to a second carrier frequency.

In some implementations, the first optical subcarrier and the second optical subcarrier can be Nyquist subcarriers.

In some implementations, the second network node can be configured interpret the first optical subcarrier according to a local oscillator signal having a first frequency, and generate the second optical subcarrier according to a transmitter oscillator signal having a second frequency. The first frequency can be equal to the second frequency.

In some implementations, the local oscillator signal and the transmitter oscillator signal can be provided by a common laser.

In another aspect, a method includes generating, by a first network node, a first optical subcarrier representing first data; transmitting, by the first network node, the first optical subcarrier to the second network node; receiving, by the second network node, the first optical subcarrier from the first network node; generating, by the second network node, a second optical subcarrier representing the first data, where the second optical subcarrier is different from the first optical subcarrier; and transmitting, by the second network node, the second optical subcarrier to a third network node.

Implementations of this aspect can include one or more of the following features.

In some implementations, the method can include receiving, by the third network node, the second optical subcarrier from the second network node, and determining, by the third network node, the first data based on the second optical subcarrier.

In some implementations, the method can include generating, by the second network node, a third optical subcarrier representing the first data. The third wavelength can be different from the second optical subcarrier. The method can also include transmitting, by second network node, the third optical subcarrier to a fourth network node; receiving, by the fourth network node, the third optical subcarrier from the second network node; and determining, by fourth network node, the first data based on the third optical subcarrier.

In some implementations, the method can include receiving, by third network node, the second optical subcarrier from the second network node; generating, by third network node, a third optical subcarrier representing the first data, where the third optical subcarrier is different from the second optical subcarrier; transmitting, by the third network node, the third optical subcarrier to a fourth network node; receiving, by the fourth network node, the third optical subcarrier from the third network node; and determining, by the fourth network node, the first data based on the third signal.

In some implementations, the third network node can be associated with the second optical subcarrier. A fourth network node can be associated with a third optical subcarrier. The third optical subcarrier can be different from the second optical subcarrier. The method can further include transmitting, by the second network node, the second optical subcarrier to the third network node and the fourth network node concurrently. \

In some implementations, the method can include generating, by the second network node, a third optical subcarrier representing second data, and transmitting, by the second network node, the third optical subcarrier to the third network node and the fourth network node concurrently.

In some implementations, the method can include transmitting, by the second network node, the second optical subcarrier and the third optical subcarrier concurrently to each of the third network node and the fourth network node.

In some implementations, the second optical subcarrier can be transmitted to the third network node and the fourth network node at a first time. The third optical subcarrier can be transmitted to the third network node and the fourth network node at a second time different from the first time.

In some implementations, the method can include generating, by a first laser of the first network node, the first optical subcarrier by modulating an output of the first laser according to a first carrier frequency.

In some implementations, the method can include generating, by a second laser of the second network node, the second optical subcarrier by modulating an output of the second laser according to a second carrier frequency.

In some implementations, the first optical subcarrier and the second optical subcarrier can be Nyquist subcarriers.

In some implementations, the method can further include interpreting, by the second network node, the first optical subcarrier according to a local oscillator signal having a first frequency. The second optical subcarrier can be generated according to a transmitter oscillator signal having a second frequency. The first frequency can be equal to the second frequency.

In some implementations, the local oscillator signal and the transmitter oscillator signal can be provided by a common laser.

In another aspect, a node includes a first transceiver, and a second transceiver. The node is configured to receive, using the first transceiver, a first optical subcarrier representing first data from a second node communicatively coupled the node, and transmit, using the second transceiver, a second optical subcarrier representing the first data to a third node communicatively coupled to the node. The second optical subcarrier is different from the first optical subcarrier.

In another aspect, a node includes a receiver, a switch circuit, and a transmitter. The receiver has a plurality of receiver outputs. The receiver is configured to receive a first modulated optical signal including a first plurality of optical subcarriers, and supply a plurality of data streams based on the first plurality of optical subcarriers. Each of the plurality of data streams is associated with a corresponding one of the plurality of optical subcarriers and is supplied from a respective one of the plurality of receiver outputs. The switch circuit has a plurality of switch inputs and a plurality of switch outputs. Each of the plurality of switch inputs is configured to receive a respective one of the plurality of data streams. Each of the plurality of switch outputs is configured to supply a respective one of the plurality of data streams. The transmitter has a plurality of inputs. Each of the inputs is coupled to a corresponding one of the plurality of switch outputs and is configured to receive a corresponding one of the plurality of data streams. The transmitter is configured to supply a second modulated optical signal based on the plurality of data streams. The second modulated optical signal carries a second plurality of optical subcarriers. Each of the second plurality of optical subcarriers is associated with a corresponding one of the plurality of data streams.

Implementations of this aspect can include one or more of the following features.

In some implementations, one of the first plurality of optical subcarriers can have a first frequency and can be associated with one of the plurality of data streams. One of the second plurality of optical subcarriers can have a second frequency and can be associated with said one of the plurality of data streams.

In some implementations, said one of the first plurality of optical subcarriers can carry information indicative of said one of the plurality of data streams. Said one of the second plurality of optical subcarriers can carry the information indicative of said one of the plurality of data streams.

In some implementations, the switch circuit can include a cross-point switch.

In some implementations, the receiver can include an optical hybrid circuit configured to receive at least a portion of the first modulated optical signal and a local oscillator signal. The receive can also include a photodiode circuit configured to receive mixing products output from the optical hybrid circuit based on said at least the portion of the first modulated optical signal and the local oscillator signals, and supply first electrical signals based on the mixing products. The receive can also include analog-to-digital conversion circuitry configured to receive the first electrical signals and supply second electrical signals based on the first electrical signals, the second electrical signals being digital signals. The receive can also include a digital signal processor configured to output the plurality of data streams based on the second electrical signals.

In some implementations, the node can include a local oscillator laser configured to supply the local oscillator signal.

In some implementations, the transmitter can include a digital signal processor configured to receive the plurality of data streams and output a plurality of digital signals based on the plurality of data streams, digital-to-analog conversion circuitry configured to output analog signals based on the digital signals, a plurality of driver circuits configured to supply drive signals based on the analog signals, a laser configured to supply an optical signal, and a modulator configured to receive the optical signal and supply the second modulated optical signal based on the drive signals.

In some implementations, each of the first plurality of optical subcarriers can be a Nyquist subcarrier.

In some implementations, each of the second plurality of optical subcarriers can be a Nyquist subcarrier.

In some implementations, during a first time interval, the switch can have a first switch configuration, such that during a first time interval, a first one of the second plurality of optical subcarriers having a first frequency carries information associated with one of the plurality of data streams. Further, during a second time interval, the switch can have a second switch configuration, such that a second one of the second plurality of subcarriers carries the information.

In some implementations, the switch can have the first switch configuration based on a first control signal supplied to the switch and the switch can have a second control signal based on a second control signal supplied to the switch.

In another aspect, a node includes a first digital signal processor, a switch circuit, and second digital signal processor. The first digital signal processor is configured to supply a plurality of data streams, each of which is associated with a corresponding one of a first plurality of optical subcarriers. The switch circuit has a plurality of switch inputs and a plurality of switch outputs. Each of the plurality of switch inputs is configured to receive a respective one of the plurality of data streams, and supply a respective one of the plurality of data streams. The second digital signal processor has a plurality of DSP inputs. Each of the DSP inputs is configured to receive a corresponding one of the plurality of data streams from a respective one of the plurality of switch outputs, such that, during a first time interval, and wherein one of the DSP inputs is configured to receive a first one of the plurality of data streams and during a second time interval, different from the first time interval, said one of the DSP inputs is operable to receive a second one of the plurality of data stream.

Implementations of this aspect can include one or more of the following features.

In some implementations, the switch circuit can include a cross-point switch.

In some implementations, the node can include an optical hybrid circuit configured to receive at least a portion of a modulated optical signal and a local oscillator signal, the modulated optical signal including the plurality of optical subcarriers. The node can also include a photodiode circuit configured to receive mixing products output from the optical hybrid circuit based on said at least the portion of the first modulated optical signal and the local oscillator signal, the photodiode circuit supplying first electrical signals based on the mixing products. The node can also include analog-to-digital conversion circuitry configured to receive the first electrical signals and supply second electrical signals based on the first electrical signals, the second electrical signals being digital signals. The first digital signal processor can be configured to supply the plurality of data streams based on the second electrical signals.

In some implementations, the node can include a local oscillator laser configured to supply the local oscillator signal.

In some implementations, the plurality of optical subcarriers can be a first plurality of optical subcarriers. The node can further include digital-to-analog conversion circuitry configured to output analog signals based on the plurality of data streams, a plurality of driver circuits configured to supply drive signals based on the analog signals, a laser that configured to supply an optical signal, and a modulator configured to receive the optical signal and supply a modulated optical signal based on the drive signals, the modulated optical signal including a second plurality of optical subcarriers.

In some implementations, each of the plurality of optical subcarriers can be a Nyquist subcarrier.

In some implementations, each of the first plurality of optical subcarriers and each of the second plurality of optical subcarriers can be a Nyquist subcarrier.

In some implementations, one of the first plurality of subcarriers can be associated with one of the plurality data streams during the first interval and one of the second plurality of optical subcarriers can be associated with said one of the plurality of data streams.

In some implementations, said one of the first plurality of subcarriers can have a first frequency and said one of the second plurality of subcarriers can have a second frequency different from the first frequency.

In some implementations, the second plurality of subcarriers can have a frequency that is different from each of the frequencies of the first plurality of subcarriers.

The details of one or more embodiments are set forth in the accompanying drawings and the description below. Other features and advantages will be apparent from the description and drawings, and from the claims.

DESCRIPTION OF DRAWINGS

FIG. 10A-10D show example interconnections between multiple nodes.

Like reference symbols in the various drawings indicate like elements.

DETAILED DESCRIPTION

In an example communications network, a first node of the network can transmit data to multiple second nodes of the network concurrently, such that similar data is "multicast" to multiple nodes at the same time. Upon receipt of the data, each of the second nodes can selectively retain one or more portions of the data (e.g., the portions of the data that are intended for the node) and discard one or more other portions of the data (e.g., the portions of the data that are intended for other nodes). In some implementations, data can be transmitted as one or more optical carriers.

Further, at least some of the second nodes can include components that have different (e.g., lower) capabilities than the components included in first node. For example, the bandwidth or the data capacity of at least some of the second nodes can be less than that associated with the first node, such that the capacity associated with each of those second nodes is less than that of the first node. Accordingly, the first node can transmit data to each of those secondary nodes according to a higher bit rate (e.g., using a higher capacity transceiver), and each of those second nodes can transmit data to the first node according to a lower bit rate (e.g., using a lower capacity transceiver). Accordingly, downstream data (e.g., from the first node to the second nodes) is transmitted according to a larger pooled allocation of bandwidth, whereas upstream data (e.g., from each of the second nodes to the first node) is transmitted according to respective smaller dedicated allocations of bandwidth.

Example implementations of the aforementioned aspects are described in further detail herein.

Further, the implementations described herein can provide one or more technical benefits in the context of computer networking. For example, in at least some implementations, this configuration enables traffic to be transmitted in certain directions according to a pooled allocation of bandwidth (e.g., shared among multiple nodes of the network to alleviate congestion), while also enabling traffic to be transmitted in certain other directions according to smaller dedicated allocations of bandwidth. Further, in at least some implementations, this configuration enables a network to be deployed and maintained in a more cost efficient manner (e.g., compared to using solely high capacity transceivers across the entirety of the network).

Figure 1:
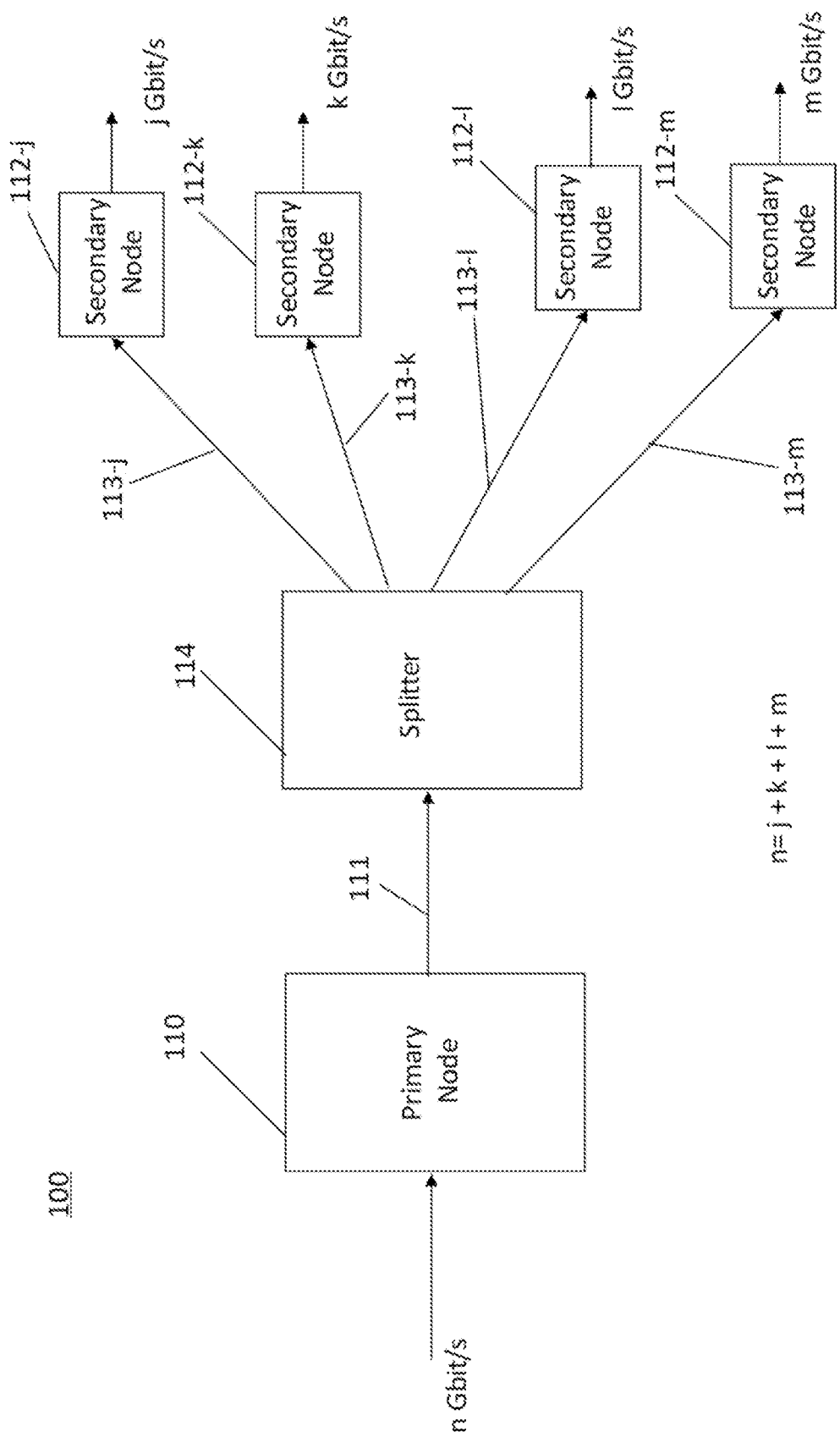
FIGS. 1 and 2 are block diagrams showing examples of networks.

FIG. 1 illustrates an example aggregation network 100 in which a primary node 110 communicates with multiple secondary nodes 112-$j$ to 112-$m$ (which sometimes may be referred to individually or collectively as secondary node(s) 112). In some implementations, one or more of the secondary nodes 112 can be remote from the primary node 110.

The primary node 110 transmits data in the form of one or more optical subcarriers (e.g., as described in greater detail below) in a downstream direction to a splitter 114 via an optical communication path 111. The splitter 114 receives the optical subcarriers, and provides a power-split portion of each optical subcarrier to a corresponding one of the secondary nodes 112-$j$ to 112-$m$ via a respective one of the optical communication paths 113-$j$ to 113-$m$. Each of the optical communication paths 111 and 113-$j$ to 113-$m$ can include or more segments of optical fiber, optical amplifiers, reconfigurable add-drop multiplexers (ROADMs), and/or other optical fiber communication equipment.

The primary node 110 has a data capacity to receive n Gbit/s of data (e.g., a data stream) for transmission to the secondary nodes 112. Each secondary node 112 may receive and output a portion of the data that is input into primary node 110 (e.g., to a user or customer). In this example, the secondary nodes 112-$j$, 112-$k$, 112-$l$, and 112-$m$ are configured to output j Gbit/s, k Gbit/s, l Gbit/s, and m Gbit/s of data (e.g., data streams), respectively, where the sum of the j, k, l, and m are equal n (where j, k, l, m, and n are positive numbers).

Figure 2:
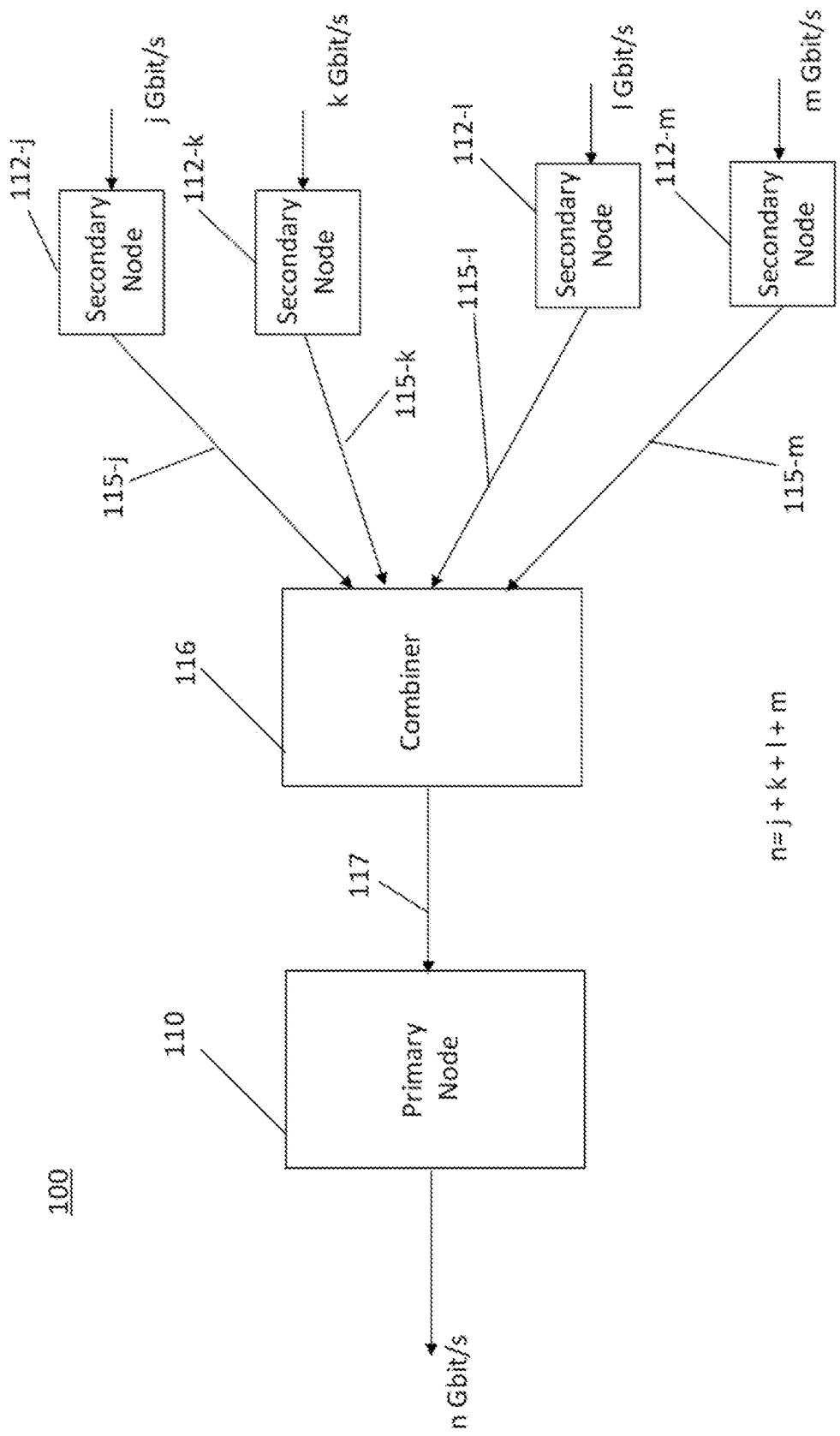

FIG. 2 shows the transmission of additional optical subcarriers in an upstream direction from the secondary nodes 112-$j$ to 112-$m$ to the primary node 110. In some implementations, each of the secondary nodes 112-$j$ to 112-$m$ can transmit a corresponding group of optical subcarriers or one optical subcarrier to an optical combiner 116 via a respective one of optical communication paths 115-$l$ to 115-$m$. The optical combiner 116 can, in turn, combine the received optical subcarriers from the secondary nodes 112-$j$ to 112-$m$ onto the optical communication path 117. In some implementations, the optical communication paths 115-$l$ to 115-$m$ and 117 can have a similar construction as that of the optical communication paths 111 and 112-$l$ to 112-$m$.

As further shown in FIG. 2, each of the secondary nodes 112-$j$ to 112-$m$ receives a respective data stream having a corresponding data rate of j Gbit/s, k Gbit/s, l Gbit/s, and m Gbit/s. At the primary node 110, data contained in these streams can be output such that the aggregate data supplied by the primary node 110 is n Gbit/s (e.g., such that n equals the sum of j, k, l, and m).

In some implementations, optical subcarriers can be transmitted in both an upstream and downstream direction over the same optical communication path. For instance, selected optical subcarriers can be transmitted in the downstream direction from the primary node 110 to the secondary nodes 112, and other optical subcarriers can be transmitted in the upstream direction from the secondary nodes 112 to the primary node 110.

In some implementations, the network 100 can include additional primary and/or secondary nodes and optical communication paths, or fewer primary and/or secondary nodes and optical communication paths. In some implementations, the network 100 can have a configuration different from that described above. For example, network 100 can have a mesh configuration or a point-to-point configuration.

Figure 3:
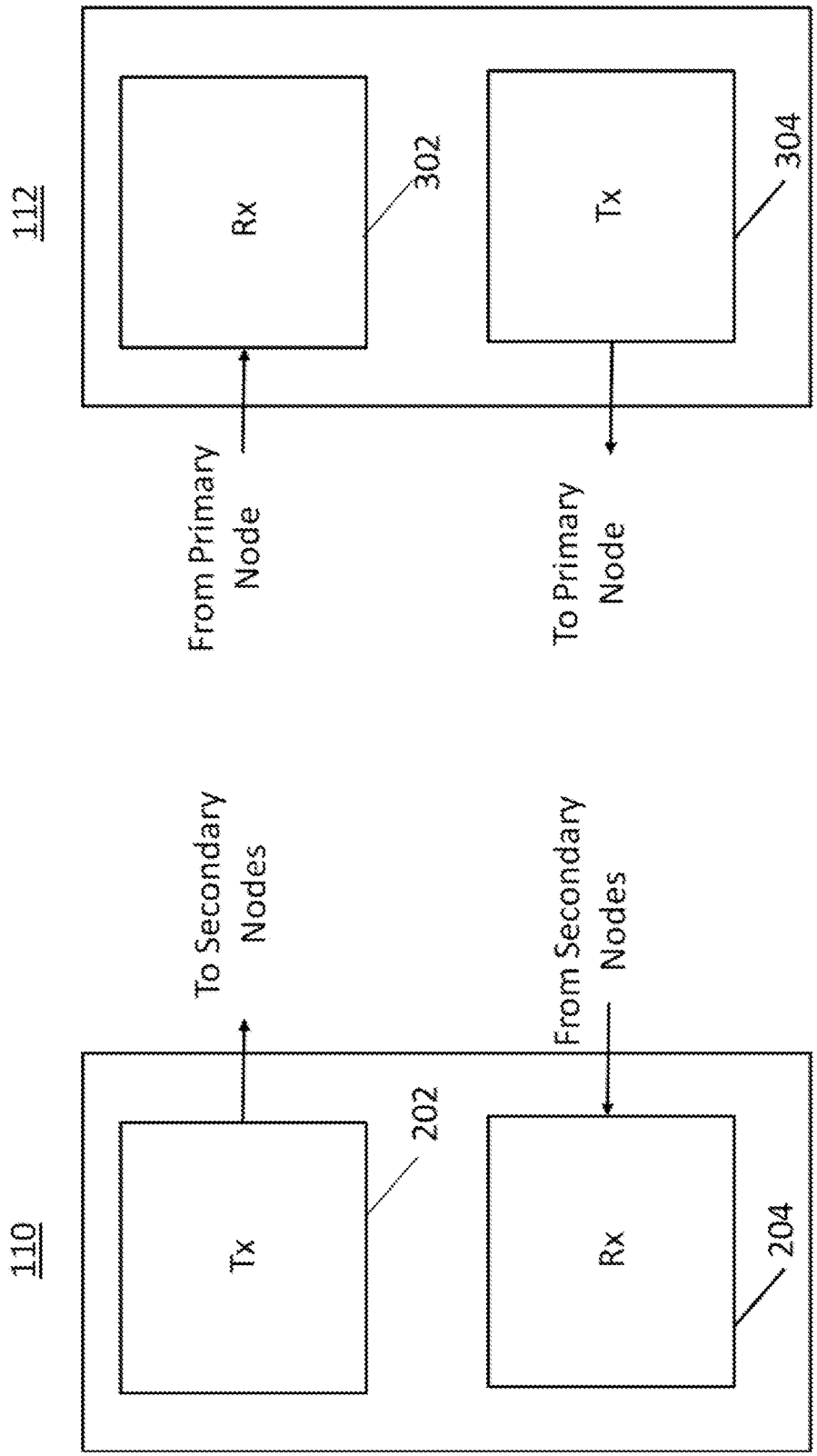
FIG. 3A is a block diagram showing an example of a primary node.
FIG. 3B is a block diagram showing an example of a secondary node.

FIG. 3 illustrates an example primary node 110 in greater detail. In this example, the primary node 110 includes a transmitter 202 that supplies a downstream modulated optical signal including optical subcarriers, and a receiver 204 that receives upstream optical subcarriers carrying data originating from one or more of the secondary nodes 112.

FIG. 3 illustrates an example secondary node 112 in greater detail. In this example, the secondary node 112 includes a receiver circuit 302 that receives one or more downstream transmitted optical subcarriers, and a transmitter circuit 304 that transmits one or more optical subcarriers in the upstream direction.

Figure 4:
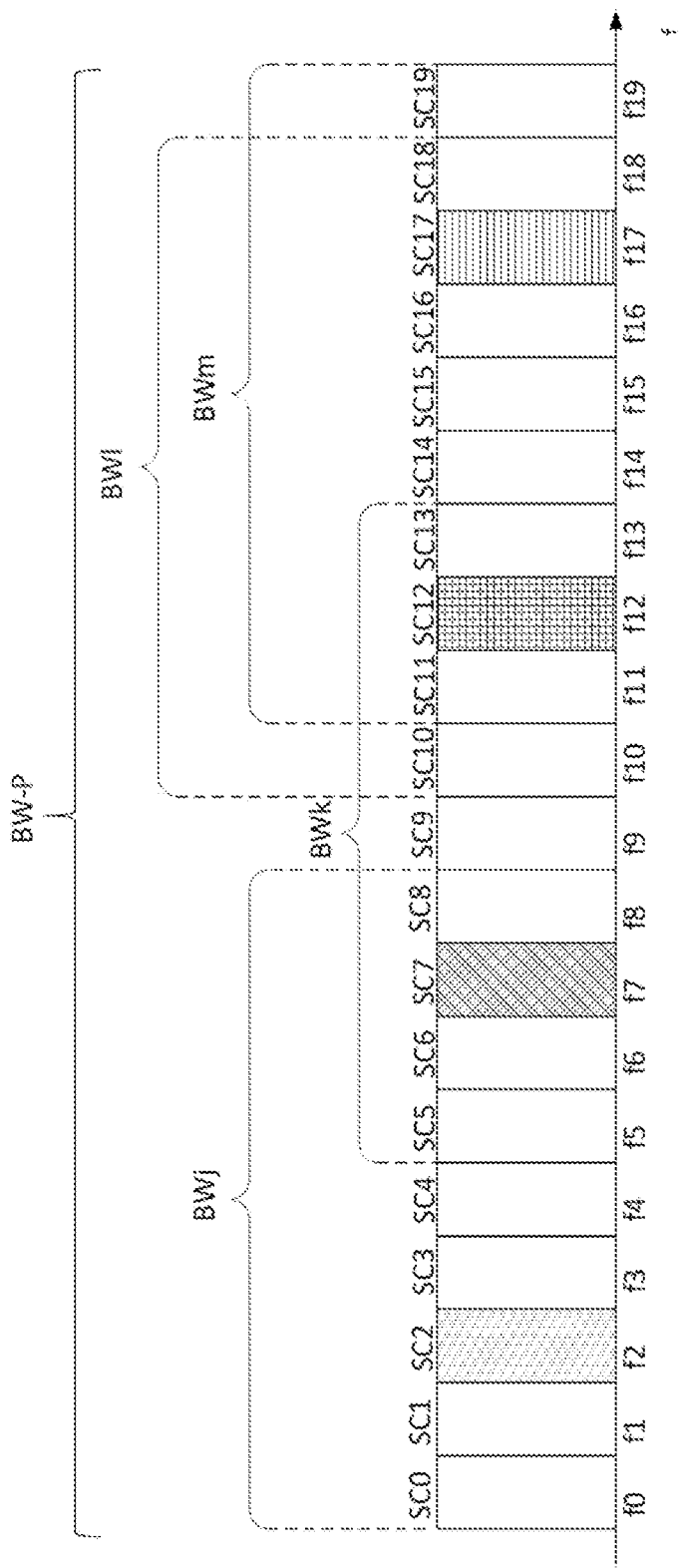
FIG. 4 is an example of a spectral plot showing optical subcarriers.

FIG. 4 illustrates an example of a transmission spectrum that can accommodate twenty optical subcarriers SC0 to SC19 that can be output from primary node transmitter 202. Each of the optical subcarriers SC0 to SC19 has a corresponding one of frequencies f0 to f19. In some implementations, the optical subcarriers SC0 to SC19 are Nyquist subcarriers. Nyquist subcarriers are a group of optical signals, each carrying data, where (i) the spectrum of each such optical signal within the group is sufficiently non-overlapping such that the optical signals remain distinguishable from each other in the frequency domain, and (ii) such group of optical signals is generated by modulation of light from a single laser. In general, each subcarrier can have an optical spectral bandwidth that is at least equal to the Nyquist frequency, as determined by the baud rate of such subcarrier.

In some implementations, each of the secondary nodes 112 can include components that have different (e.g., lower) capabilities than the components included in primary node 110. For example, the bandwidth or the data capacity of the secondary nodes 112 can be less than that associated with the primary node 110, such that the capacity associated with each of the secondary nodes 112 is less than that of the primary node 110.

Further, as shown in FIG. 4, the primary node 110 can have a bandwidth BW-P, such that the data carried by each of the optical subcarriers SC0 to SC12 can be processed, recovered, and output either from the transmitter 202 or received from the receiver 204. In contrast, each of the secondary nodes 112-j to 112-m can have a respective one of bandwidths BWj to BWm, such that each secondary node has a data processing capacity or is capable of processing and outputting data carried by multiple optical subcarriers (e.g., up to nine optical subcarriers, according to the example shown in FIG. 4).

In some implementations, certain components of the secondary nodes 112 (e.g., optical components and certain electrical components) can be configured such that they are capable of processing signals only over a limited frequency range or bandwidth. The limited frequency range or bandwidth can be less than the range of signal frequencies that can be accommodated by the optical and electrical components in the primary node 110. For example, electrical components, such as digital-to-analog (DACs), analog-to-digital converters (ADCs), and digital signal processors (DSPs), and optical components, such as modulators, in secondary nodes 112 can have an associated bandwidth that is less than the corresponding components in the primary node 110. This can be useful, for example, in reduce the cost of deploying and/or maintaining the network.

Example bandwidths of each of the secondary nodes 112 are shown in FIG. 4. In particular, a bandwidth BWj associated with the secondary node 112-j extends over or encompasses a range including frequencies f0 to f8 of the optical subcarriers SC0 to SC8, respectively; a bandwidth BWk associated with the secondary node 112-k extends over or encompasses a range including frequencies f5 to f13 of the optical subcarriers SC5 to SC13, respectively; a bandwidth BWl associated with the secondary node 112-l extends over or encompasses a range including frequencies f10 to f18 of the optical subcarriers SC10 to SC18, respectively; and a bandwidth BWm associated with the secondary node 112-m extends over or encompasses a range including frequencies f11 to f19 of the optical subcarriers SC11 to SC19, respectively. In contrast, the bandwidth of the primary node 110, BW-P, encompasses the entire range of frequencies f0-f19 of the optical subcarriers SC0 to SC19.

As also shown in FIG. 4, certain optical subcarriers can have frequencies that fall within multiple bandwidths. For example, the optical subcarriers SC5 and SC6 can have frequencies that fall within a bandwidth BWj and a bandwidth BWk. Therefore, the data carried by such optical subcarriers can be detected and selectively output from either the secondary node 112-j or the secondary node 112-k. For example, if a customer requires that more data be received and output from the secondary node 112-k and less data be output from the secondary node 112-j, the secondary nodes 112-j and 112-k can be controlled or dynamically configured such that the data carried by the optical subcarriers SC5 and SC6 are assigned to and output from the secondary node 112-k, but not the secondary node 112-j. Accordingly, the data output from each secondary node may be adapted to customer requirements that vary over time.

As also shown in FIG. 4, certain option subcarriers, such as the optical subcarriers SC2, SC7, SC12, and SC17, can be designated or dedicated to carry information related to a parameter or characteristic associated with one or more of the secondary nodes 112. For example, such parameters can correspond to an amount of data, data rate, or capacity to be output by one or more secondary nodes. In particular, such optical subcarriers ca carry information, for example, to configure or adjust the amount of data, capacity or data rate of data output from the secondary nodes 112-j to 112-m, respectively. As another example, each of these optical subcarriers can carry user or customer data (also referred to as client data) in addition to control information. In the example shown in FIG. 4, only the optical subcarriers SC2, SC7, SC12, and S17 are transmitted.

As another example, the subcarriers SC2, SC7, SC12, and SC17 can be modulated to carry control or operations, administration, and maintenance (OAM) information and related data corresponding to parameters associated therewith, such as the capacity and status of the secondary nodes 112. As another example, the subcarrier SC2 can be modulated carry such control and parameter information associated with the secondary node 112-j, the subcarrier SC7 can modulated to carry such control and parameter information associated with the secondary node 112-k, the subcarrier SC12 can be modulated to carry such control and parameter information associated with the secondary node 112-l, and the subcarrier SC17 can be modulated to carry such control and parameter information associated with the secondary node 112-*m*. As another example, optical subcarriers can be modulated to carry information related to a parameter associated the timing and scheduling of data transmission from the secondary nodes 112 to primary the node 110.

Data allocation and subcarrier transmission are described next with reference to FIG. 5 and FIGS. 6A-6C.

Figure 5:
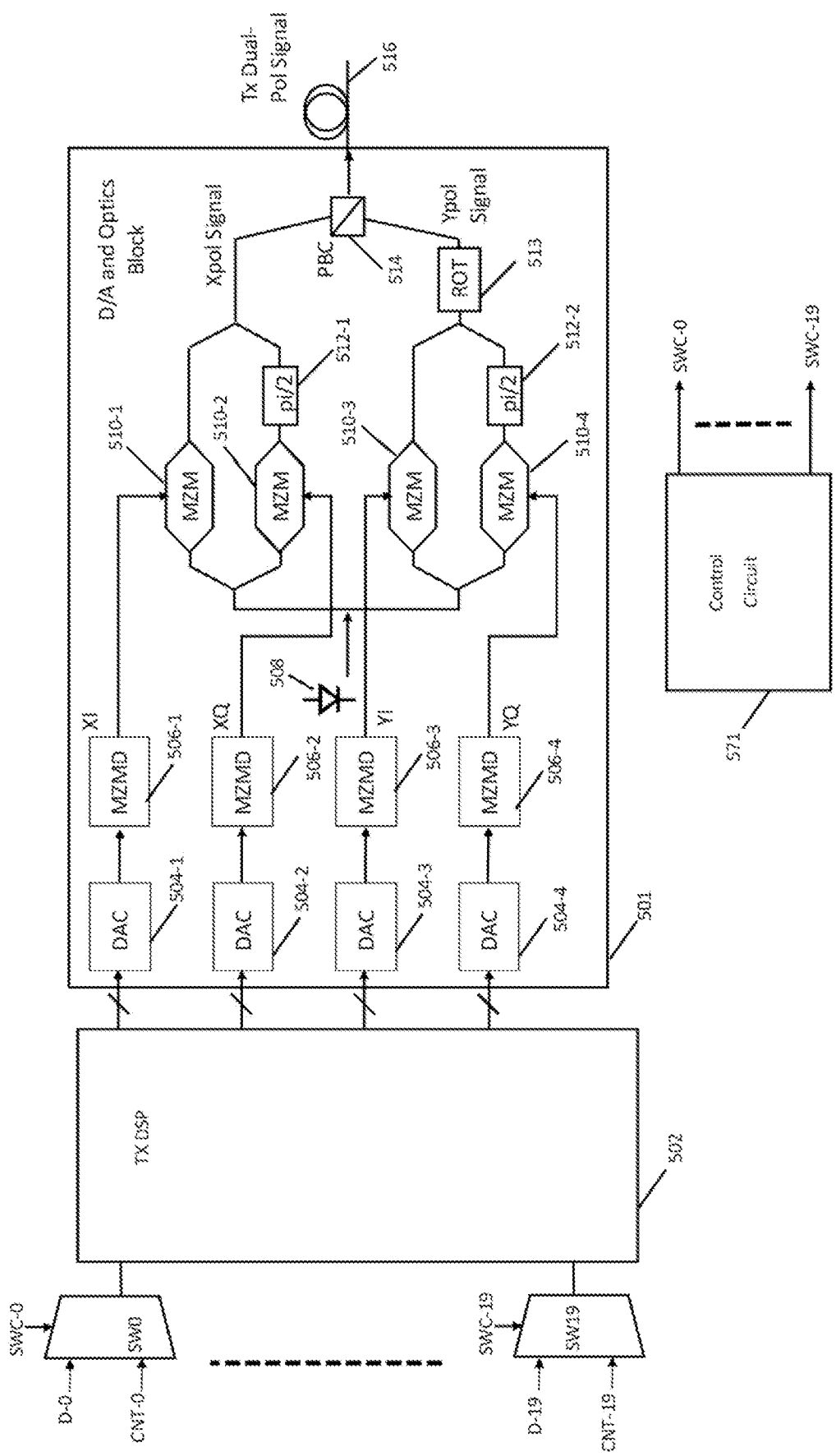
FIG. 5 shows an example of a primary node transmitter.

FIG. 5 illustrates the transmitter 202 of the primary node 110 in greater detail. The transmitter 202 includes a plurality of circuits or switches SW, as well as a transmitter DSP (TX DSP) 502 and a D/A and optics block 501. In this example, twenty switches (SW-0 to SW-19) are shown, although more or fewer switches can be provided than that shown in FIG. 5. In some implementations, each switch can have two respective inputs: the first input can receive user data, and the second input can receive control information or signals (CNT). Each of the switches SW-0 to SW-19 can receive a respective one of the control signals SWC-0 to SWC-19 output from the control circuit 571 (which can include one or more microprocessors, field programmable gate arrays (FPGA), or other processor circuits). Based on the received control signal, each of the switches SW-0 to SW19 selectively outputs any one of the data streams D-0 to D-19, or a control signal CNT-0 to CNT-19. The control signals CNT can be any combination of configuration bits for control and/or monitoring purposes. For example, the control signals CNT can include instructions to one or more of the secondary nodes 112 to change the data output from the secondary nodes 112, such as by identifying the optical subcarriers associated with such data. As another example, the control signals can include a series of known bits used in the secondary nodes 112 to "train" the receiver to detect and process such bits so that the receiver can further process subsequent bits. As another example, the control channel CNT can include information that may be used by the polarization mode dispersion (PMD) equalizer circuits 825, discussed below, to correct for errors resulting from polarization rotations of the X and Y components of one or more of the optical subcarriers. In a further example, the control information CNT can used to restore or correct phase differences between a laser transmit-side laser 508 and a local oscillator laser 710 in each of the secondary nodes 112. Such detected phase differences may be referred to as cycle slips. In a further example, the control information CNT can be used to recover, synchronize, or correct timing differences between clocks provided in the primary node 110 and the secondary node 112.

In some implementations, one or more of the switches SW can be omitted, and the control signals CNT can be supplied directly to the DSP 502. Moreover, each input to the DSP 502, such as the inputs to FEC encoders 602 described below (see FIG. 6A), can receive a combination of control information (e.g., as described above) as well as user data.

In some implementations, the control signal CNT can include information related to the number of optical subcarriers that are output from each of the secondary nodes 112. Such selective transmission of optical subcarriers is described with reference to FIGS. 6A-6C. Although such description is provided in connection with the primary node DSP 502, similar circuitry can be included in a DSP of the secondary node 112 to adjust or control the number of optical subcarriers output therefrom.

Based on the outputs of the switches SW-0 to SW-19, the DSP 502 can supply a plurality of outputs to the D/A and optics block 501 including digital-to-analog conversion (DAC) circuits 504-1 to 504-4, which convert digital signal received from the DSP 502 into corresponding analog signals. The D/A and optics block 501 also includes driver circuits 506-1 to 506-2 that receive the analog signals from the DACs 504-1 to 504-4 and adjust the voltages or other characteristics thereof to provide drive signals to a corresponding one of the modulators 510-1 to 510-4.

The D/A and optics block 501 further includes modulators 510-1 to 510-4 (e.g., Mach-Zehnder modulators (MZM)) that modulates the phase and/or amplitude of the light output from the laser 508. As further shown in FIG. 5, light output from the laser 508, also included in the block 501, is split such that a first portion of the light is supplied to a first MZM pairing, including the MZMs 510-1 and 510-2, and a second portion of the light is supplied to a second MZM pairing, including the MZMs 510-3 and 510-4. The first portion of the light is split further into third and fourth portions, such that the third portion is modulated by the MZM 510-1 to provide an in-phase (I) component of an X (or TE) polarization component of a modulated optical signal, and the fourth portion is modulated by the MZM 510-2 and fed to a phase shifter 512-1 to shift the phase of such light by 90 degrees in order to provide a quadrature (Q) component of the X polarization component of the modulated optical signal. Similarly, the second portion of the light is further split into fifth and sixth portions, such that the fifth portion is modulated by the MZM 910-3 to provide an I component of a Y (or TM) polarization component of the modulated optical signal, and the sixth portion is modulated by the MZM 510-4 and fed to a phase shifter 512-2 to shift the phase of such light by 90 degrees to provide a Q component of the Y polarization component of the modulated optical signal.

The optical outputs of the MZMs 510-1 and 510-2 are combined to provide an X polarized optical signal including I and Q components and are fed to a polarization beam combiner (PBC) 514 provided in block 501. In addition, the outputs of the MZMs 510-3 and 510-4 are combined to provide an optical signal that is fed to polarization rotator 513, further provided in block 501, that rotates the polarization of such optical signal to provide a modulated optical signal having a Y (or TM) polarization. The Y polarized modulated optical signal also is provided to the PBC 514, which combines the X and Y polarized modulated optical signals to provide a polarization multiplexed ("dual-pol") modulated optical signal onto an optical fiber 516, for example, which may be included as a segment of optical fiber in optical communication path 111.

The polarization multiplexed optical signal output from the D/A and optics block 501 includes the optical subcarriers SC0-SC19 noted above, such that each optical subcarrier has X and Y polarization components and I and Q components. Moreover, each of the optical subcarriers SC0 to SC19 can be associated with or correspond to a respective one of the outputs of the switches SW-0 to SW-19. In some implementations, the switches SW2, SW7, SW12, and SW17 can supply control information carried by a respective one of the control signals CNT-2, CNT-7, CNT-12, and CNT-17 to DSP 502. Based on such control signals, the DSP 502 can provide outputs that result in the optical subcarriers SC2, SC7, SC12, and SC17 carrying data indicative of the control information carried by the CNT-2, CNT-7, CNT-12, and CNT-17, respectively. In addition, the remaining optical subcarriers SC0, SC1, SC3 to SC6, SC8 to SC11, SC13 to SC16, and SC18 to SC20 can carry information indicative of a respective one of the data streams D-0, D-1, D-3-D-6, D-8 to D-11, D-13 to D-16, and D-18 to D-20 output from a corresponding one of the switches SW0, SW1, SW3 to SW-6, SW-8 to SW11, SW13 to SW16, and SW18 to SW20. In some implementations, at least some of the switches (e.g., SW0 to SW19, as shown in FIG. 5) can be omitted, such that data stream are supplied directly to the Tx DSP 502.

Figure 6A:
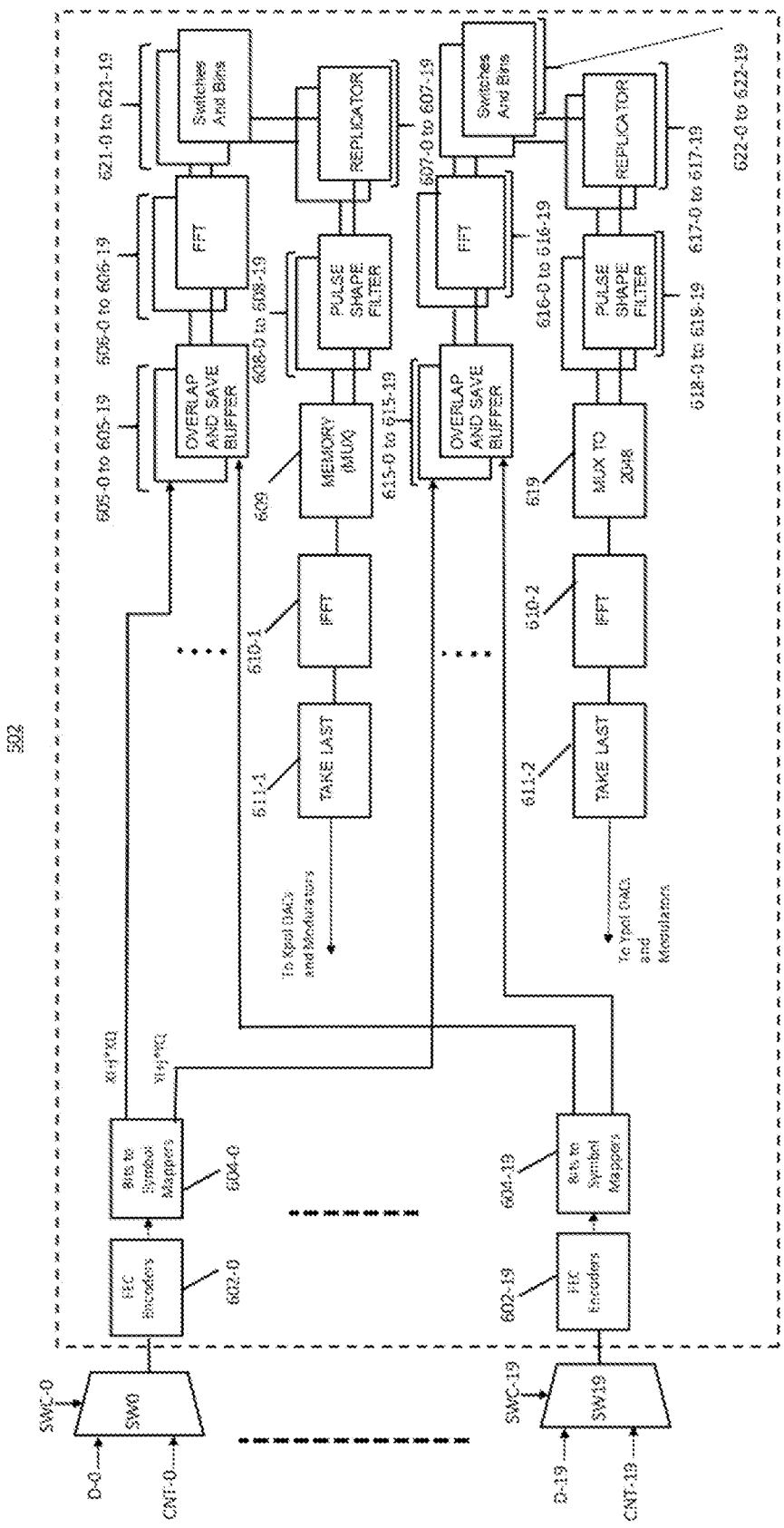
FIG. 6A is a block diagram showing an example of a primary node transmitter digital signal processor (DSP).

FIG. 6A shows an example of the TX DSP 502 in greater detail. The TX DSP 502 can include FEC encoders 602-0 to 602-19, each of which can receive a respective one of a plurality of the outputs from the switches SW0 to SW19. The FEC encoders 602-0 to 602-19 carry out forward error correction coding on a corresponding one of the switch outputs, such as, by adding parity bits to the received data. The FEC encoders 602-0 to 602-19 can also provide timing skew between the subcarriers to correct for skew induced by link between the nodes 110 and 112-$j$ to 112-$m$ described above. In addition, the FEC encoders 602-0 to 602-19 can interleave the received data.

Each of the FEC encoders 602-0 to 602-19 provides an output to a corresponding one of a plurality of bits-to-symbol circuits, 604-0 to 604-19 (collectively referred to herein as "604"). Each of the bits-to-symbol circuits 604 can map the encoded bits to symbols on a complex plane. For example, the bits-to-symbol circuits 604 can map four bits to a symbol in a dual-polarization QPSK constellation. Each of the bits-to-symbol circuits 604 provides first symbols, having the complex representation XI+j*XQ, associated with a respective one of the switch outputs, such as D-0, to a DSP portion 603. Data indicative of such first symbols is carried by the X polarization component of each subcarrier SC0-SC19.

Each of the bits-to-symbol circuits 604 can also provide second symbols having the complex representation YI+j*YQ, also associated with a corresponding output of the switches SW0-SW19. Data indicative of such second symbols, however, is carried by the Y polarization component of each of subcarriers SC-0 to SC-19.

In some implementations, such mapping, as carried by the circuit 604-0 to 604-19, can define a particular modulation format for each subcarrier. That is, such circuit can define a mapping for all the optical subcarrier that is indicative of a binary phase shift keying (BPSK) modulation format, a quadrature phase shift keying (QPSK) modulation format, or an m-quadrature amplitude modulation (QAM, where m is a positive integer, e.g., 4, 8, 16, or 64) format. In another example, one or more of the optical subcarriers can have a modulation format that is different from the modulation format of other optical subcarriers. That is, one of the optical subcarriers can have a QPSK modulation format and another optical subcarrier can have a different modulation format, such as 8-QAM or 16-QAM. In another example, one of the optical subcarriers can have an 8-QAM modulation format and another optical subcarrier can have a 16 QAM modulation format. Accordingly, although all the optical subcarriers can carry data at the same data and or baud rate, one or more of the optical subcarriers can carry data at a different data or baud rate than one or more of the other optical subcarriers. Moreover, modulation formats, baud rates and data rates can be changed over time depending on capacity requirements. Adjusting such parameters can be achieved, for example, by applying appropriate signals to mappers 604 based on control information or data.

As further shown in FIG. 6A, each of the first symbols output from each of the bits-to-symbol circuits 604 is supplied to a respective one of the first overlap and save buffers 605-0 to 605-19 (collectively referred to herein as the overlap and save buffers 605). Each the overlap and save buffers 605 can buffer a particular number of symbols (e.g., 256 symbols). In some implementations, each of the overlap and save buffers 605 can receive 128 of the first symbols or another number of such symbols at a time from a corresponding one of the bits to symbol circuits 604. Thus, the overlap and save buffers 605 can combine 128 new symbols from the bits to symbol circuits 605, with the previous 128 symbols received from the bits to symbol circuits 605.

Each of the overlap and save buffers 605 supplies an output (e.g., in the time domain) to a corresponding one of the fast Fourier transform (FFT) circuits 606-0 to 606-19 (collectively referred to as the "FFTs 606"). In some implementations, the output can include 256 symbols or another number of symbols. Each of the FFTs 606 converts the received symbols to the frequency domain using or based on a fast Fourier transform. Each of the FFTs 606 can provide the frequency domain data to the bins and switches blocks 621-0 to 621-19. As discussed in greater detail below, the bins and switches blocks 621 include, can include memories or registers, also referred to as frequency bins (FB) or points, that store frequency components associated with each optical subcarrier.

Figure 6B:
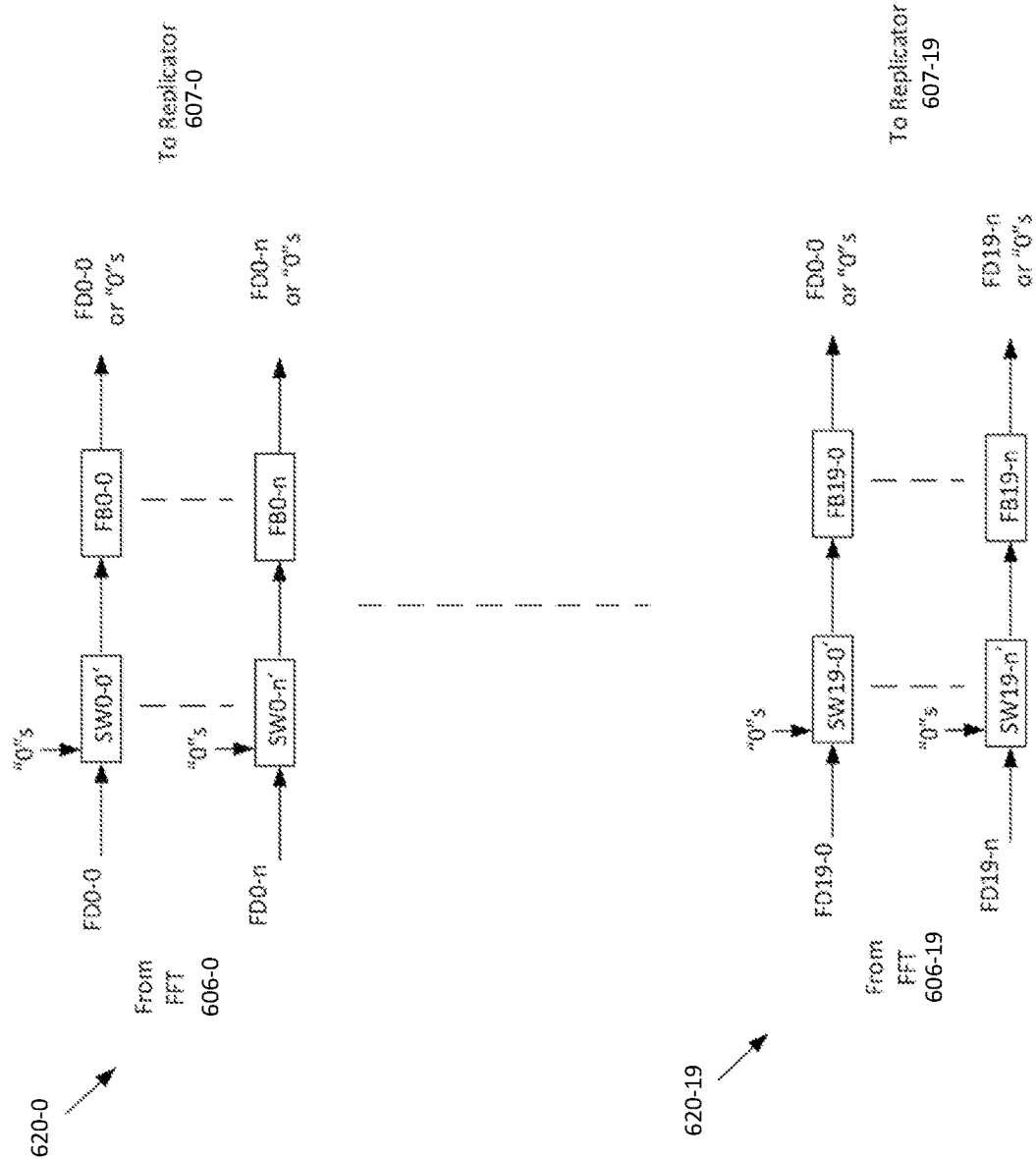
FIG. 6B illustrates a portion of a primary node transmitter DSP in greater detail.

Selected frequency bins FB are shown in FIG. 6B. Groups of such frequency bins FB are associated with give subcarriers. Accordingly, for example, a first group of frequency bins, FB0-0 to FB0-$n$, is associated with SC0 and a second group of frequency bins FB19-0 to FB19-$n$ with SC19 (where n is a positive integer). As further shown in FIG. 10$b$, each of the frequency bins FB is further coupled to a respective one of switches SW. For example, each of frequency bins FB0-0 to FB0-$n$ is coupled to a respective one of switches SW0-0 to SW0-$n$, and each of FB19-0 to FB19-$n$ is coupled to a respective one of switches or switch circuits SW19-0 to SW19-$n$.

Each of the switches SW selectively supplies either frequency domain data output from one of the FFT circuits 606-0 to 606-19 or a predetermined value, such as 0. In order to block or eliminate transmission of a particular subcarrier, the switches SW associated with the group of frequency bins FB associated with that optical subcarrier are configured to supply the zero value to corresponding frequency bins. Accordingly, in order to block the optical subcarrier SC0, the switches SW0-0' to SW0-$n$' supply zero (0) values to a respective one of the frequency bins FB0-0 to FB0-$n$. Further processing of the zero (0) values by replicator components 1007, as well as other components and circuits in the DSP 502, result in drive signals supplied to the modulators 510, such that the optical subcarrier SC0 is omitted from the optical output from the modulators.

In contrast, the switches SW' can be configured to supply the outputs of the FFTs 606 (e.g., frequency domain data FD) to corresponding frequency bins FB. Further processing of the contents of the frequency bins FB by replicator components 607 and other circuits in DSP 502 result in drive signals supplied to modulators 510, whereby, based on such drive signals, optical subcarriers are generated that correspond to the frequency bin groupings associated with that subcarrier.

In the example discussed above, the switches SW0-0' to SW0-$n$' supply frequency domain data FD0-0 to FD-n from the FFT 606-0 to a respective one of switches SW0-0 to SW0-$n$. These switches, in turn, supply the frequency domain data to a respective one of the frequency bins FB0-0 to FB0-$n$ for further processing, as described in greater detail below.

Each of replicator components or circuits 607-0 to 607-19 can replicate the contents of the frequency bins FB and store such contents (e.g., for T/2 based filtering of the subcarrier) in a respective one of the plurality of replicator components. Such replication may increase the sample rate. In addition, the replicator components or circuits 607-0 to 607-19 can arrange or align the contents of the frequency bins to fall within the bandwidths associated with the pulse shaped filter circuits 608-0 to 608-19 described below.

Each of the pulse shape filter circuits 608-0 to 608-19 can apply a pulse shaping filter to the data stored in the 512 frequency bins of a respective one of the plurality of replicator components or circuits 607-0 to 607-19 to thereby provide a respective one of a plurality of filtered outputs, which are multiplexed and subject to an inverse FFT, as described below. The pulse shape filter circuits 608-1 to 608-19 calculate the transitions between the symbols and the desired subcarrier spectrum so that the subcarriers can be packed together spectrally for transmission (e.g., with a close frequency separation). The pulse shape filter circuits 608-0 to 608-19 also can be used to introduce timing skew between the subcarriers to correct for timing skew induced by links between nodes (e.g., the nodes shown in FIG. 1). The multiplexer component 609, which can include a multiplexer circuit or memory, can receive the filtered outputs from the pulse shape filter circuits 608-0 to 608-19, and multiplex or combine such outputs together to form an element vector.

Next, the IFFT circuit or component 610-1 can receive the element vector and provide a corresponding time domain signal or data based on an inverse fast Fourier transform (IFFT). In some implementations, the time domain signal can have a rate of 64 GSample/s. The take last buffer or memory circuit 611-1, for example, can select the last 1024 samples, or another number of samples, from an output of the IFFT component or circuit 610-1 and supply the samples to the DACs 504-1 and 504-2 (see FIG. 5) at 64 GSample/s, for example. As noted above, the DAC 504-1 is associated with the in-phase (I) component of the X pol signal, and the DAC 504-2 is associated with the quadrature (Q) component of the Y pol signal. Accordingly, consistent with the complex representation XI+jXQ, the DAC 504-1 receives values associated with XI and the DAC 504-2 receives values associated with jXQ. As indicated by FIG. 5, based on these inputs, the DACs 504-1 and 504-2 provide analog outputs to the MZMD 506-1 and the MZMD 506-2, respectively.

As further shown in FIG. 6A, each of the bits-to-symbol circuits 604-0 to 604-19 outputs a corresponding one of symbols indicative of data carried by the Y polarization component of the polarization multiplexed modulated optical signal output on the fiber 516. As further noted above, these symbols can have the complex representation YI+j*YQ. Each such symbol can be processed by a respective one of the overlap and save buffers 615-0 to 615-19, a respective one of the FFT circuits 616-0 to 616-19, a respective one of the replicator components or circuits 617-0 to 617-19, the pulse shape filter circuits 618-0 to 618-19, the multiplexer or memory 619, the IFFT 610-2, and the take last buffer or memory circuit 611-2, to provide processed symbols having the representation YI+j*YQ in a manner similar to or the same as that discussed above in generating processed symbols XI+j*XQ output from the take last circuit 611-1. In addition, symbol components YI and YQ are provided to the DACs 504-3 and 504-4 (FIG. 5), respectively. Based on these inputs, the DACs 504-3 and 504-4 provide analog outputs to the MZMD 506-3 and the MZMD 506-4, respectively, as discussed above.

While FIG. 6A shows the DSP 502 as including a particular number and arrangement of functional components, in some implementations, the DSP 502 can include additional functional components, fewer functional components, different functional components, or differently arranged functional components. In addition, typically the number of overlap and save buffers, FFTs, replicator circuits, and pulse shape filters associated with the X component can be equal to the number of switch outputs, and the number of such circuits associated with the Y component also can be equal to the number of switch outputs. However, in other examples, the number of switch outputs can be different from the number of these circuits.

As noted above, based on the outputs of the MZMDs 506-1 to 506-4, a plurality of the optical subcarriers SC0 to SC19 can be output onto the optical fiber 516 (FIG. 5), which is coupled to the primary node 110.

In some implementations, the number of optical subcarriers transmitted from the primary node 110 to the secondary nodes 112 can vary over time based, for example, on capacity requirements at the primary node and the secondary nodes. For instance, if less downstream capacity is required initially at one or more of the secondary nodes, the transmitter 202 in the primary node 110 can be configured to output fewer optical subcarriers. In contrast, if further capacity is required later, the transmitter 202 can provide more optical subcarriers.

In addition, if based on changing capacity requirements, a particular secondary node 112 needs to be adjusted, the output capacity of such secondary node can be increased or decreased by increasing or decreasing the number of optical subcarriers output from the secondary node.

As noted above, by storing and subsequently processing zeros (0s) or other predetermined values in the frequency bin FB groupings associated with a given optical subcarrier, that optical subcarrier can be removed or eliminated. To add or reinstate such an optical subcarrier, frequency domain data output from the FFTs 606 can be stored in the frequency bins FB and subsequently processed to provide the corresponding optical subcarrier. Thus, optical subcarriers can be selectively added or removed from the optical outputs of the primary node transmitter 202 and the secondary node transmitter 304, such that the number of subcarriers output from such transmitters can be varied, as desired.

In the above example, zeros (0s) or other predetermined values are stored in selected frequency bins FBs to prevent transmission of a particular optical subcarrier. In some implementations, such zeroes or values can instead be provided in a manner similar to that described above, at the outputs of corresponding replicator components 607 or stored in corresponding locations in the memory or multiplexer 609. Alternatively, the zeroes or values noted above can be provided in a manner similar to that described above, at corresponding outputs of the pulse shape filters 608.

Figure 6C:
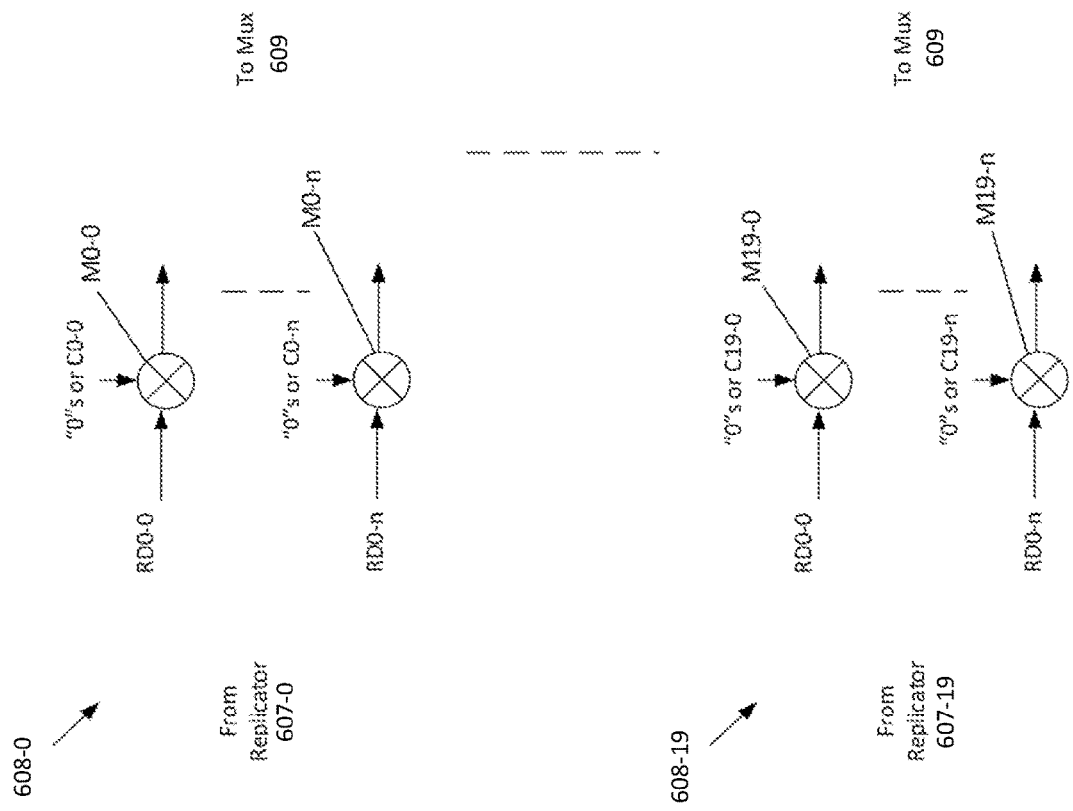
FIG. 6C illustrates a portion of a primary node transmitter DSP in greater detail.

In a further example, a corresponding one of the pulse shape filters 608-1 to 608-19 can selectively generate zeroes or predetermined values that, when further processed, also cause one or more of the optical subcarriers to be omitted from the output of either the primary node transmitter 202 or the secondary node transmitter 304. In particular, as shown in FIG. 6C, the pulse shape filters 608-0 to 608-19 are shown as including groups of multiplier circuits M0-0 to M0-$n$ . . . M19-0 to M19-$n$ (also individually or collectively referred to as M). Each multiplier circuit M constitutes part of a corresponding butterfly filter. In addition, each multiplier circuit grouping is associated with a corresponding one of the optical subcarriers.

Each multiplier circuit M receives a corresponding one of output groupings RD0-0 to RD0-$n$ RD19-0 to RD19-$n$ from the replicator components 607. In order to remove or eliminate one of optical subcarriers, the multiplier circuits M receiving the outputs within a particular grouping associated with that optical subcarrier multiply such outputs by zero (0), such that each multiplier M within that group generates a product equal to zero (0). The zero products then are subject to further processing similar to that described above to provide drive signals to modulators 510 that result in a corresponding optical subcarrier being omitted from the output of the transmitter (e.g., either the transmitter 202 or the transmitter 304).

In contrast, in order to provide an optical subcarrier, each of the multiplier circuits M within a particular groping can multiply a corresponding one of the replicator outputs RD by a respective one of coefficients C0-0 to C0-$n$ ... C19-0 to C19-$n$, which results in at least some non-zero products being output. Based on the products output from the corresponding multiplier grouping, drive signals are provided to the modulators 510 to output the desired optical subcarrier from the transmitter (e.g., either the transmitter 202 or the transmitter 304).

Accordingly, in order to block or eliminate the optical subcarrier SC0, each of the multiplier circuits M0-0 to M0-$n$ (associated with the optical subcarrier SC0) can multiply a respective one of the replicator outputs RD0-0 to RD0-$n$ by zero (0). Each such multiplier circuit, therefore, provides a product equal to zero, which is further processed such that resulting drive signals cause the modulators 510 to provide an optical output without the optical subcarrier SC0. In order to reinstate the optical subcarrier SC0, the multiplier circuits M0-0 to M0-$n$ multiply a corresponding one of the appropriate coefficients C0-0 to C0-$n$ by a respective one of the replicator outputs RD0-0 to RD0-$n$ to provide products, at least some of which are non-zero. Based on these products, the modulator drive signals are generated that result in the optical subcarrier SC0 being output.

The above examples are described in connection with generating or removing the X component of an optical subcarrier. The processes and circuitry described above is employed or included in the DSP 502 and optical circuitry used to generate the Y component of the subcarrier to be blocked. For example, the switches and bins circuit blocks 622-0 to 622-19, can have a similar structure and operate in a similar manner as the switches and bins circuit blocks 621 described above to provide zeroes or frequency domain data, as the case may be, to selectively block the Y component of one or more the optical subcarriers. Alternatively, multiplier circuits, like those described above in connection with FIG. 6C, can be provided to supply zero products output from the selected pulse shape filters 618 in order to block the Y component of a particular subcarrier or, if non-zero coefficients are provided to the multiplier circuits instead, generate the optical subcarrier.

Thus, the above examples illustrate mechanisms by which the optical subcarriers can be selectively blocked from or added to the output of the transmitter 202. Since the DSPs and optical circuitry provided in secondary node transmitters 304 can be similar to those of the primary node transmitter 202, the processes and circuitry described above can be provided, for example, in the secondary node transmitters 304 to selectively add and remove optical subcarriers SC from the outputs of the secondary node transmitters. Moreover, the circuitry described above in connection with FIGS. 6B and/or 6C can be configured such that a first number of optical subcarriers are output from the transmitter (in either the primary node 110 or the secondary node 112) during a first period of time based on initial capacity requirements. Later, during a second period of time, a second number of optical subcarriers can be output from the transmitters based on capacity requirements different from the first capacity requirements.

The optical subcarriers SC0 to SC19 can be provided to secondary nodes 112 in FIG. 1. An example of the receiver circuit 302 in one of the secondary nodes 112 will be described next with reference to FIG. 7A.

Figure 7A:
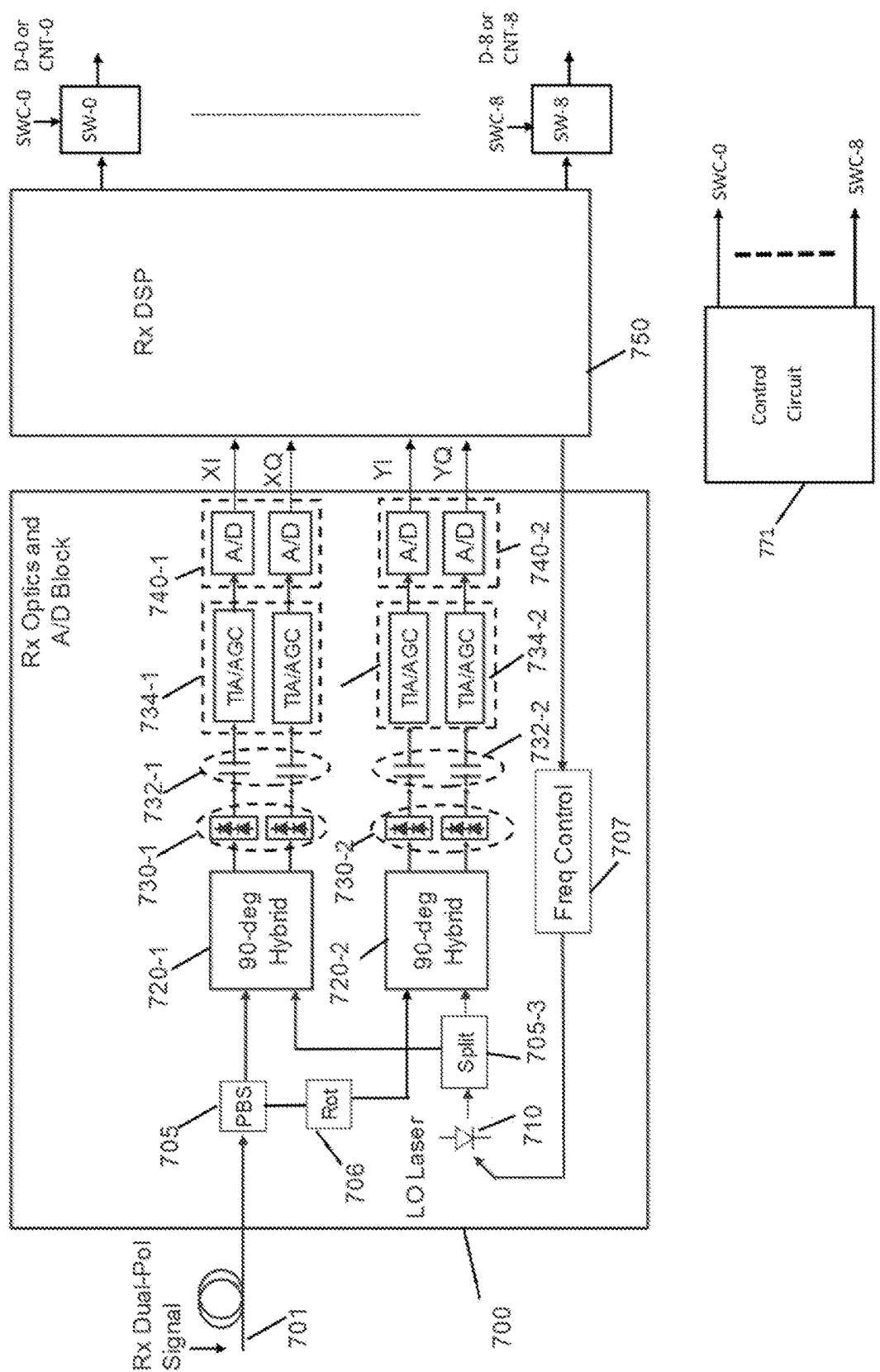
FIG. 7A shows an example of a secondary node receiver

As shown in FIG. 7A, the optical receiver 302 can include an Rx optics and A/D block 700, which, in conjunction with the DSP 750, can carry out coherent detection. The block 700 can include a polarization splitter (PBS) 705 with a first output 705-1 and a second output 705-2, a local oscillator (LO) laser 710, 90 degree optical hybrids or mixers 720-1 and 720-2 (referred to generally as hybrid mixers 720 and individually as a hybrid mixer 720), detectors 730-1 and 730-2 (referred to generally as detectors 730 and individually as a detector 730, each including either a single photodiode or balanced photodiode), AC coupling capacitors 732-1 and 732-2, transimpedance amplifiers/automatic gain control circuits TIA/AGC 734-1 and 734-2, ADCs 740-1 and 740-2 (referred to generally as ADCs 740 and individually as an ADC 740).

The polarization beam splitter (PBS) 705 cam include a polarization splitter that receives an input polarization multiplexed optical signal including the optical subcarriers SC0 to SC19 supplied by the optical fiber link 701, which may be, for example, an optical fiber segment as part of one of optical communication paths 113-$k$ to 113-$m$ noted above. The PBS 705 can split the incoming optical signal into the two X and Y orthogonal polarization components. The Y component can be supplied to a polarization rotator 706 that rotates the polarization of the Y component to have the X polarization. The hybrid mixers 720 can combine the X and rotated Y polarization components with light from the local oscillator laser 710 (e.g., a tunable laser). For example, the hybrid mixer 720-1 can combine a first polarization signal (e.g., the component of the incoming optical signal having a first or X (TE) polarization output from a first PBS port) with light from the local oscillator 710, and the hybrid mixer 720-2 can combine the rotated polarization signal (e.g., the component of the incoming optical signal having a second or Y (TM) polarization output from a second PBS port) with the light from the local oscillator 710. In some implementations, the polarization rotator 790 can be provided at the PBS output to rotate Y component polarization to have the X polarization.

The detectors 730 can detect mixing products output from the optical hybrids to form corresponding voltage signals, which are subject to AC coupling by the capacitors 732-1 and 732-1, as well as amplification and gain control by the TIA/AGCs 734-1 and 734-2. The outputs of the TIA/AGCs 734-1 and 734-2 and the ADCs 740 can convert the voltage signals to digital samples. For example, two detectors (e.g., photodiodes) 730-1 can detect the X polarization signals to form the corresponding voltage signals, and a corresponding two ADCs 740-1 can convert the voltage signals to digital samples for the first polarization signals after amplification, gain control and AC coupling. Similarly, two detectors 730-2 can detect the rotated Y polarization signals to form the corresponding voltage signals, and a corresponding two ADCs 740-2 can convert the voltage signals to digital samples for the second polarization signals after amplification, gain control and AC coupling. The RX DSP 750 can process the digital samples associated with the X and Y polarization components to output data associated with one or more optical subcarriers within a group of optical subcarriers SC0 to SC19 encompassed by the bandwidth (e.g., one of the bandwidths BWj, BWk, BWl, and BWm) associated with the secondary node housing the particular DSP 750. For example, as shown in FIG. 4, the optical subcarriers SC0 to SC8 are within a bandwidth BSj, and such optical subcarriers can be processed by the receiver in the secondary node 112-*j*. However, the optical subcarriers SC5 to SC13 within a bandwidth BWk can be processed by the receiver in the secondary node 112-*k*. That is, the bandwidths BWj and BWk overlap, such that the optical subcarriers within the overlapped portions of these bandwidths, namely, the optical subcarriers SC5 to SC8, will be processed by the receivers in both the secondary node 112-*j* and the secondary node 112-*k*. If the data associated with these optical subcarriers is intended to be output from the secondary node 112-*k*, switch circuits can be provided to selectively output such data at the secondary node 112-*k* but not from the secondary node 112-*j*.

While FIG. 7A shows the optical receiver 302 as including a particular number and arrangement of components, in some implementations, the optical receiver 302 can include additional components, fewer components, different components, or differently arranged components. The number of detectors 730 and/or ADCs 740 can be selected to implement an optical receiver 302 that is capable of receiving a polarization multiplexed signal. In some instances, one of the components illustrated in FIG. 7A can carry out a function described herein as being carried out by another one of the components illustrated in FIG. 7A.

In order to select a particular optical subcarrier or group of optical subcarriers at a secondary node 112, the local oscillator 710 can be tuned to output light having a wavelength or frequency relatively close to the selected optical subcarrier wavelength(s) to thereby cause a beating between the local oscillator light and the selected optical subcarrier (s). Such beating will either not occur or will be significantly attenuated for the other non-selected subcarriers so that data carried by the selected optical subcarrier(s) is detected and processed by the DSP 650.

Figure 7B:
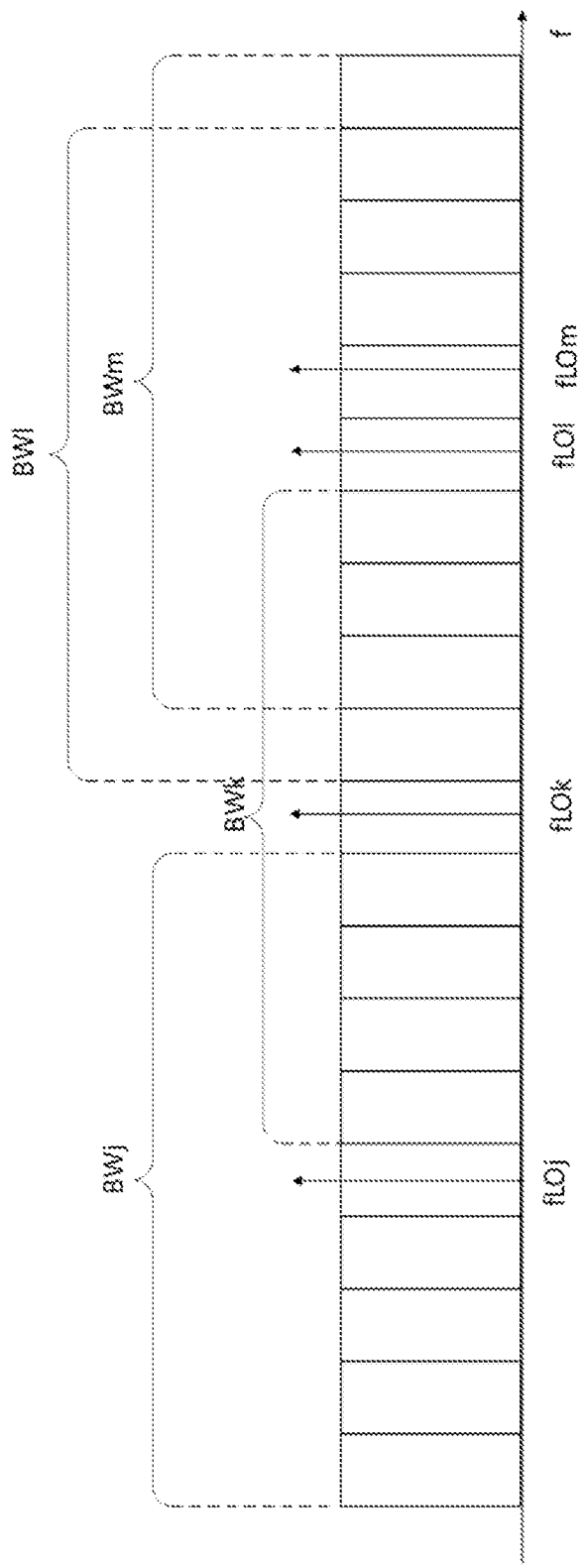
FIG. 7B is an example of a spectral plot showing optical subcarriers and local oscillator frequencies.

As noted above, each of the secondary nodes 112 can have a smaller bandwidth than the bandwidth associated with the primary node 110. The optical subcarriers encompassed by each of the secondary nodes can be determined by the frequency of the local oscillator laser 710 in the secondary node receiver 302. For example, as shown in FIG. 7B, a bandwidth BWj associated with the secondary node 112-*j* can be centered about the local oscillator frequency fLOj, a bandwidth BWk associated with the secondary node 112-*k* can be centered about the local oscillator frequency fLOk, a bandwidth BWl associated with the secondary node 112-*l* can be centered about the local oscillator frequency fLOl, and a bandwidth BWm associated with the secondary node 112-*m* can be centered about the local oscillator frequency fLOm. Accordingly, each of the bandwidth BWj to BWm can shift depending on the frequency of each of the secondary node local oscillator lasers 710. Tuning the local oscillator frequency, for example, by changing the temperature of the local oscillator laser 710 can result in corresponding shifts in the bandwidth to encompass a different group of optical subcarriers than were detected prior to such bandwidth shift. The temperature of the local oscillator laser 710 can be controlled with a thin film heater, for example, provided adjacent to the local oscillator laser or to portions of the local oscillator laser such as the mirror sections. Alternatively, the local oscillator laser can be frequency tuned by controlling the current supplied to the laser. The local oscillator laser 710 can be a semiconductor laser, such as a distributed feedback laser or a distributed Bragg reflector laser.

In some implementations, the maximum bandwidth or number of optical subcarriers that can be received, detected, and processed by a secondary node receiver 302, can be restricted based on hardware limitations of the various circuit components in receiver 302, and, therefore may be fixed. Accordingly, the bandwidth associated with each of the secondary nodes 112 can may be less than a bandwidth BW-P associated with the primary node 110. Further, the number of secondary nodes can be greater than the number of optical subcarriers output from the primary node 110. In addition, the number of upstream optical subcarriers received by the primary node 110 can be equal to the number of optical subcarriers transmitted by the primary node 110 in the upstream direction. Alternatively, the number of optical subcarriers transmitted in the upstream direction collectively by the secondary nodes 112 can less than or greater than the number of downstream optical subcarriers output from the primary node. Further, in some implementations, one or more of the secondary nodes 112 can output a single optical subcarrier.

As shown in FIG. 7B and discussed above, the bandwidths associated with the secondary nodes 112 can overlap, such that certain optical subcarriers can be detected by multiple secondary nodes 112. If the data associated with such optical subcarriers is intended for one of those secondary nodes, but not the other, switch circuitry can be provided in the secondary nodes to output the data selectively at the intended secondary node but not the others.

For example, as further shown in FIG. 7A, the switches or circuits SW-0 to SW-8 can be provided at the output of the DSP 750 to selectively output the data detected from the received optical subcarriers based on a respective one of control signals CNT-0 to CNT-8 output from the control circuit 771, which, like the control circuit 571, can include a microprocessor, FPGA, or other processor circuit. Control signals can designate the output of each respective switch. Accordingly, if data carried by predetermined subcarriers is intended to be output at a particular secondary node 112, the switches SW at that secondary node can be configured, based on the received control signals CNT, to supply the desired data, but block data not intended for that node. In some implementations, at least some of the switches (e.g., SW-0 to SW-8, as shown in FIG. 7A) can be omitted, such that data stream are output directly from the Rx DSP 750.

Figure 8:
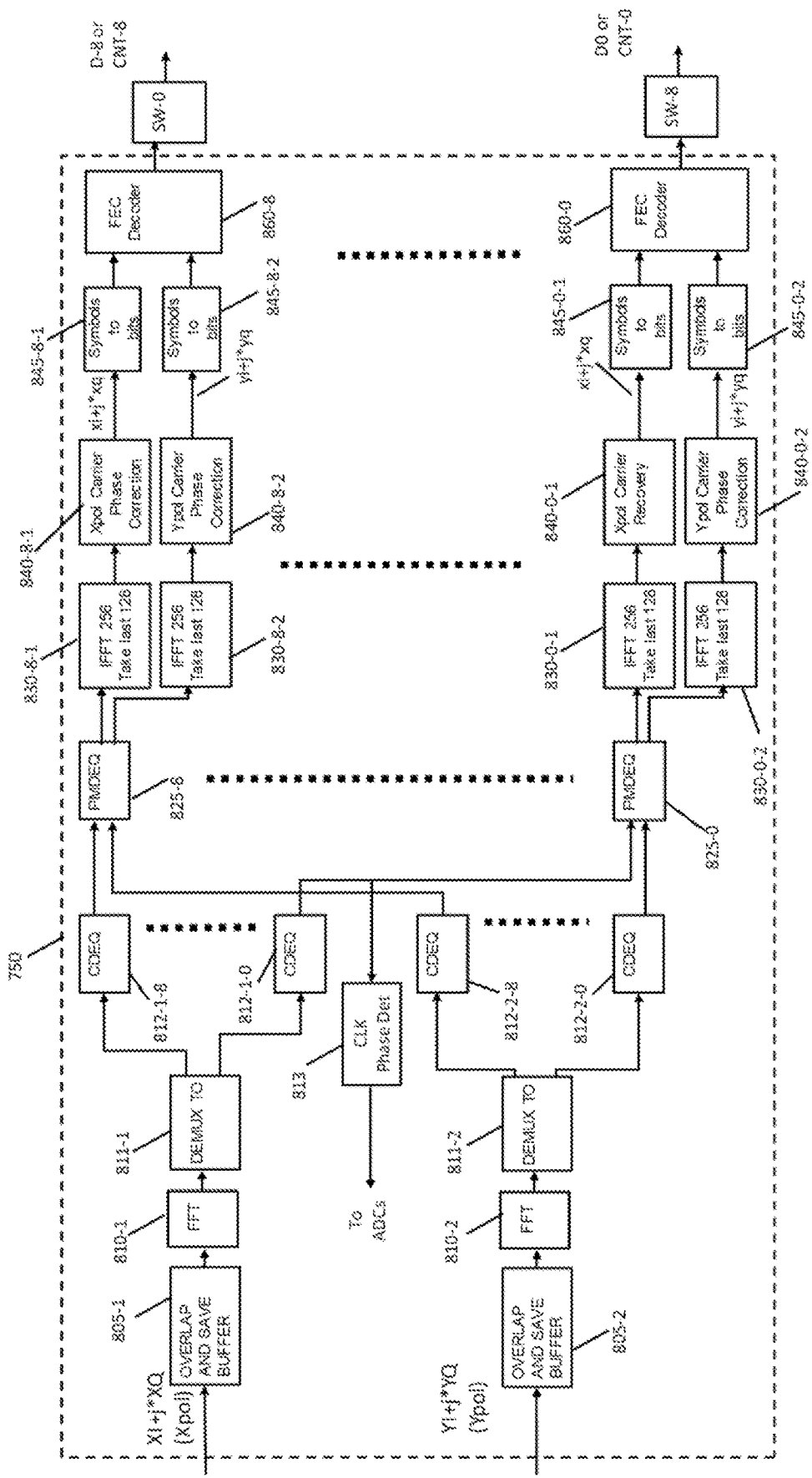
FIG. 8 shows an example of a secondary node receiver DSP.

FIG. 8 illustrates exemplary components of the receiver digital signal processor (DSP) 750. As noted above, the analog-to-digital (A/D) circuits 740-1 and 740-2 (FIG. 7A) output digital samples corresponding to the analog inputs supplied thereto. In some implementations, the samples may be supplied by each A/D circuit at a rate of 64 GSamples/s. The digital samples correspond to symbols carried by the X polarization of the optical subcarriers and may be represented by the complex number XI+jXQ. The digital samples may be provided to the overlap and save buffer 805-1, as shown in FIG. 8. The FFT component or circuit 810-1 can receive the 2048 vector elements, for example, from the overlap and save buffer 805-1 and convert the vector elements to the frequency domain using, for example, a fast Fourier transform (FFT). The FFT component 810-1 can convert the 2048 vector elements to 2048 frequency components, each of which can be stored in a register or "bin" or other memory, as a result of carrying out the FFT.

The frequency components then can be demultiplexed by the demultiplexer 811-1, and groups of such components can be supplied to a respective one of the chromatic dispersion equalizer circuits CDEQ 812-1-0 to 812-1-8, each of which may include a finite impulse response (FIR) filter that corrects, offsets or reduces the effects of, or errors associated with, chromatic dispersion of the transmitted optical subcarriers. Each of the CDEQ circuits 812-1-0 to 812-1-8 supplies an output to a corresponding polarization mode dispersion (PMD) equalizer circuit 825-0 to 825-8 (which individually or collectively may be referred to as PMB equalizer circuits 825).

Digital samples output from the A/D circuits 840-2 associated with Y polarization components of optical subcarrier SC1 can be processed in a similar manner to that of digital samples output from the A/D circuits 840-1 and associated with the X polarization component of each optical subcarrier. In particular, the overlap and save buffer 805-2, the FFT 810-2, the demultiplexer 811-2, and the CDEQ circuits 812-2-0 to 812-2-8 can have a similar structure and operate in a similar fashion as the buffer 805-1, the FFT 810-1, the demultiplexer 811-1, and the CDEQ circuits 812-1-0 to 812-1-8, respectively. For example, each of the CDEQ circuits 812-2-0 to 812-8 can include an FIR filter that corrects, offsets, or reduces the effects of, or errors associated with, chromatic dispersion of the transmitted optical subcarriers. In addition, each of the CDEQ circuits 812-2-0 to 812-2-8 provide an output to a corresponding one of the PMDEQ 825-0 to 825-8.

As further shown in FIG. 8, the output of one of the CDEQ circuits, such as the CDEQ 812-1-0 can be supplied to a clock phase detector circuit 813 to determine a clock phase or clock timing associated with the received subcarriers. Such phase or timing information or data can be supplied to the ADCs 740-1 and 740-2 to adjust or control the timing of the digital samples output from the ADCs 740-1 and 740-2.

Each of the PMDEQ circuits 825 can include another FIR filter that corrects, offsets or reduces the effects of, or errors associated with, PMD of the transmitted optical subcarriers. Each of the PMDEQ circuits 825 can supply a first output to a respective one of the IFFT components or circuits 830-0-1 to 830-8-1 and a second output to a respective one of the IFFT components or circuits 830-0-2 to 830-8-2, each of which can convert a 256-element vector, in this example, back to the time domain as 256 samples in accordance with, for example, an inverse fast Fourier transform (IFFT).

Time domain signals or data output from the IFFT 830-0-1 to 830-8-1 are supplied to a corresponding one of the Xpol carrier phase correction circuits 840-1-1 to 840-8-1, which can apply carrier recovery techniques to compensate for the X polarization transmitter (e.g., the laser 508) and the receiver (e.g., the local oscillator laser 710) linewidths. In some implementations, each carrier phase correction circuit 840-1 to 840-8-1 can compensate or correct for frequency and/or phase differences between the X polarization of the transmit signal and the X polarization of light from the local oscillator 700 based on an output of the Xpol carrier recovery circuit 840-0-1, which performs carrier recovery in connection with one of the optical subcarriers based on the outputs of the IFFT 830-01. After such X polarization carrier phase correction, the data associated with the X polarization component may be represented as symbols having the complex representation xi+j*xq in a constellation, such as a QPSK constellation or a constellation associated with another modulation formation, such as an m-quadrature amplitude modulation (QAM), m being an integer. In some implementations, the taps of the FIR filter included in one or more of the PMDEQ circuits 825 can be updated based on the output of at least one of the carrier phase correction circuits 840-0-1 to 840-8-01.

In a similar manner, time domain signals or data output from the IFFT 830-0-2 to 830-8-2 are supplied to a corresponding one of the Ypol carrier phase correction circuits 840-0-2 to 840-8-2, which may compensate or correct for the Y polarization transmitter (e.g., the laser 508) and the receiver (e.g., the local oscillator laser 710) linewidths. In some implementations, each carrier phase correction circuit 840-0-2 to 840-8-2 also can correct or compensate for frequency and/or phase differences between the Y polarization of the transmit signal and the Y polarization of light from the local oscillator 710. After such Y polarization carrier phase correction, the data associated with the Y polarization component can be represented as symbols having the complex representation yi+j*yq in a constellation, such as a QPSK constellation or a constellation associated with another modulation formation, such as an m-quadrature amplitude modulation (QAM), m being an integer. In some implementations, the output of one of the circuits 840-0-2 to 840-8-2 can be used to update the taps of the FIR filter included in one or more of the PMDEQ circuits 825 instead of, or in addition to, the output of at least one of the carrier recovery circuits 840-0-1 to 840-8-1.

As further shown in FIG. 8, the output of carrier recovery circuits (e.g., the carrier recovery circuit 840-0-1) also can be supplied to the carrier phase correction circuits 840-1-1 to 840-8-1 and 840-0-2 to 840-8-2, whereby the phase correction circuits can determine or calculate a corrected carrier phase associated with each of the received optical subcarriers based on one of the recovered carriers, instead of providing multiple carrier recovery circuits, each of which is associated with a corresponding optical subcarrier. The equalizer, carrier recovery, and clock recovery can be further enhanced by utilizing the known (training) bits that may be included in control signals CNT, for example by providing an absolute phase reference between the transmitted and local oscillator lasers.

Each of the symbols-to-bits circuits or components 845-0-1 to 845-8-1 can receive the symbols output from a corresponding one of the circuits 840-0-1 to 840-8-1 and map the symbols back to bits. For example, each of the symbol-to-bits components 845-0-1 to 845-8-1 can map one X polarization symbol, in a QPSK or m-QAM constellation, to Z bits, where Z is an integer. For dual-polarization QPSK modulated subcarriers, Z is four. Bits output from each of the components 845-0-1 to 845-8-1 are provided to a corresponding one of the FEC decoder circuits 860-0 to 860-8.

Y polarization symbols are output form a respective one of the circuits 840-0-2 to 840-8-2, each of which has the complex representation yi+j*yq associated with data carried by the Y polarization component. Each Y polarization, like the X polarization symbols noted above, can be provided to a corresponding one of the bit-to-symbol circuits or components 845-0-2 to 845-8-2, each of which has a similar structure and operates in a similar manner as the symbols-to-bits components 845-0-1 to 845-8-1. Each of the circuits 845-0-2 to 845-8-2 can provide an output to a corresponding one of the FEC decoder circuits 860-0 to 860-8.

Each of the FEC decoder circuits 860 can remove errors in the outputs of the symbol-to-bit circuits 845 using, for example, forward error correction. Such error corrected bits, which can include user data for output from the secondary nodes 112, can be supplied to a corresponding one of the switch circuits SW-0 to SW-8. As noted above, the switch circuits SW-0 to SW-8 in each secondary node 112 can selectively supply or block data based on whether such data is intended to be output from the secondary node. In addition, if one of the received optical subcarriers' control information (CNT), such as information identifying the switches SW that output data and other switches SW that block data, the control information may be output from one of the switches and, based on such control information, the control circuit 771 in the secondary nodes to generate the control signals CNT.

In some implementations, data can be blocked from output from the DSP 750 without the use of the switches SW-0 to SW-8. As an example, zero (0) or other predetermined values can be stored in frequency bins associated with the blocked data, as well as the optical subcarrier corresponding to the blocked data. Further, as described above, processing of such zeroes or predetermined data by circuitry in the DSP 750 will result in null or zero data outputs, for example, from a corresponding one of the FEC decoders 860. The switch circuits provided at the outputs of the FFTs 810-1 and 810-2, like the switch circuits SW described above in FIG. 6B, can be provided to selectively insert zeroes or predetermined values for selectively blocking corresponding output data from the DSP 750. Such switches also can be provided at the output of or within the demultiplexers 811-1 and 811-2 to selectively supply zero or predetermined values.

In another example, zeroes (0s) can be inserted in the chromatic dispersion equalizer (CDEQ) circuits 812 associated with both the X and Y polarization components of each optical subcarrier. In particular, multiplier circuits (provided in corresponding butterfly filter circuits), like multiplier circuits M described above, can selectively multiply the inputs to the CDEQ circuit 812 by either zero or a desired coefficient. As discussed above in connection with FIG. 6C, multiplication by a zero generates a zero product. When such zero products are further processed by corresponding circuitry in the DSP 750 (e.g., corresponding IFFTs 1230, carrier phase correction components 840, symbol-to-bits components 845, and FEC decoder), a corresponding output of the DSP 750 will also be zero. Accordingly, data associated with an optical subcarrier received by a secondary node receiver 112, but not intended for output from that receiver, can be blocked.

However, if capacity requirements change and such previously blocked data is to be output from a given secondary node receiver DSP 750, appropriate coefficients can be supplied to the multiplier circuits, such that at least some of the inputs thereto are not multiplied by zero. Upon further processing, as noted above, data associated with the inputs to the multiplier circuits and corresponding to a particular optical subcarrier is output from secondary node receiver DSP 750.

While FIG. 8 shows the DSP 750 as including a particular number and arrangement of functional components, in some implementations, the DSP 750 can include additional functional components, fewer functional components, different functional components, or differently arranged functional components.

In some implementations, a node (e.g., a primary node 110, as described above) can transmit data to multiple other nodes (e.g., multiple secondary nodes 112, as described above) concurrently, such that similar data is "multicast" to multiple nodes at the same time. Upon receipt of the data, each of the nodes can selectively retain one or more portions of the data (e.g., the portions of the data that are intended for the node) and discard one or more other portions of the data (e.g., the portions of the data that are intended for other nodes). In some implementations, data can be transmitted as one or more optical carriers (e.g., as described above).

Further, as described above, at least some of the secondary nodes 112 can include components that have different (e.g., lower) capabilities than the components included in primary node 110. For example, the bandwidth or the data capacity of at least some of the secondary nodes 112 can be less than that associated with the primary node 110, such that the capacity associated with each of those secondary nodes 112 is less than that of the primary node 110. Accordingly, the primary node 100 can transmit data to each of those secondary nodes 112 according to a higher bit rate (e.g., using a higher capacity transceiver), and each of those secondary nodes 112 can transmit data to the primary node 110 according to a lower bit rate (e.g., using a lower capacity transceiver). Accordingly, downstream data (e.g., from the primary node 100 to the secondary nodes 112) is transmitted according to a larger pooled allocation of bandwidth, whereas upstream data (e.g., from each of the secondary nodes 112 to the primary node 110) is transmitted according to respective smaller dedicated allocations of bandwidth.

Figure 9B:
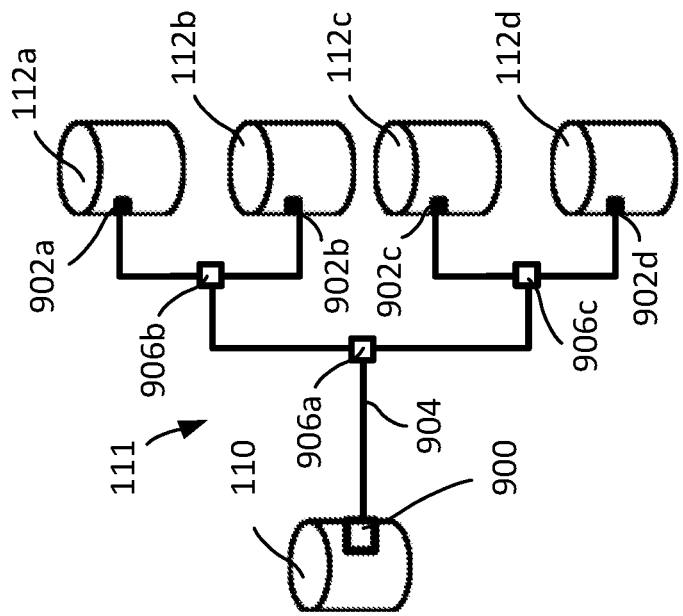
FIGS. 9A and 9B show example interconnections between a primary node and multiple secondary nodes.
Figure 9A:
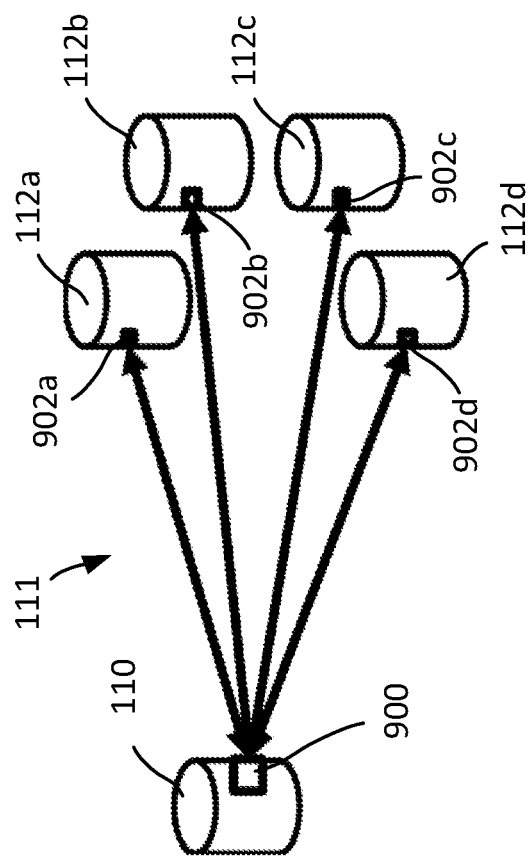

As an example, FIG. 9A shows a primary node 110 interconnected to multiple secondary nodes 112a-112d via respective optical communication paths 111. The primary node 110 includes a transceiver 900 having a first capacity (e.g., capable of transmitting data according to a first bit rate or bandwidth). Each of the secondary nodes 112a-112d includes a respective transceiver 902a-902d having a second capacity (e.g., capable of transmitting data according to a second bit rate or bandwidth). In some implementations, the transceivers 900 and 902a-902d can be implemented in a similar manner as the transmitters 202 and 302 and/or the receivers 204 and 304 described above.

The transceiver 900 has a higher capacity than that of each of the transceivers 902a-902d. As an example, the transceiver 900 can transmit data to each of the transceivers 902a-902d concurrently at a bit rate of 100 Gbit/s (e.g., multicast data at a bit rate of 100 Gbit/s), whereas each of the transceivers 902a-902d can transmit data at a bit rate of 25 Gbit/s. Upon receipt of the data, each of the second nodes 902a-902d can selectively retain one or more portions of the data (e.g., the portions of the data that are intended for that secondary node) and discard one or more other portions of the data (e.g., the portions of the data that are intended for other secondary nodes).

The optical communication paths 111 can be similar to those described above (e.g., with respect to FIGS. 1 and 2). For instance, each of the optical communication paths 111 can include one or more segments of optical fiber, optical switches, optical amplifiers, reconfigurable add-drop multiplexers (ROADMs), and/or other optical fiber communication equipment. As an illustrative example, FIG. 9B shows example physical interconnections between the primary node 110 and the secondary nodes 112a-112d via the optical communication paths 111. The optical communication paths 111 includes several lengths of optical fiber 904, and several optical splitters 906a-906c. The optical fiber carries optical signals from the primary node 110 to an input of the first optical splitter 906a, which splits the optical signal into two respective lengths of optical fiber at its output. In turn, each optical signal is further split by the second optical splitter 906b or the third optical splitter 906c (e.g., according to a nested or "tree" topology). Accordingly, the original optical signal output from the primary node 110 is ultimately split into four optical signals, each of which is delivered to a respective one of the secondary nodes 112a-112d. Although an example network topology is shown and described, this is merely an illustrative example. In practice, other network topologies are also possible, depending on the implementation.

In some implementations, one node can transmit data to and receive data from another node using multiple different links. As an example, FIG. 10A shows a first node 1000a and a second node 1000b. The first node 1000a includes two respective transceivers 1002a and 1002b, and the second node 1000b includes two respective transceivers 1004a and 1004b. In some implementations, the transceivers 1002a, 1002b, 1004a, and 1004b can be implemented in a similar manner as the transmitters 202 and 302 and/or the receivers 204 and 304 described above.

The transceivers 1002a and 1004a have a higher capacity than that of the transceivers 1002b and 1004b. As an example, the transceivers 1002a and 1004a can transmit data to the transceivers 1002b and 1004b, respectively, according to a first bit rate (e.g., 100 Gbit/s), and the transceivers 1002b and 1004b can transmit data according to a second bit rate less than the first bit rate (e.g., 50 Gbit/s). Accordingly, data can be transmitted from the transceiver 1002a to the transceiver 1004b according to a larger pooled allocation of bandwidth (e.g., 100 Gbit/s, which can be shared among multiple recipient nodes through multicasting), and data can be transmitted from the transceiver 1002b to the transceiver 1004a according to a smaller dedicated allocation of bandwidth (e.g., 50 Gbit/s).

As described above, in some implementations, one node can transmit data to and receive data from multiple other nodes concurrently. As an example, FIG. 10B shows three nodes 1006a-1006c. The first node 1006a includes three respective transceivers 1008a-1008c, the secondary node 1006b includes two respective transceivers 1010a and 1010b, and the third node 1006c includes two respective transceivers 1012a and 1012b. In some implementations, the transceivers 1008a, 1008b, 1010a, 1010b, 1012a, and 1012b can be implemented in a similar manner as the transmitters 202 and 302 and/or the receivers 204 and 304 described above.

The transceivers 1008a, 1010a, and 1012a have a higher capacity than that of the transceivers 1008b, 1008c, 1010b, and 1012b. As an example, the transceivers 1008a, 1010a, and 1012a can transmit data according to a first bit rate (e.g., 100 Gbit/s), and the transceivers 1008b, 1008c, 1010b, and 1012b can transmit data according to a second bit rate less than the first bit rate (e.g., 50 Gbit/s). Further, each of the transceivers 1008a, 1010a, and 1012a can multicast data to multiple other transceivers concurrently. Accordingly, the node 1006a is interconnected to each of the other nodes 1006b and 1006c via two respective links. For each link, data is transmitted in a downstream direction (e.g., from a high capacity transceiver to a low capacity transceiver(s)) according to a larger pooled allocation of bandwidth (e.g., 100 Gbit/s, which can be shared among multiple recipient nodes through multicasting), and data is transmitted in the upstream direction according to a smaller dedicated allocation of bandwidth (e.g., 50 Gbit/s).

In some implementations, data can be multicast in two multiple transceivers in a single node. As an example, FIG. 10C shows two nodes 1014a and 1014b. The first node 1014a includes three respective transceivers 1016a-1016c, the second node 1014b includes three respective transceivers 1018a-1018c. In some implementations, the transceivers 1016a-1016c and 1018a-1018c can be implemented in a similar manner as the transmitters 202 and 302 and/or the receivers 204 and 304 described above.

The transceivers 1016a and 1018a have a higher capacity than that of the transceivers 1016b, 1016c, 1018b, and 1018c. As an example, the transceivers 1016a and 1018a can transmit data according to a first bit rate (e.g., 100 Gbit/s), and the transceivers 1016b, 1016c, 1018b, and 1018c can transmit data according to a second bit rate less than the first bit rate (e.g., 50 Gbit/s). Further, each of the transceivers 1016a and 1018a can multicast data to multiple other transceivers concurrently. Accordingly, the nodes 1014a and 1014b are interconnected to each other via three links. For each link, data is transmitted in a downstream direction (e.g., from a high capacity transceiver to a low capacity transceiver(s)) according to a larger pooled allocation of bandwidth (e.g., 100 Gbit/s, which is shared between two destination transceivers nodes through multicasting), and data is transmitted in the upstream direction according to a smaller dedicated allocation of bandwidth (e.g., 50 Gbit/s).

As another example, FIG. 10D shows three nodes 1020a-1020c. The first node 1020a includes five respective transceivers 1022a-1022e, the second node 1020b includes three respective transceivers 1024a-1024c, and the third node 1020c includes three respective transceivers 1026a-10246. In some implementations, the transceivers 1022a-1022e, 1024a-1024c, and 1026a-1024c can be implemented in a similar manner as the transmitters 202 and 302 and/or the receivers 204 and 304 described above.

The transceivers 1022a, 1024a, and 1026a have a higher capacity than that of the transceivers 1022b-1022e, 1024b, 1024c, 1026b, and 1024c. As an example, the transceivers 1022a, 1024a, and 1026a can transmit data according to a first bit rate (e.g., 100 Gbit/s), and the transceivers 1022b-1022e, 1024b, 1024c, 1026b, and 1024c can transmit data according to a second bit rate less than the first bit rate (e.g., 50 Gbit/s). Further, each of the transceivers 1022a, 1024a, and 1026a can multicast data to multiple other transceivers concurrently. Accordingly, the node 1020a is interconnected with each of the nodes 1020b and 1020c via three respective links. For each link, data is transmitted in a downstream direction (e.g., from a high capacity transceiver to a low capacity transceiver(s)) according to a larger pooled allocation of bandwidth (e.g., 100 Gbit/s, which is shared between two destination transceivers nodes through multicasting), and data is transmitted in the upstream direction according to a smaller dedicated allocation of bandwidth (e.g., 50 Gbit/s).

Figure 11:
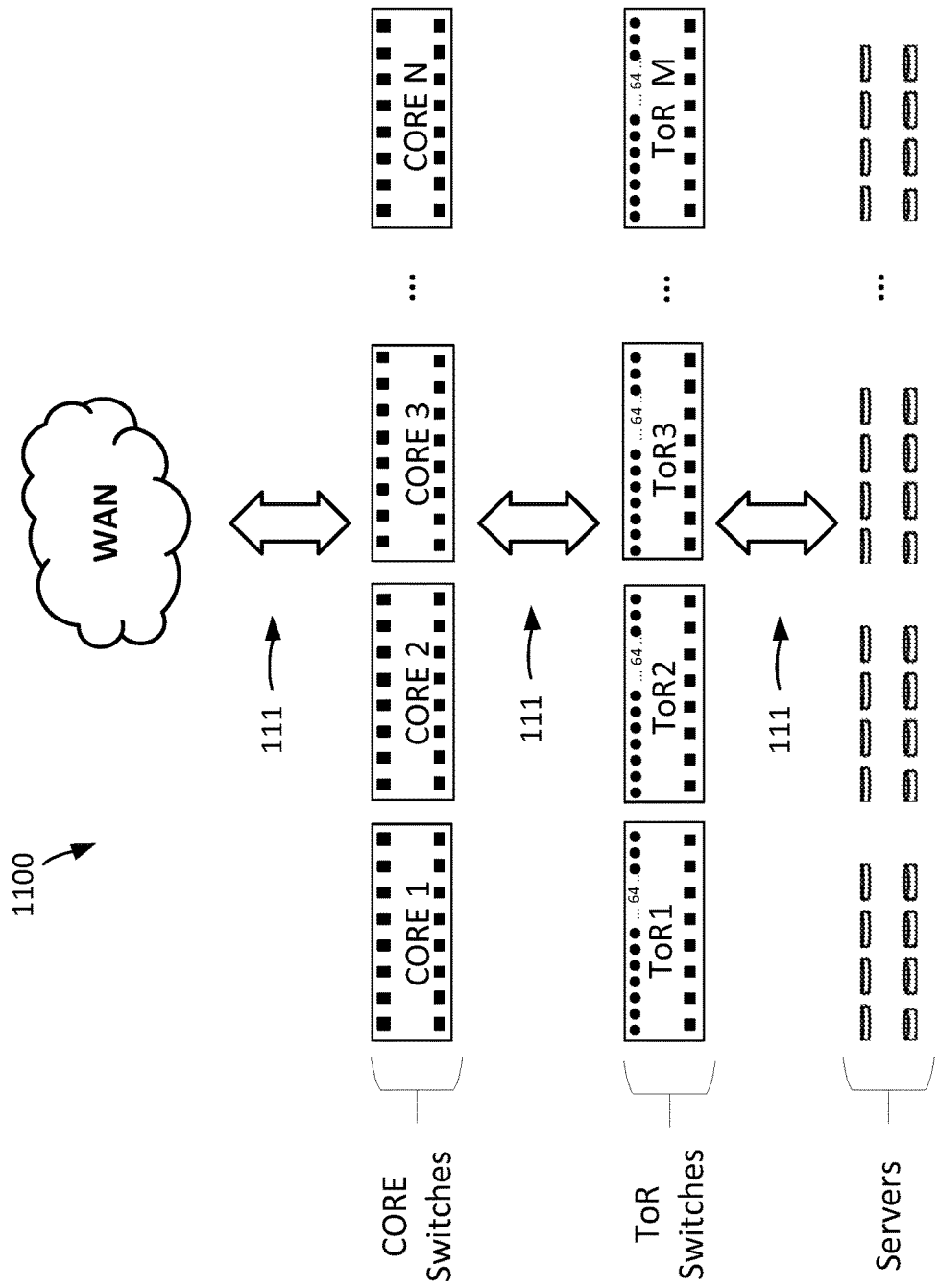
FIG. 11 shows an example system for routing data in a datacenter.

One or more of the features described herein can be implemented, for example, in a datacenter environment. As an example, FIG. 11 shows a system 1100 for routing data in a datacenter. The system 1100 includes N core switches CORE 1 to CORE N forming the backbone of a communications network. Further, the system 1100 includes M top of rack (ToR) switches ToR 1 to ToR M interconnected with the core switches CORE 1 to CORE via respective optical communication paths 111, forming the edges or "top" of the communications network. Further, system includes several server computers interconnected with the ToR switches ToR 1 to ToR M via respective optical communication paths 111. In some implementations, the system 1100 can be, at least in part, a local area network (LAN), such as an Ethernet LAN.

During operation of the system 1100, the core switches CORE 1 to CORE N receive data from a wide area network (WAN), such as the Internet, and route data to one or more of the server computers via the ToR switches ToR 1 to ToR M. Further, the server computers can communicate with one another and/or transmit data to the WAN via the ToR switches ToR 1 to ToR M and/or the core switches CORE 1 to CORE N.

The system 1100 can be implemented using one or more high capacity transceivers and one or more low capacity transceivers, in a similar manner to that described above. This enables traffic to be transmitted in certain directions according to a pooled allocation of bandwidth (e.g., shared among multiple nodes of the network to alleviate congestion), while also enabling traffic to be transmitted in certain other directions according to smaller dedicated allocations of bandwidth. Further, this enables a network to be deployed and maintained in a more cost efficient manner (e.g., compared to using solely high capacity transceivers across the entirety of the network). In some implementations, the transceivers can be implemented in a similar manner as the transceivers described above with respect to FIGS. 9 and 10A-10D.

Figure 12A:
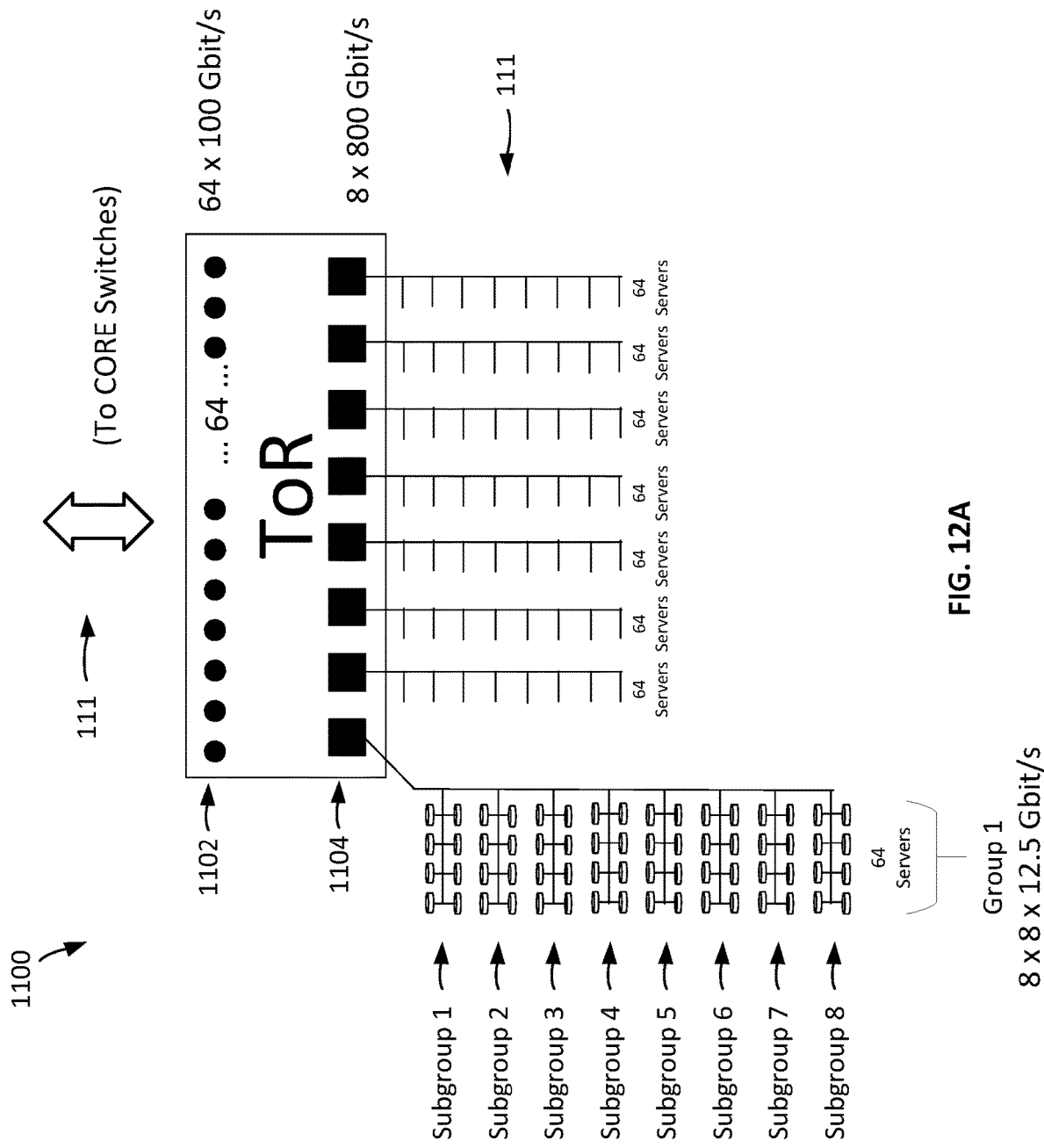
FIG. 12A shows interconnections between a top of rack (ToR) switch and multiple server computers in the system shown in FIG. 11.

To illustrate, FIG. 12A shows example interconnections between a ToR switch and the server computers in the system 1100. In this example, the ToR switch includes number of low capacity transceivers 1102 (e.g., 64) and a number of high capacity transceivers 1104 (e.g., 8). In some implementations, each of the high capacity transceivers 1104 can be configured to transmit data according to a maximum bit rate of 800 Gbit/s (e.g., using 8 groups of optical subcarriers, each having a bandwidth allocation of 100 Gbit/s). Further, the low capacity transceivers can be configured to transmit data according to a maximum bit rate of 100 Gbit/s each (e.g., using 2 groups of optical high, each having a bandwidth allocation of 50 Gbit/s). In this example, each of the high capacity transceivers 1104 is communicatively coupled to a different respective group of the server computers (e.g., groups of 64 server computers each). Further, each optical subcarrier of the high capacity transceiver 1104 is assigned to a different subgroup of the server computers (e.g., subgroups of 8 server computers each). Further, each server computer includes a respective low capacity transceiver (e.g., a transceiver capable of transmitting data according to a bit rate of 12.5 Gbit/s). For ease of illustration, the low capacity transceivers of the server computers are not shown separately in FIG. 12A.

Further, the high capacity transceivers 1104 are configured to multicast data to its respective subgroup of server computers. For example, to transmit data to one of the server computers in Subgroup 1 of Group 1, the high capacity transceiver 1104 that is coupled to Group 1 can select the optical subcarrier corresponding to Subgroup 1 (e.g., an optical subcarrier having a bandwidth allocation of 100 Gbit/s), and multicast the data to each of the server computers in Subgroup 1. Upon receiving the multicasted data, each of the server computers in Subgroup 1 examines the data to determine whether it is the intended destination for the data (e.g., by inspecting a destination data field in the data and/or determining whether the data is included in an optical subcarrier to which the server computer has been assigned). If so, the server computer retains the data. If not, the server computer discards the data. Accordingly, each of the server computers shares a common pool of allocated bandwidth (in this example, 100 Gbit/s) with other server computers when receiving data from the ToR switch.

Further, each of the server computers can transmit data to the ToR switch using its respective low capacity transceiver according to a dedicated optical subcarrier (e.g., an optical subcarrier having a bandwidth allocation of 12.5 Gbit/s). Accordingly, each of the server computers is guaranteed a particular allotment of bandwidth (in this example, 12.5 Gbit/s), regardless of the bandwidth utilized by other the server computers.

In the example shown in FIG. 12A, the ToR switch includes 8 high capacity transceivers 1104, where each high capacity transceiver 1104 is coupled to 8 groups of 64 server computers, and where each group of server computers is further divided into 8 subgroups of 8 server computers each. Further, each of the high capacity transceivers 1104 is configured to transmit data according to a maximum bit rate of 800 Gbit/s (e.g., using 8 groups of optical subcarriers, each having a bandwidth allocation of 100 Gbit/s), and the low capacity transceivers are configured to transmit data according to a maximum bit rate of 100 Gbit/s each (e.g., using 2 groups of optical high, each having a bandwidth allocation of 50 Gbit/s). However, different configurations are also possible. For example, the ToR switch can include any number of high capacity transceivers 1104, where each high capacity transceiver 1104 is coupled to any number of groups of any number of server computers, and where each group of server computers is further divided into any number of subgroups of any number of server computers each. Further, the high capacity transceivers 1104 and the low capacity transceivers can be configured to transmit data according to different maximum bit rates, using different numbers of optical subcarriers and/or different allocations of bandwidth.

Figure 12B:
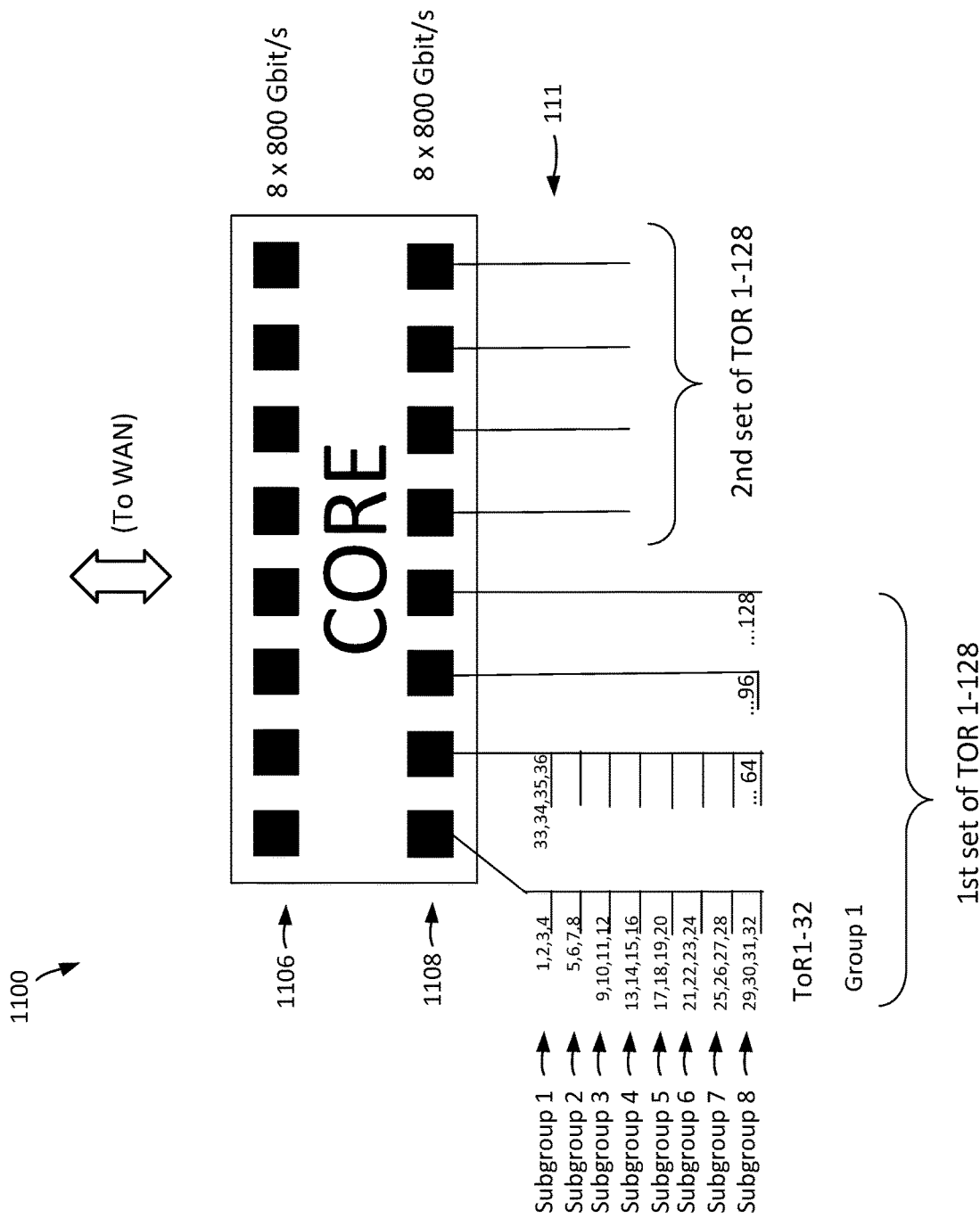
FIG. 12B shows example interconnections between a core switch and multiple ToR switches in the system shown in FIG. 11.

FIG. 12B shows example interconnections between a core switch and multiple ToR switches in the system 1100. In this example, the core switch number of first high capacity transceivers 1106 (e.g., 8) and a number of second high capacity transceivers 1108 (e.g., 8). In some implementations, each of the first and second high capacity transceivers 1108 can be configured to transmit data according to a maximum bit rate of 800 Gbit/s (e.g., using 8 groups of optical subcarriers, each having a bandwidth allocation of 100 Gbit/s).

In this example, the first high capacity transceivers 1106 are communicatively coupled to the WAN. For example, the first high capacity transceivers 1106 can be used to transmit data to the WAN from one or more of the server computers and/or the ToR switches, and to receive data from the WAN intended for one or more of the server computers and/or the ToR switches.

Further, in this example, each of the second high capacity transceivers 1108 is communicatively coupled to a different respective group of the ToR switches (e.g., groups of 32 ToR switches each) via the low capacity transceivers 1102 (e.g., as shown in FIG. 12A). Further, each optical subcarrier of the second high capacity transceiver 1108 is assigned to a different subgroup of the ToR switches (e.g., subgroups of 4 ToR switches each). Further, as described above, each ToR switch includes a respective low capacity transceiver 1102 (e.g., a transceiver capable of transmitting data according to a bit rate of 12.5 Gbit/s).

Further, two links are established between the core switch and each ToR switch. For example, the first four high capacity switches 1108 are coupled to different respective groups of the ToR switches. Further, the second four high capacity switches 1108 are also coupled to respective groups of the same ToR switches, such that two links are established between the core switch and each ToR switch.

Further, the high capacity transceivers 1108 are configured to multicast data to its respective subgroup of ToR switches. For example, to transmit data to one of the ToR switches in Subgroup 1 of Group 1, the high capacity transceivers 1108 that are coupled to Group 1 can select the optical subcarrier(s) corresponding to Subgroup 1 (e.g., optical subcarriers each having a bandwidth allocation of 100 Gbit/s), and multicast the data to each of the ToR switches in Subgroup 1. Upon receiving the multicasted data, each of the ToR switches in Subgroup 1 examines the data to determine whether it is the intended destination for the data (e.g., by inspecting a destination data field in the data and/or determining whether the data is included in an optical subcarrier to which the ToR switch has been assigned). If so, the ToR switch retains the data. If not, the ToR switch discards the data. Accordingly, each of the ToR switches shares a common pool of allocated bandwidth (in this example, 200 Gbit/s across two links) with other ToR switches when receiving data from the core switch.

Further, each of the ToR switches can transmit data to the core switch using its respective low capacity transceivers according to dedicated optical subcarrier(s) (e.g., optical subcarriers having a bandwidth allocation of 12.5 Gbit/s). Accordingly, each of the server computers is guaranteed a particular allotment of bandwidth (in this example, 25 Gbit/s across two links), regardless of the bandwidth utilized by other the server computers.

In the example shown in FIG. 12B, the core switch includes 8 high capacity transceivers 1108, where each high capacity transceiver 1108 is coupled to 4 groups of 128 ToR switches (with two links each between the core switch and each ToR switch), and where each group of ToR switches is further divided into 8 subgroups of 4 ToR switches each. Further, each of the first and second high capacity transceivers 1108 are configured to transmit data according to a maximum bit rate of 800 Gbit/s (e.g., using 8 groups of optical subcarriers, each having a bandwidth allocation of 100 Gbit/s). However, different configurations are also possible. For example, the core switch can include any number of high capacity transceivers 1108, where each high capacity transceiver 1108 is coupled to any number of groups of any number of ToR switches, and where each group of ToR switches is further divided into any number of subgroups of any number of ToR switches each. Further, the first and second high capacity 1108 can be configured to transmit data according to different maximum bit rates, using different numbers of optical subcarriers and/or different allocations of bandwidth. Further still, any number of links can be established between the core switch and each ToR switch.

In the examples shown and described with respect to FIGS. 11, 12A, and 12B, network nodes (e.g., core switches, ToR switches, and server computers) are arranged according to a nested or tree topology. For example, each core switch is coupled to one or more ToR switches, which are in turn coupled to one or more server computers. However, this need not always be the case. For instance, in some implementations, network nodes can be arranged according to a flat or mesh topology.

Figure 13:
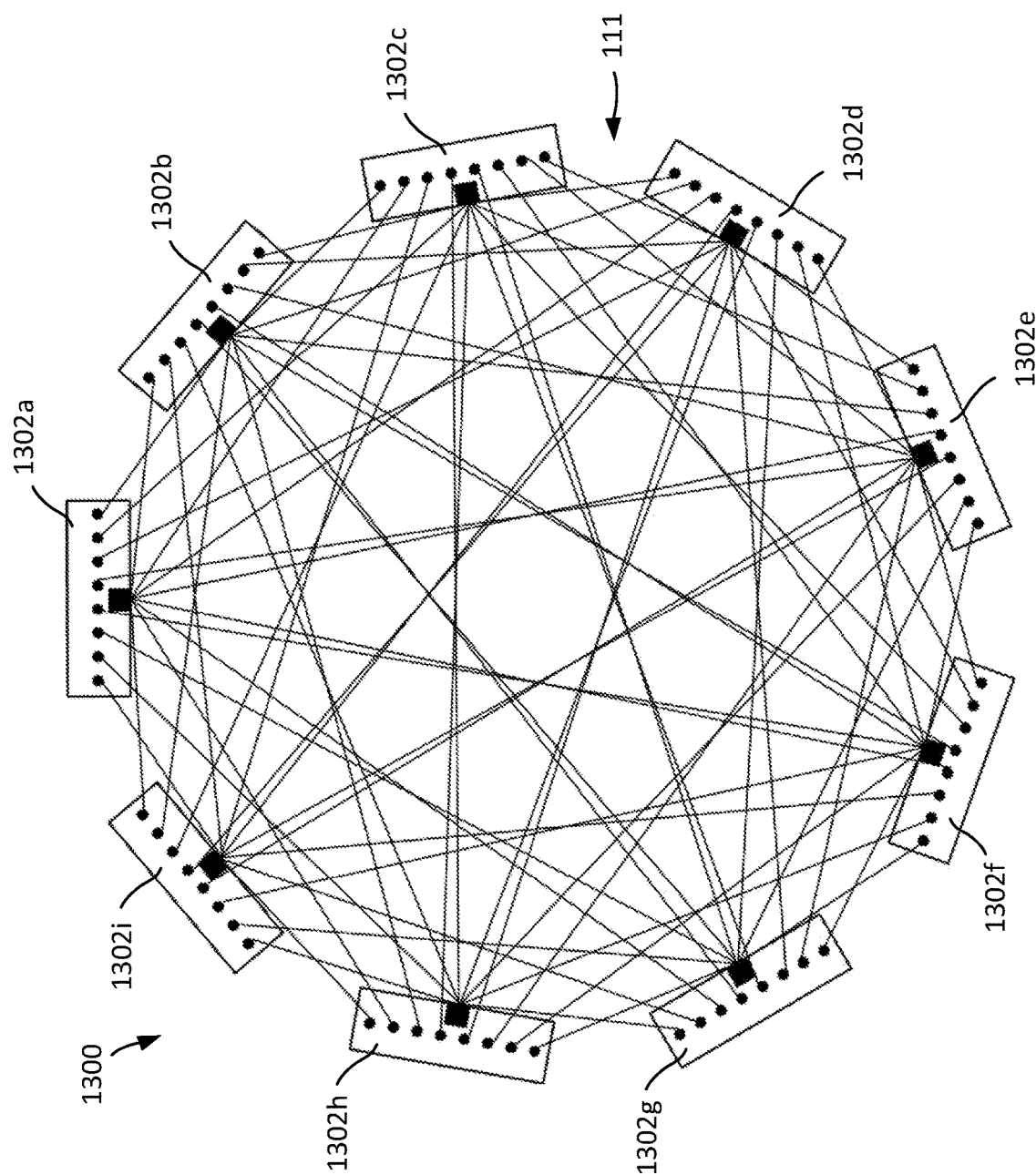
FIGS. 13-15 show example systems having a mesh topology.

As an example, FIG. 13 shows a system 1300 having a mesh topology. The system 1300 includes a number of nodes 1302a-1302i interconnected with one another via respective optical communication paths 111. In this example, each node 1302a-1302i includes a respective high capacity transceiver (represented by a square) and several respective low capacity transceivers (represented by circles). The high capacity transceivers can be configured to transmit data according to a first bit rate (e.g., 400 Gbit/s), whereas the low capacity transceivers can be configured to transmit data according to second bit rate that is lower than the first bit rate (e.g., 100 Gbit/s). In some implementations, the transceivers can be implemented in a similar manner as the transceivers described above with respect to FIGS. 9 and 10A-10D.

In this example, the high capacity transceiver of each of the nodes 1302a-1302i is coupled to a low capacity transceiver of each of the other nodes 1302a-1302i, forming a symmetric mesh topology. Further, as described above, the high capacity transceiver can multicast data to each of the low capacity transceivers to which it is coupled, such that data is transmitted in a downstream direction (e.g., from a high capacity transceiver to a low capacity transceiver(s)) according to a larger pooled allocation of bandwidth (e.g., 400 Gbit/s, which can be shared among the recipient nodes). Further, data is transmitted in the upstream direction according to a smaller dedicated allocation of bandwidth (e.g., 100 Gbit/s).

As an example, the node 1302a can transmit data to the node 1302b by multicasting the data to each of the nodes 1302b-1302i using its high capacity transceiver (e.g., by transmitting the data using an optical subcarrier associated with each of the nodes). Upon receiving the multicasted data in their respective low capacity transceivers, each of the nodes 1302b-1302i examines the data to determine whether it is the intended destination for the data (e.g., by inspecting a destination data field in the data and/or determining whether the data is included in an optical subcarrier to which the node has been assigned). If so, the node retains the data. If not, the node discards the data. Accordingly, each of the node shares a common pool of allocated bandwidth (in this example, 400 Gbit/s) with other nodes when receiving data.

In the example system 1300 shown in FIG. 13, the high capacity transceiver of each of the nodes 1302a-1302i is coupled to a single low capacity transceiver of each of the other nodes 1302a-1302i. However, this need not always be the case. For example, in some implementations, at least some of the high capacity transceivers can be coupled to multiple low capacity transceivers of another node.

Figure 14:
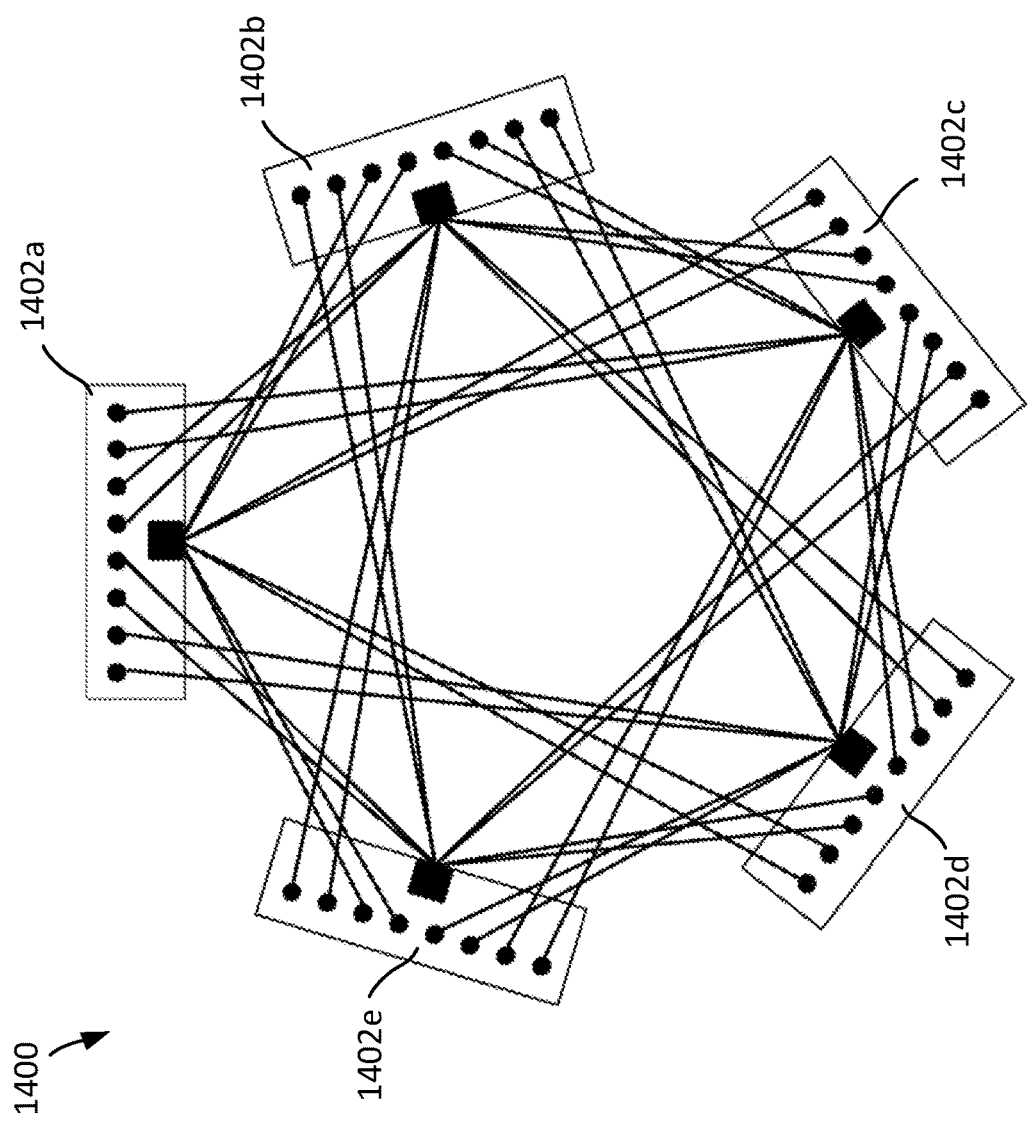

As an example, FIG. 14 shows another system 1400 having a mesh topology. The system 1400 includes a number of nodes 1402a-1402e interconnected with one another via respective optical communication paths 111. In this example, each node 1402a-1402e includes a respective high capacity transceiver (represented by a square) and several respective low capacity transceivers (represented by circles). The high capacity transceivers can be configured to transmit data according to a first bit rate (e.g., 400 Gbit/s), whereas the low capacity transceivers can be configured to transmit data according to second bit rate that is lower than the first bit rate (e.g., 100 Gbit/s). In some implementations, the transceivers can be implemented in a similar manner as the transceivers described above with respect to FIGS. 9 and 10A-10D.

In this example, the high capacity transceiver of each of the nodes 1402a-1402e is coupled to two respective low capacity transceivers of each of the other nodes 1402a-1402e, forming a symmetric mesh topology. Further, as described above, the high capacity transceiver can multicast data to each of the low capacity transceivers to which it is coupled, such that data is transmitted in a downstream direction (e.g., from a high capacity transceiver to a low capacity transceiver(s)) according to a larger pooled allocation of bandwidth (e.g., 400 Gbit/s, which can be shared among the recipient nodes). Further, data is transmitted in the upstream direction according to a smaller dedicated allocation of bandwidth (e.g., 200 Gbit/s across two different links).

In the examples shown in FIGS. 12 and 13, nodes are interconnected according to a symmetric topology (e.g., each node is interconnected with each other node in a similar manner). However, this need not always be the case. For instance, in some implementations, the nodes can be interconnected according to an asymmetric topology. For example, at least one node can be interconnected with only a subset of the other nodes, and not directly interconnected with another subset of the other nodes.

Figure 15:
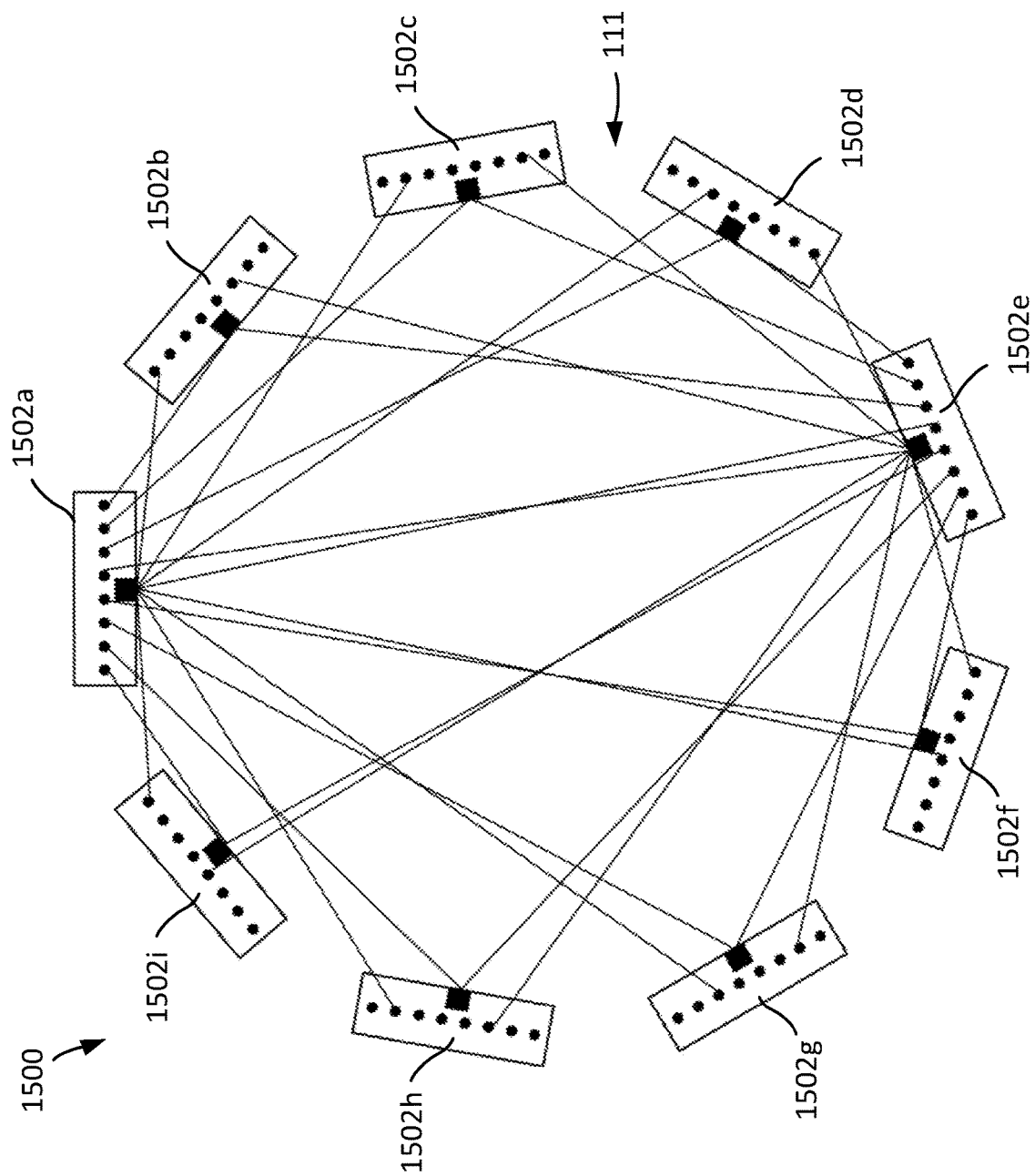

As an example, FIG. 15 shows another system 1500 having a mesh topology. The system 1500 includes a number of nodes 1502a-1502i interconnected with one another via respective optical communication paths 111. In this example, each node 1502a-1502i includes a respective high capacity transceiver (represented by a square) and several respective low capacity transceivers (represented by circles). The high capacity transceivers can be configured to transmit data according to a first bit rate (e.g., 400 Gbit/s), whereas the low capacity transceivers can be configured to transmit data according to second bit rate that is lower than the first bit rate (e.g., 100 Gbit/s). In some implementations, the transceivers can be implemented in a similar manner as the transceivers described above with respect to FIGS. 9 and 10A-10D.

In this example, the high capacity transceiver of the node 1502a is coupled to a low capacity transceiver of each of the other nodes 1502b-1502i. Similarly, the high capacity transceiver of the node 1502e is coupled to a low capacity transceiver of each of the other nodes 1502a-1502d and 1502f-1502i. However, the high capacity transceivers of the remaining nodes 1502b-1502d and 1502f-1502i are coupled to the low capacity transceivers of only a subset of the other nodes. Accordingly, the nodes of the system 1500 form an asymmetric mesh topology (e.g., the interconnections between some nodes are different from the interconnections between other nodes).

An asymmetric mesh topology may be preferable in some implementations. For example, certain nodes that transmit data to and/or receive data from a large number of other nodes (e.g., "primary" hubs) can be allocated more network resources (e.g., a greater number of links can be deployed between the node and other nodes), whereas other nodes that transmit data to and/or receive data from a fewer number of other nodes (e.g., "secondary" hubs) can be allocated fewer network resources (e.g., a fewer number of links can be deployed between the node and other nodes). Accordingly, the network can be deployed and maintained in a more cost and/or time efficient manner. Nevertheless, a symmetric mesh topology can be used in at least some implementations (e.g., when network traffic is not concentrated between a limited number of nodes).

In some implementations, an asymmetric mesh topology can be deployed based on measured network traffic between each of the nodes (e.g., network traffic transmitted using an existing communications network). One or more network links can be selectively deployed between particular nodes based on the measurements.

Figure 16A:
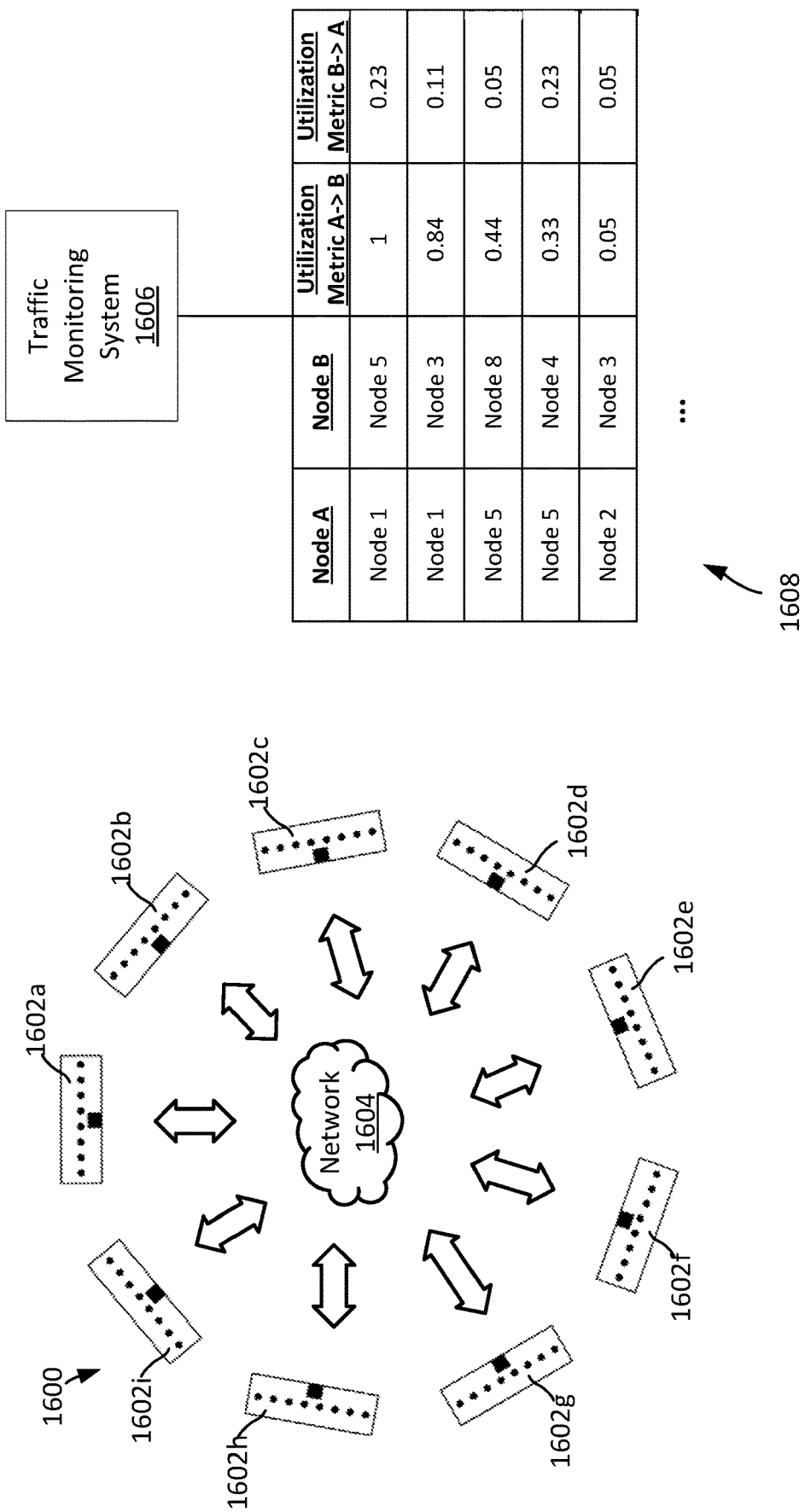
FIGS. 16A-16F show an example process for deploying a mesh network.

To illustrate, FIG. 16A shows another example system 1600 that includes a number of nodes 1602a-1602i interconnected with one another via a communications network 1604 (e.g., a network having a symmetric mesh topology, a nested or tree topology, or any other topology).

The system 1600 also includes a traffic monitoring system 1606 that is communicatively coupled to the network 1604. The traffic monitoring system 1606 measures the network traffic that is transmitted to and from each of the nodes 1602a-1602i, and generates one or more utilization metrics based on the measurements. In some implementations, the traffic monitoring system 1606 can generate utilization metrics indicating the amount of data (e.g., the data size of the network traffic) that is transmitted between nodes, the source of network traffic, the destination of network traffic, the time that data was transmitted over the network 1604, the frequency by which data is transmitted, the proportion of available network resources used in transferring the data, and/or any other information regarding the transmission of data over the network 1604.

Further, the traffic monitoring system 1606 can rank the network traffic according to the utilization metrics. For instance, a higher utilization metric could signify that a particular portion of the network traffic represents a larger proportion of the total network traffic, whereas a lower utilization metric could signify that a particular portion of the network traffic represents a smaller proportion of the total network traffic. In some implementations, network traffic can be grouped according to its source and destination, and different groups of network traffic can be ranked relative to one another.

As an example, as shown in FIG. 16A, the traffic monitoring system 1606 can generate a table 1608 ranking different groups of network traffic relative to one another. In this example, network traffic between a Node 1 (e.g., the node 1602a) and a Node 5 (e.g., the node 1602e) has been assigned a utilization metric of 1 in the direction from Node 1 to Node 5, and utilization metric of 0.23 in the direction from Node 5 to Node 1; network traffic between a Node 1 (e.g., the node 1602a) and a Node 3 (e.g., the node 1602c) has been assigned a utilization metric of 0.84 in the direction from Node 1 to Node 3, and a utilization metric of 0.11 in the direction from Node 3 to Node 1; network traffic between a Node 5 (e.g., the node 1602e) and a Node 8 (e.g., the node 1602h) has been assigned a utilization metric of 0.44 in the direction from Node 5 to Node 8, and a utilization metric of 0.05 in the direction from Node 8 to Node 5; network traffic between a Node 5 (e.g., the node 1602e) and a Node 4 (e.g., the node 1602d) has been assigned a utilization metric of 0.33 in the direction from Node 5 to Node 4 and a utilization metric of 0.23 in the direction from Node 4 to Node 5; and network traffic between a Node 2 (e.g., the node 1602b) and a Node 3 (e.g., the node 1602c) has been assigned a utilization metric of 0.05 in the direction from Node 2 to Node 3, and a utilization metric of 0.05 in the direction from Node 3 to Node 2. Utilization metrics indicating the network traffic between each of the other nodes also can be generated.

When deploying the asymmetric network, the inclusion of network links between the particular nodes can be prioritized over network links between other nodes based on the rankings. Some or all of these network links can be links between high capacity transceivers and low capacity transceivers, as described herein.

Figure 16B:
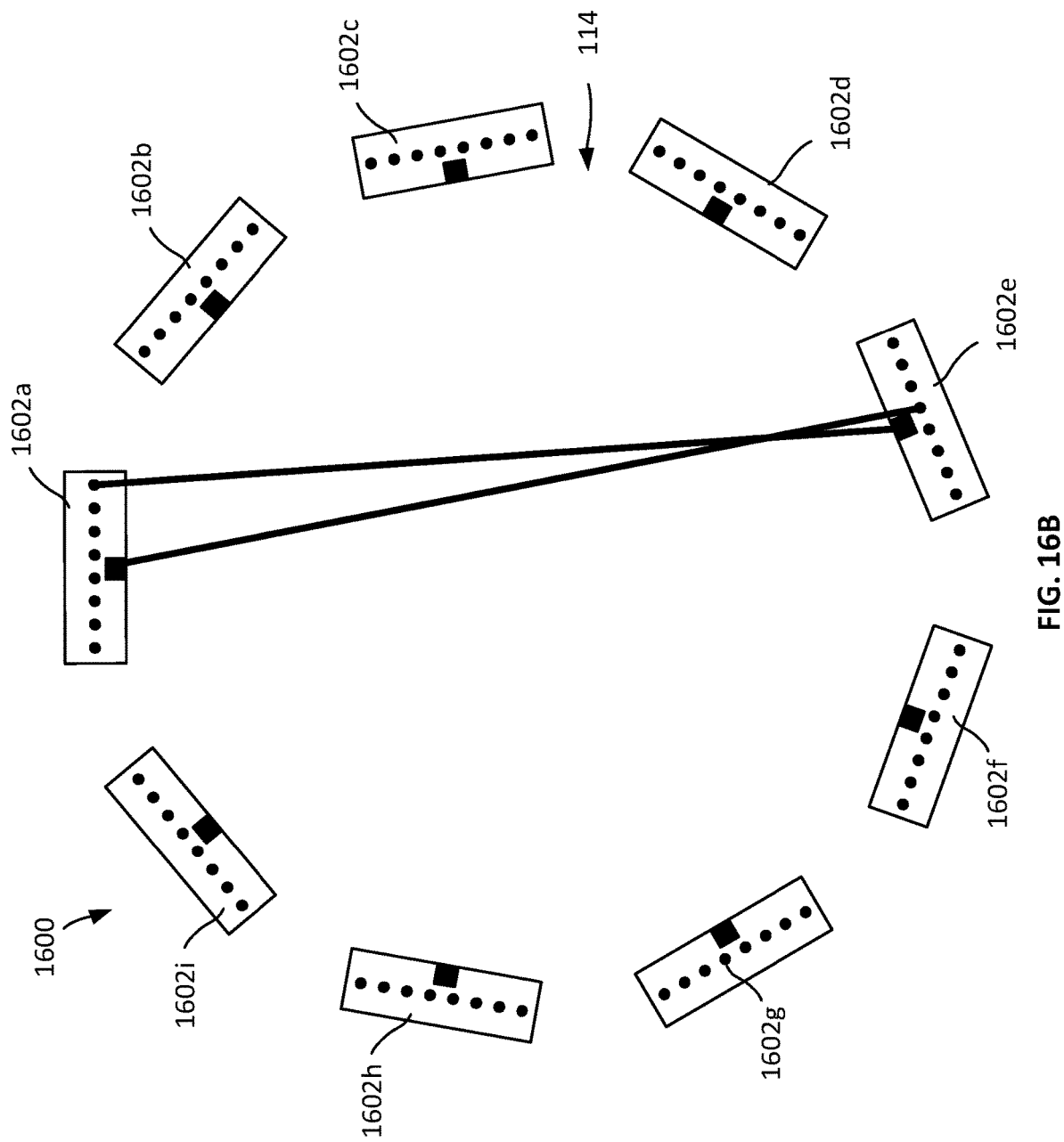

For instance, in this example, the network traffic from the Node 1 (e.g., the node 1602a) to a Node 5 (e.g., the node 1602e) has the highest ranking from among the groups of network traffic (e.g., the highest utilization metric). Accordingly, during the deployment of the asymmetric network, the inclusion of one or more network links between the node 1602a and 1602e can be prioritized over network links between other combinations of nodes. For example, as shown in FIG. 16B, a direct optical communication path 111 can be deployed from a high capacity transceiver of the node 1602a to a low capacity transceiver of the node 1602e (corresponding to the primary direction of the measured traffic). Further, another direct optical communication path 111 can be deployed from a high capacity transceiver of the node 1602e to a low capacity transceiver of the node 1602a (corresponding to the secondary direction of the measured traffic). The high capacity transceivers and low capacity transceivers can be similar to or identical to those described above.

Figure 16C:
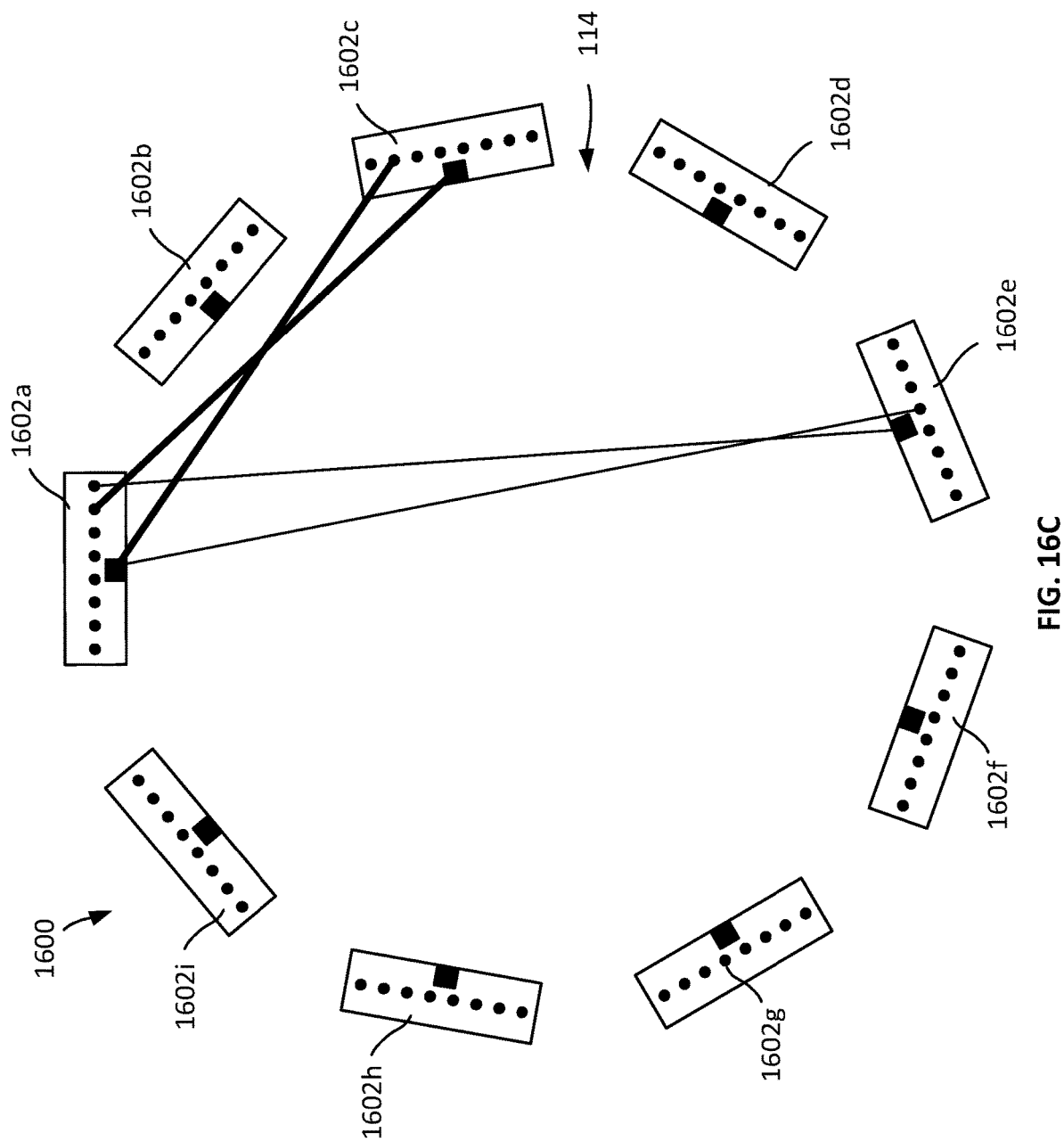

Further, the network traffic from the Node 1 (e.g., the node 1602a) to a Node 3 (e.g., the node 1602c) has the second highest ranking from among the groups of network traffic (e.g., the second highest utilization metric). Accordingly, during the deployment of the asymmetric network, the inclusion of one or more network links between the node 1602a and 1602c can have the second highest priority. For example, as shown in FIG. 16C, a direct optical communication path 111 can be deployed from a high capacity transceiver of the node 1602a to a low capacity transceiver of the node 1602c (corresponding to the primary direction of the measured traffic). Further, another direct optical communication path 111 can be deployed from a high capacity transceiver of the node 1602c to a low capacity transceiver of the node 1602a (corresponding to the secondary direction of the measured traffic).

Figure 16D:
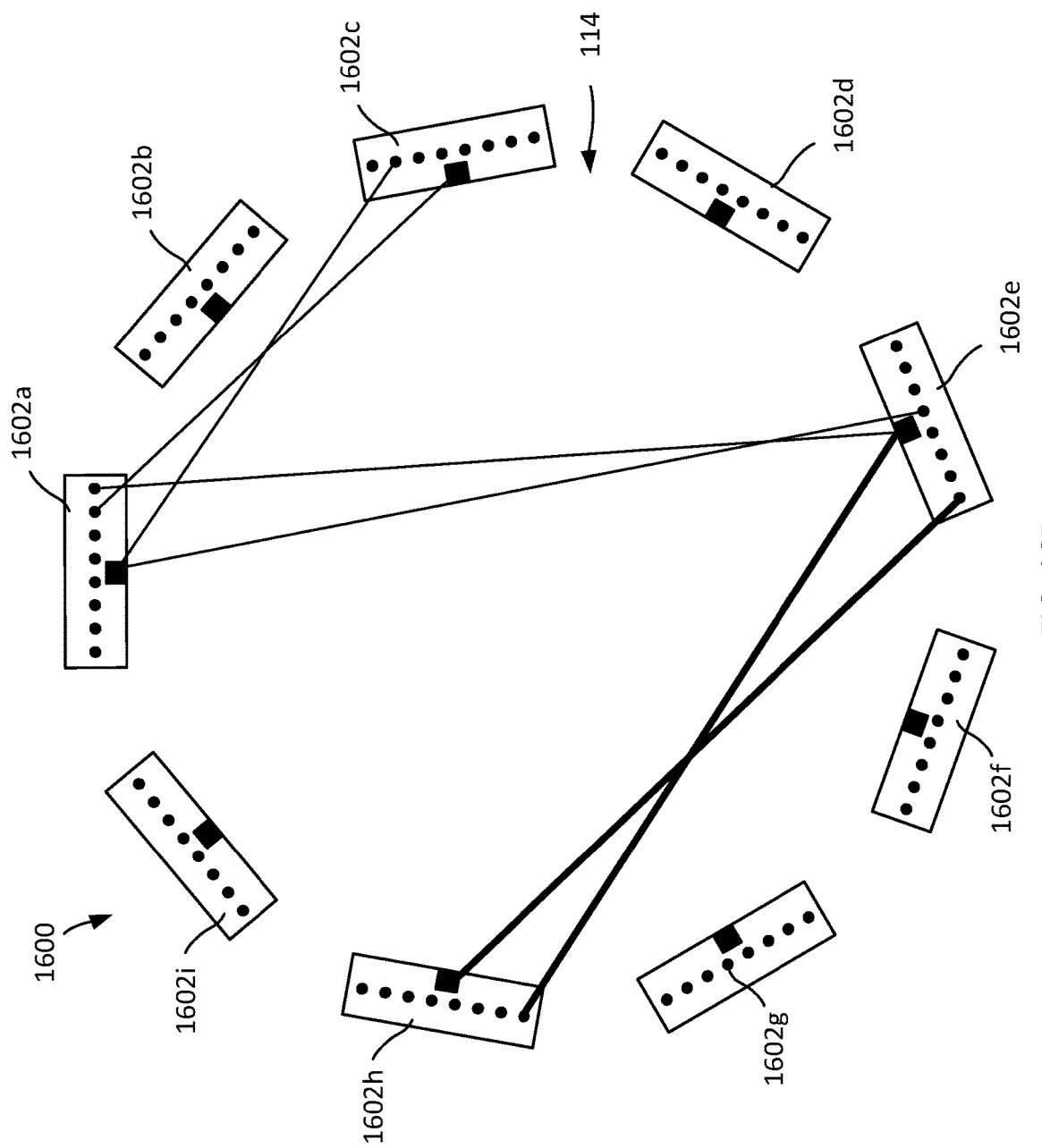

Further, the network traffic from the Node 5 (e.g., the node 1602e) to a Node 8 (e.g., the node 1602h) has the third highest ranking from among the groups of network traffic (e.g., the third highest utilization metric). Accordingly, during the deployment of the asymmetric network, the inclusion of one or more network links between the node 1602e and 1602h can have the third highest priority. For example, as shown in FIG. 16D, a direct optical communication path 111 can be deployed from a high capacity transceiver of the node 1602e to a low capacity transceiver of the node 1602h (corresponding to the primary direction of the measured traffic). Further, another direct optical communication path 111 can be deployed from a high capacity transceiver of the node 1602h to a low capacity transceiver of the node 1602e (corresponding to the secondary direction of the measured traffic).

Figure 16E:
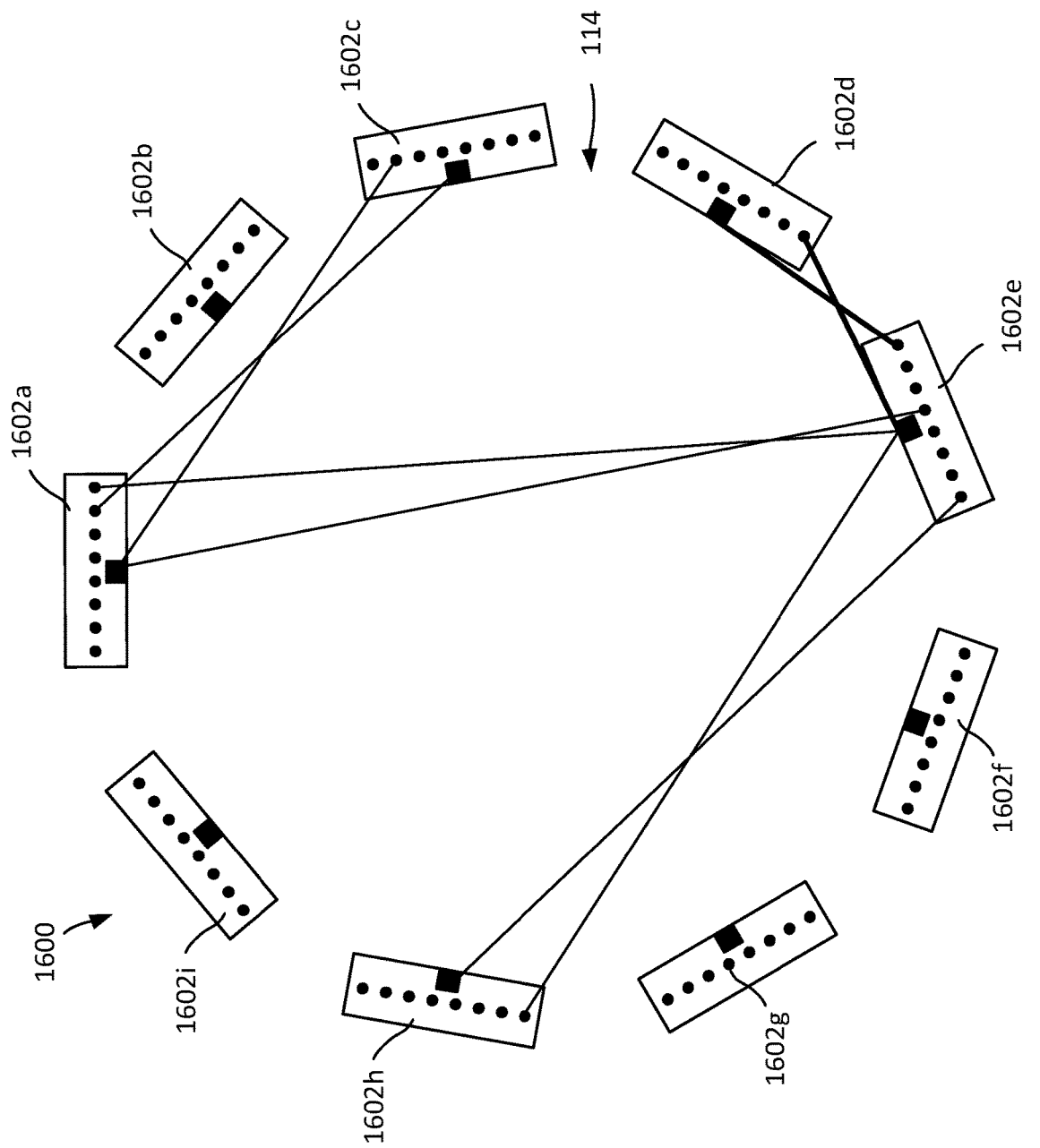

Further, the network traffic from the Node 5 (e.g., the node 1602e) to a Node 4 (e.g., the node 1602d) has the fourth highest ranking from among the groups of network traffic (e.g., the fourth highest utilization metric). Accordingly, during the deployment of the asymmetric network, the inclusion of one or more network links between the node 1602e and 1602d can have the fourth highest priority. For example, as shown in FIG. 16E, a direct optical communication path 111 can be deployed from a high capacity transceiver of the node 1602e to a low capacity transceiver of the node 1602d (corresponding to the primary direction of the measured traffic). Further, another direct optical communication path 111 can be deployed from a high capacity transceiver of the node 1602d to a low capacity transceiver of the node 1602e (corresponding to the secondary direction of the measured traffic).

Figure 16F:
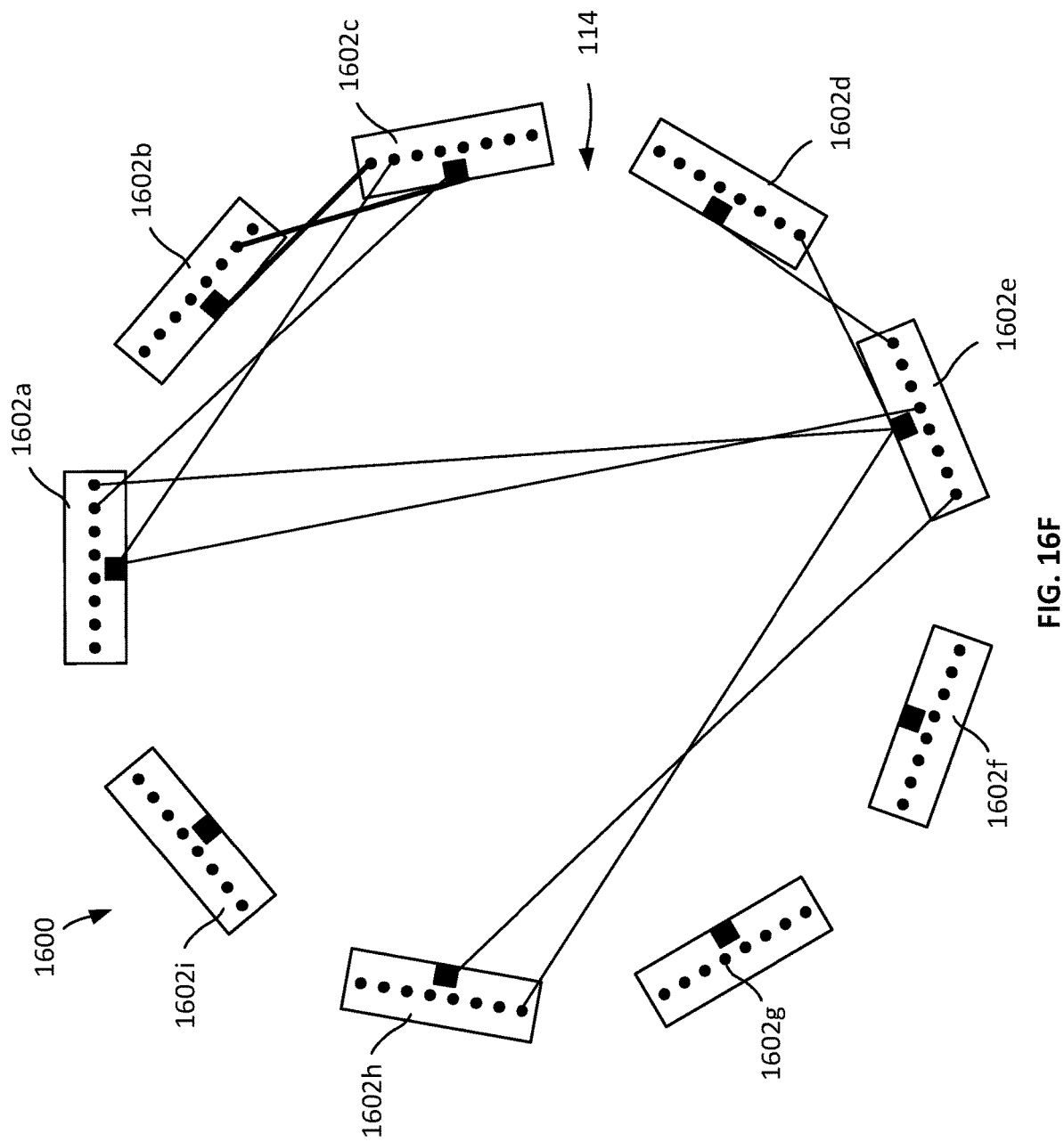

Further, the network traffic from the Node 2 (e.g., the node 1602b) to a Node 3 (e.g., the node 1602c) has the fifth highest ranking from among the groups of network traffic (e.g., the fifth highest utilization metric). Accordingly, during the deployment of the asymmetric network, the inclusion of one or more network links between the node 1602b and 1602c can have the fifth highest priority. For example, as shown in FIG. 16F, a direct optical communication path 111 can be deployed from a high capacity transceiver of the node 1602b to a low capacity transceiver of the node 1602c (corresponding to the primary direction of the measured traffic). Further, another direct optical communication path 111 can be deployed from a high capacity transceiver of the node 1602c to a low capacity transceiver of the node 1602b (corresponding to the secondary direction of the measured traffic).

This process of deploying network links can continue until one or more stop criteria are met. As an example, network links can be deployed until a certain maximum threshold number of links have been deployed. As an example, network links can be deployed until the measured traffic corresponding to the deployed network links account for a certain percentage or portion of the total network traffic. As another example, network links can be deployed until a certain amount of monetary resources are allotted or used.

In at least some implementations, some or all of the original network 1604 can be removed, decommissioned, or inactivated in favor of the asymmetric mesh network. For example, after the asymmetric mesh network has been deployed, at least a portion of the original network 1604 can be removed, decommissioned, or inactivated, and the network traffic previously transmitted using that portion can be instead transmitted using the asymmetric mesh network.

In the example process shown in FIG. 16F, a pair of network links is added for each row of the table 1608 (e.g., one link in the primary direction of the network traffic, and another link in the secondary direction of the network traffic). However, this need not always be the case. In some implementations, a single network link can be added for each row of the table 1608 (e.g., in the primary direction of the network traffic). In some implementations, by default, a single network link can be added for each row of the table 1608. However, if the network traffic in the secondary direction meets one or more criteria (e.g., the network traffic in the secondary direction exceeds a particular bit rate or bandwidth), a second network link can be additionally added in the secondary direction. This can be beneficial, for example, in reducing the time and cost associated with deploying and/or maintaining the network (e.g., as fewer network links are deployed, and deployments are more closely targeted to areas of need in the network).

As described above, data can be transmitted between nodes as one or more optical subcarriers. For instance, as described above (e.g., FIG. 4), nodes can transmit data over a transmission spectrum accommodating multiple different optical subcarriers, each having a corresponding frequency or range of frequencies. In some implementations, optical subcarriers can be generated by modulating the output of a laser (e.g., the laser 508 in FIG. 5).

Further, as described above, data can transmitted between network nodes through one or more intermediary network devices, such as network switches. For instance, a network switch can receive data from one node (e.g., a source node), and route the data to another node (e.g., a destination node). In some implementations, a network switch can receive data from a source node in the form of one or more optical subcarriers (corresponding to one or more particular frequencies or ranges of frequencies, as described above), route the data to a destination node in the form of one or more other optical subcarriers (corresponding to one or more different frequencies or ranges of frequencies, as described above). This sometimes may be referred to as "frequency translation" or "wavelength translation."

Figure 17A:
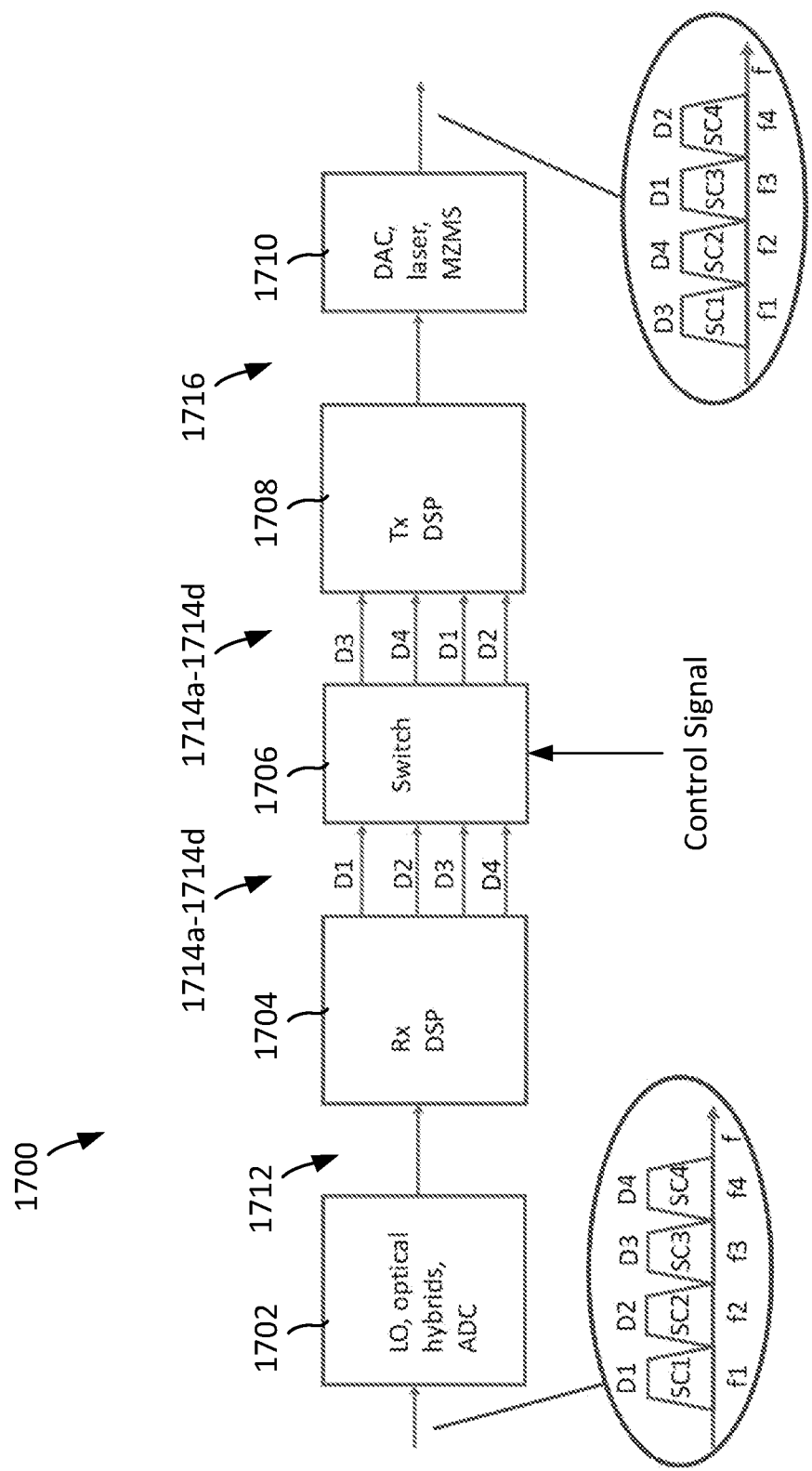
FIG. 17A shows an example system for performing frequency or wavelength translation.

To illustrate, FIG. 17A shows an example system 1700 for performing frequency or wavelength translation. The system 1700 includes first optical components 1702, a Rx DSP 1704, a switch 1706, a Tx DSP 1708, and second optical components 1710. In some implementations, the first optical components 1702 can correspond to the Rx optics and A/D block 700 (e.g., as shown in FIG. 7), the Rx DSP 1704 can correspond to the DSP 750 (e.g., as shown in FIG. 7), the Tx DSP 1708 can correspond to the DSP 502 (e.g., as shown in FIG. 5), and/or second optical components 1710 can correspond to the D/A and optics block 501 (e.g., as shown in FIG. 5). Further, the operation of one or more of the first optical components 1702, the Rx DSP 1704, the Tx DSP 1708, and the second optical components 1710 can be similar to or the same as its corresponding components, as described above.

During an example operation of the system 1700, the first optical components 1702 receive data D1-D4 in the form of a first set of optical subcarriers SC1-SC4 (e.g., analog optical signals, corresponding to one or more particular frequencies or ranges of frequencies f1 to f4, in a similar manner as described above with respect to FIG. 4). The optical components 1702 convert the first set of optical subcarriers SC1-SC4 into corresponding digital signals 1712 (e.g., a digitalized version of the first set of optical subcarriers SC1-SC4), and transmit the digital signals 1712 to the Rx DSP 1704. In some implementations, the optical components 1702 can include one or more laser oscillators (e.g., local oscillator lasers), optical hybrids, and/or analog to digital converters to facilitate converting the first set of optical subcarriers SC1-SC4 into corresponding digital signals 1712.

The Rx DSP 1704 generates individual digital signals 1714a-1714d based on the digital signals 1712, each representing one of the data D1-D4 (e.g., decoded from the optical subcarriers SC1-SC4). In some implementations, the Rx DSP 1704 can be implemented using one or more microprocessors, FPGAs, or other processor circuits.

The digital signals 1714a-1714d are input into different respective input pins of the switch 1706. In turn, the switch 1706 outputs the digital signals 1714a-1714d from its output pins, where each output pin corresponds to a different optical subcarrier that will be output from the system 1700. Further, the order of the digital signals 1714a-1714d at the input pins can be different from the order of the digital signals 1714a-1714d at the output pins. Accordingly, at least some of the data can be input according to one optical subcarrier, and can be output according to a different optical subcarrier. In some implementations, the switch 1706 can be implemented using one or more microprocessors, FPGAs, or other processor circuits.

The outputted digital signals 1714a-1714d are transmitted to the Tx DSP 1708. The Tx DSP 1708 generates a second set of optical subcarriers SC1-SC4 representing the information (e.g., by transmitting command signals 1716 to the second set of optical components 1710 specifying how the second set of optical subcarriers SC1-SC4 are to be generated). The generated second set of optical subcarriers are then output to another device (e.g., another node of a network). In some implementations, the Tx DSP 1708 can be implemented using one or more microprocessors, FPGAs, or other processor circuits to facilitate generation of the command signals. In some implementations, the second set of optical components 1710 can include on or more digital to analog converters, lasers, and/or Mach-Zehnder modulators to facilitate generation of the second set of optical subcarriers SC1-SC4.

In some implementations, the system 1700 can generate the second set of optical subcarriers SC1-SC4 based on a transmitter oscillator signal provided by a laser. In some implementations, the same laser can also be used to provide a local oscillator signal to the first optical components 1702 (e.g., to digitize the received analog signals). In some implementations, the transmitter oscillator signal and the local oscillator signal can have the same frequency. In some implementations, a single laser can provide a single laser signal to an optical splitter. The optical splitter can split the laser signal, and provide the split laser signals to the first optical components 1702 (as a local oscillator signal) and the Tx DSP 1708 (as a transmitter oscillator signal) concurrently.

In this example, the data D1-D4 is input into the system 1700 in the form of optical subcarriers SC1-SC4, respectively (corresponding to the frequencies f1-f4, respectively). However, the data D1-D4 is output from the system 1700 in the form of optical subcarriers SC3, SC4, SC1, and SC2, respectively (corresponding to the frequencies f3, f4, f1, and f2, respectively). Accordingly, at least some of the data has undergone "frequency translation" or "wavelength translation" after processing by the system 1700.

In some implementations, the switch 1706 can be dynamically reconfigured during operation, such that data is selectively output according to different optical subcarriers. For instance, the switch 1706 can receive data at each of its input pins, and route the data from each of the input pins to a different corresponding output pin (e.g., according to a mapping between the input pins and the output pins) such that data under goes a particular "frequency translation" or "wavelength translation." During operation, the switch 1706 can modify the routing such that data from at least some of the input pins is routed to a different corresponding output pin (e.g., according to a modified mapping between the input pins and the output pins). Accordingly, the data under goes a different "frequency translation" or "wavelength translation." In some implementations, the behavior of the switch 1706 can be control using a control signal (e.g., a control signal specifying the mapping between the input pins and the output pins). The control signal can be provided by a control module included or otherwise associated with the system 1700.

Frequency translation or wavelength translation can provide various technical benefits. For instance, frequency translation or wavelength translation enables nodes on a network to transmit and/or receive data according to multiple different optical subcarriers (and corresponding frequencies) as it traverses a network path from the source node to the destination node. Accordingly, different optical subcarriers can be dynamically allocated at different legs of the network path, depending on their availability. Further, the same optical subcarriers (and corresponding frequencies) can be used to transmit data between nodes in different portions of the network, without the risk of collision. Accordingly, a limited number of optical subcarriers can be deployed to multiple different portions of the network, without interfering with the transmission of data.

As an example, referring back to FIGS. 11 and 12A, a first server computer can transmit data to a second server computer via a ToR switch that interconnects them. In particular, the first server computer generate a first optical subcarrier (having a corresponding first frequency, as described above) representing the data, and transmit the first optical subcarrier to the ToR switch. The ToR switch can extract the data from the first optical subcarrier, generate a second optical subcarrier (and a corresponding second frequency) representing the data, where the second optical subcarrier is different from the first optical subcarrier (e.g., using the system 1700 shown in FIG. 17), and transmit the second optical subcarrier to the server computer. Accordingly, although the same underlying data is transmitted first from the first server computer to the ToR switch, and then from the ToR switch to the second server computer, different optical subcarriers are used for each segment of the network path.

As an example, referring to FIGS. 11, 12A, and 12B, a first server computer coupled to a first ToR switch can transmit data to a second server computer coupled to a second ToR switch via a core switch that interconnects the two ToR switches. In particular, the first server computer can generate a first optical subcarrier (and a corresponding first frequency, as described above) representing the data, and transmit the first optical subcarrier to the first ToR switch to which is it connected. The first ToR switch can extract the data from the first optical subcarrier, generate a second optical subcarrier (and a corresponding second frequency)

representing the data, where the second optical subcarrier is different from the first optical subcarrier (e.g., using the system 1700 shown in FIG. 17), and transmit the second optical subcarrier to a core switch that interconnects the first ToR switch and the second ToR switch. In turn, the core switch can extract the data from the second optical subcarrier, generate a third optical subcarrier (and a corresponding third frequency) representing the data, where the third optical subcarrier is different from the second optical subcarrier (e.g., using the system 1700 shown in FIG. 17), and transmit the third optical subcarrier to the second ToR switch. Subsequently, the second ToR switch can extract the data from the third optical subcarrier, generate a fourth optical subcarrier (and a corresponding fourth frequency) representing the data, where the fourth optical subcarrier is different from the third optical subcarrier (e.g., using the system 1700 shown in FIG. 17), and transmit the fourth optical subcarrier to the second server computer. Accordingly, although the same underlying data is transmitted first from the first server computer to the first ToR switch, then from the first ToR switch to the core switch, then from the core switch to the second ToR switch, and then from the second ToR switch to the second server computer, and then from the ToR switch to the second server computer, different optical subcarriers are used for each segment of the network path.

In some implementations, different optical subcarriers can be used for each segment of a network path. In some implementations, different optical subcarriers can be used for some segments of a network path, and similar optical subcarriers can be used for some other segments of a network path.

In the example shown in FIG. 17A, data (e.g., data D1-D4) is collectively input into the system 1700 in the form of a first set of optical subcarriers (e.g., optical subcarriers SC1-SC4), and is collectively output according to the same set of optical subcarriers. However, this need not always be the case. For instance, in some implemented, data can be collectively input into the system 1700 in the form of a first set of optical subcarriers, and can be collectively output according to a second set of optical subcarriers that differs, at least in part, from the first set of optical subcarriers. For example, the second set of optical subcarriers can include one or more frequencies that are not included in the first set of optical subcarriers.

Figure 17B:
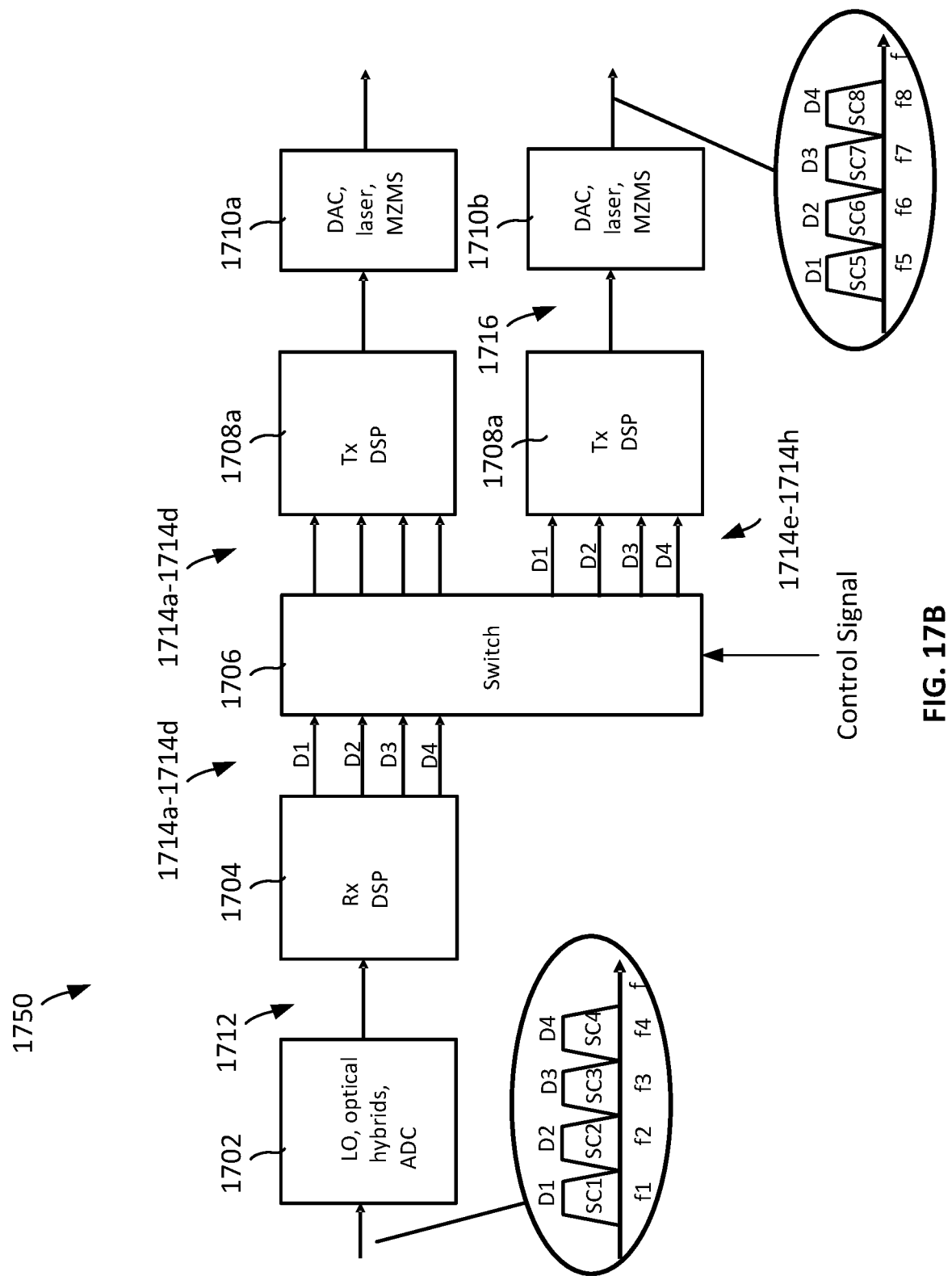
FIG. 17B shows another example system for performing frequency or wavelength translation.

To illustrate, FIG. 17B shows another example system 1750 for performing frequency or wavelength translation. The components of the system 1750 can be similar to those shown in FIG. 17A. However, in this example, the system 1750 includes two Tx DSPs 1708a and 1708b, and two second optical components 1710a and 1710b. The system 1750 can use the first Tx DSP 1708a and second optical components 1710a to output data using the same set of optical subcarriers as those that were used to input the data (e.g., by outputting digital signals 1714a-1714d to the first Tx DSP 1708a to generate the optical subcarriers SC1-SC4, in a similar manner as described above). Further, the system 1750 can use the second Tx DSP 1708b and second optical components 1710b to output data using a different set of optical subcarriers than those that were used to input the data (e.g., by outputting digital signals 1714e-1714h to the second Tx DSP 1708b to generate the optical subcarriers SC5-SC8). In some implementations, the switch 1706 also can be dynamically reconfigured during operation, such that data is selectively output according to different optical subcarriers. For instance, the switch 1706 can receive data at each of its input pins, and route the data from each of the input pins to a different corresponding output pin (e.g., according to a mapping between the input pins and the output pins) such that data under goes a particular "frequency translation" or "wavelength translation."

As described above, nodes can transmit data to one another using transceivers, where the transceiver one node (e.g., a "primary node") has as higher capacity than the transceiver of another node (e.g., a "secondary node"). For example, referring to FIGS. 9A and 9B, a data primary node 110 can include a transceiver 900 having a first capacity, and each of the secondary nodes 112a-112d can include a respective transceiver 902a-902d having a second capacity. However, this need not always be the case. For instance, in some implementations, nodes can transmit data to one another using transceivers having equal capacities. As an example, referring to FIGS. 9A and 9B, a data primary node 110 can include a transceiver 900 having a certain capacity, and each of the secondary nodes 112a-112d can include a respective transceiver 902a-902d having the same capacity as that of the transceiver 900. As another example, some or all of the transceivers described in FIGS. 10A-17B can have the same capacities as one another.

This configuration can provide certain technical benefits. As an example, a first node can use a single transceiver to multicast data to multiple second nodes concurrently (e.g., at a particular bit rate), rather than using a separate transceiver dedicated to each individual second node. Accordingly, networks can be deployed in a more cost efficient manner. Further, as each of the transceivers has the same capacity, each of the second nodes can transmit data back to the first node according to the same bit rate, but according to a dedicated allotment of bandwidth.

In some implementations, a network can include several interconnected nodes. At least some of the nodes can be interconnected via links extending between respective transceivers having equal capacities, and at least of the nodes can be interconnected via links extending between respective transceivers having different capacities. The capacity of each transceiver (and whether there is an asymmetry in capacities between interconnected transceivers) can be selected based on the expected flow of traffic between the nodes and/or based on an observed flow of traffic between the nodes.

Example Processes

Figure 18A:
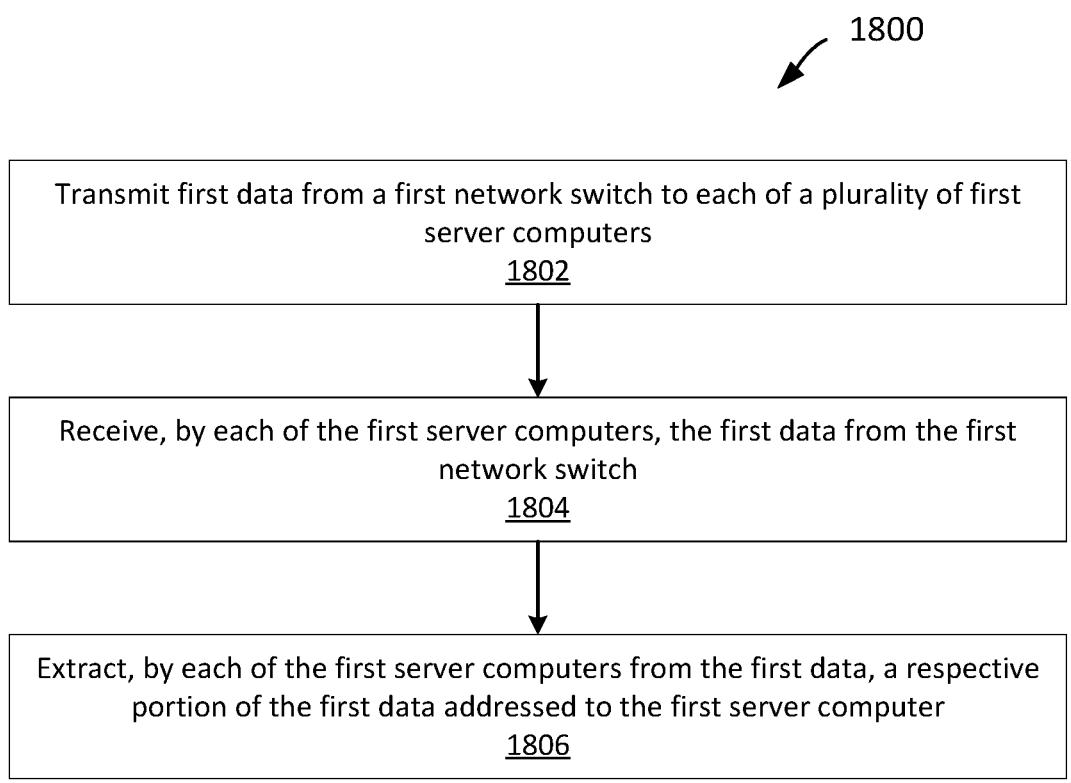
FIG. 18A is a flow diagram of an example process for transmitting data.

An example process 1800 for transmitting data is shown in FIG. 18A. In some implementations, the process 1800 can be performed by one or more of the components of the systems described herein.

According to the process 1800, first data is transmitted from a first network switch to each of a plurality of first server computers (step 1802). The first network switch includes a first transceiver. The first transceiver is configured to transmit data according to a first maximum throughput. The plurality of first server computers is communicatively coupled to the first network switch. Each first server computer includes a respective second transceiver. Each second transceiver is configured to transmit data according to a second maximum throughput. The first maximum throughput is greater than the second maximum throughput. Further, the first data includes a plurality of first optical subcarriers. Each first optical subcarrier is associated with a different one of the first server computers.

Each of the first server computers receives, using a respective one of the second transceivers, the first data from the first network switch (step 1804).

Each of the first server computers extracts, from the first data, a respective portion of the first data addressed to the first server computer (1806). In some implementations, the portion of the first data addressed to the first server computer can be extracted by extracting a portion of the first data from the first optical subcarrier associated with the sever computer.

In some implementations, a second network can include a third transceiver, where the third transceiver is configured to transmit data according to a third maximum throughput. Further, each first network switch of a plurality of network switches can include a respective fourth transceiver, where each fourth transceiver is configured to transmit data according to a fourth maximum throughput, and where the third maximum throughput is greater than the fourth maximum throughput. The process can further include transmitting, by the second network switch using the fourth transceiver according to the fourth maximum throughput, second data to each of the first network switches. The second data can include a plurality of second optical subcarriers, where each second optical subcarrier is associated with a different one of the first network switches. The process can also include receiving, by the each of the first network switches using a respective one of the fourth transceivers, the second data from the second network switch, and extracting, by the each of the first network switches from the second data, a respective portion of the second data addressed to the first network switch. In some implementations, extracting the respective portion of the second data corresponding to the first network switch can include extracting a portion of the second data from the second optical subcarrier associated with the first network switch.

In some implementations, the second network switch can further include one or more fifth transceivers. The method can further include comprises transmitting, receiving or both transmitting and receiving, by the second network switch, third data from a wide area network using the one or more fifth transceivers.

In some implementations, at least one of the first network switches can be a top of rack network switch.

In some implementations, the second network switch can be a core network switch.

In some implementations, the process can also include transmitting, by at least one of the first server computers using the second transceiver, second data to the first network switch according to the second maximum throughput. The second data can include a second optical subcarrier, where the second optical subcarrier is associated with the first network switch.

In some implementations, the first data can be transmitted using the first transceiver of the first network switch to each of the second receivers of the first server computers.

In some implementations, the second data can be transmitted using the second transceiver of the at least one of the first server computers to the first transceiver of the first network switch.

Figure 18B:
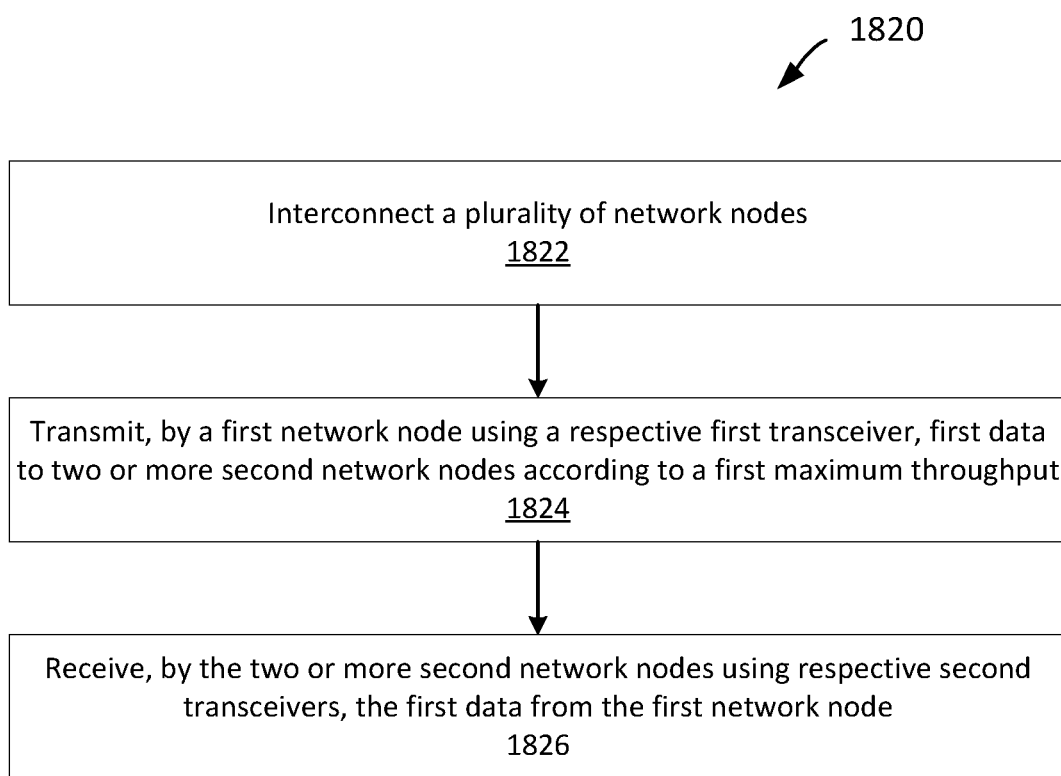
FIG. 18B is a flow diagram of another example process for transmitting data.

Another example process 1820 for transmitting data is shown in FIG. 18B. In some implementations, the process 1820 can be performed by one or more of the components of the systems described herein.

According to the process 1820, a plurality of network nodes are interconnected (step 1822). Each network node includes one or more respective first transceivers, and one or more respective second transceivers. Each first transceiver is configured to transmit data according to a first maximum throughput. Each second transceiver is configured to transmit data according to a second maximum throughput. The first maximum throughput is greater than the second maximum throughput.

A first network node from among the plurality of network nodes transmits, using a respective one of the first transceivers, first data to two or more second network nodes from among the plurality of network nodes according to the first maximum throughput (step 1824). The first data includes a plurality of optical subcarriers. Each optical subcarrier is associated with a different one of the two more other network nodes.

The two or more second network nodes receive, using respective ones of the second transceivers, the first data from the first network node (step 1826).

In some implementations, each network node of the plurality of network nodes can be communicatively coupled to each other network node of the plurality of network nodes.

In some implementations, for each network node of the plurality of network nodes, at least one of the first transceivers of the network node can be communicatively coupled to at least one of the second transceivers of each other network node of the plurality of network nodes.

In some implementations, at least one of the network nodes of the plurality of network nodes can be communicatively coupled to only a subset the other network nodes of the plurality of network nodes.

In some implementations, for each network node of the plurality of network nodes, at least one of the first transceivers of the network node can be communicatively coupled to at least one of the second transceivers of only a subset of the other network nodes of the plurality of network nodes.

In some implementations, the process can also include extracting, by each of the two more second network nodes, from the first data, a portion of the first data addressed to the that second network node. Extracting, by each of the two more second network nodes, the portion of the first data corresponding to the network node can include extracting the portion of the first data from the optical subcarrier associated with that second network node.

In some implementations, at least some of the first transceivers of the first network node can be communicatively coupled to at least two of the second transceivers of the second network node.

In some implementations, the first data can be transmitted using the first transceiver of the first network node to each of the second receivers of the two or more second network nodes.

In some implementations, the process can further include transmitting, using the second transceiver, second data to the first network node according to the second maximum throughput. The second data can include a second optical subcarrier. The second optical subcarrier can be associated with the first network node.

Figure 18C:
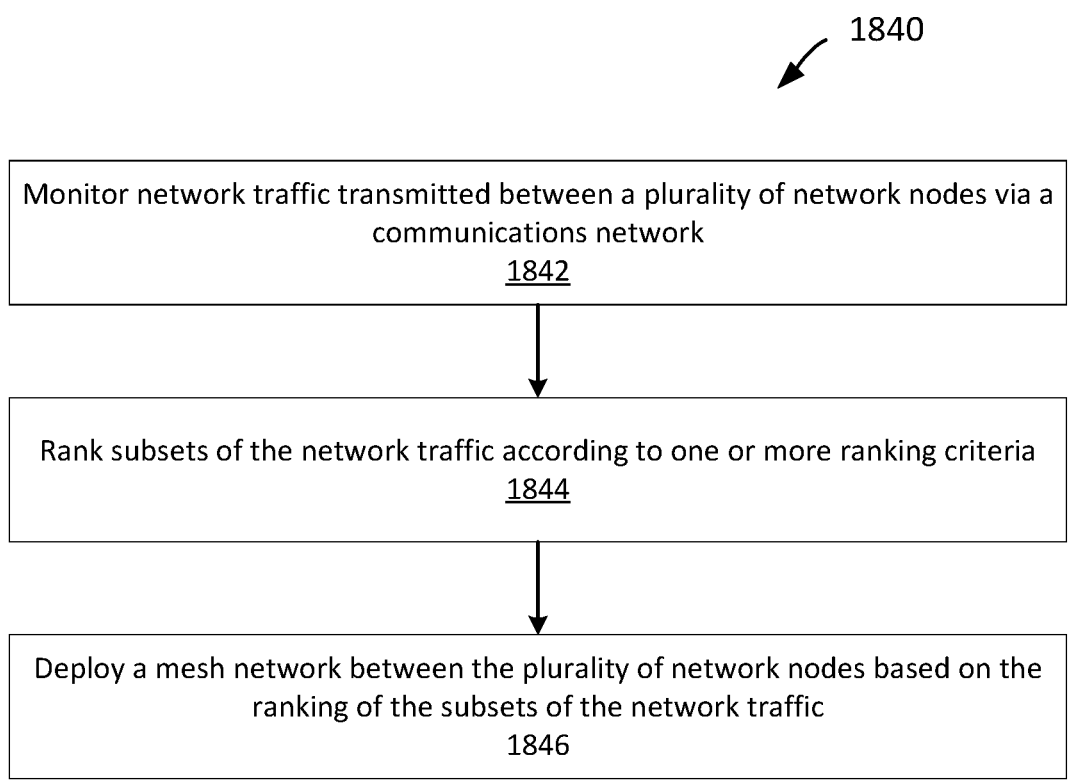
FIG. 18C is a flow diagram of an example process for designing and deploying a network having an asymmetric mesh configuration.

An example process 1840 for designing and deploying a network having an asymmetric mesh configuration is shown in FIG. 18C. In some implementations, the process 1840 can be performed by one or more of the components of the systems described herein.

According to the process 1840 network traffic transmitted between a plurality of network nodes via a communications network is monitored (step 1842).

Subsets of the network traffic are ranked according to one or more ranking criteria (step 1844). In some implementations, the one or more ranking criteria can include a criterion regarding a data size of the network traffic transmitted between respective network nodes from among the plurality of network nodes, a criterion regarding a frequency by which the network traffic is transmitted between respective network nodes from among the plurality of network nodes, a criterion regarding a directionality by which the network traffic is transmitted between respective network nodes from among the plurality of network nodes, and/or a criterion regarding a utilization percentage of the communications network in transmitting the network traffic.

A mesh network is deployed between the plurality of network nodes based on the ranking of the subsets of the network traffic (step 1844). The mesh network includes a plurality of network links. Each network link communicatively couples a respective network node from among the plurality of network nodes to another respective network node from among the plurality of network nodes.

Deploying the mesh network between the plurality of network nodes can include determining, a respective rank for each of the subsets of the network traffic. Each of the subsets of the network traffic can be transmitted from a respective source network node from among the plurality of network nodes to a respective destination network node from among the plurality of network nodes. Deploying the mesh network between the plurality of network nodes can also include determining that a first subset of the network traffic has the highest rank from among the subsets of the network traffic, and deploying a network link between the source network node and the destination node corresponding to the first subset of the network traffic.

In some implementations, deploying the mesh network between the plurality of network nodes can include determining that a second subset of the network traffic has the second highest rank from among the subsets of the network traffic, and deploying a network link between the source network node and the destination node corresponding to the second subset of the network traffic.

In some implementations, the process can also include transmitting one or more optical subcarriers using the plurality of network links.

In some implementations, at least one of the network links can communicatively couple (i) a first transceiver of a first network node from among the plurality of network nodes and (ii) a second transceiver of a second network node from among the plurality of network nodes. The first transceiver can be configured to transmit data using the at least one of the network links according to a first maximum throughput. The second transceiver can be configured to transmit data according to a second maximum throughput. The first maximum throughput can be greater than the second maximum throughput.

In some implementations, the mesh network can communicatively couple at least one network node from among the plurality of network nodes to only a subset of other network nodes from among the plurality of network nodes.

In some implementations, the process can further include removing at least a portion of the communications network after deploying the mesh network.

In some implementations, deploying the mesh network can include deploying network links between the plurality of network nodes until one or more stop criteria are met. The one or more stop criteria a criterion that a number of deployed network links equals to maximum number of network links, a criterion that the subsets of the network traffic associated with the deployed network links account for a threshold percentage of the network traffic, and/or a criterion that an amount of monetary resources allotted or used to deploy the network links meets or exceeds a threshold amount.

Figure 18D:
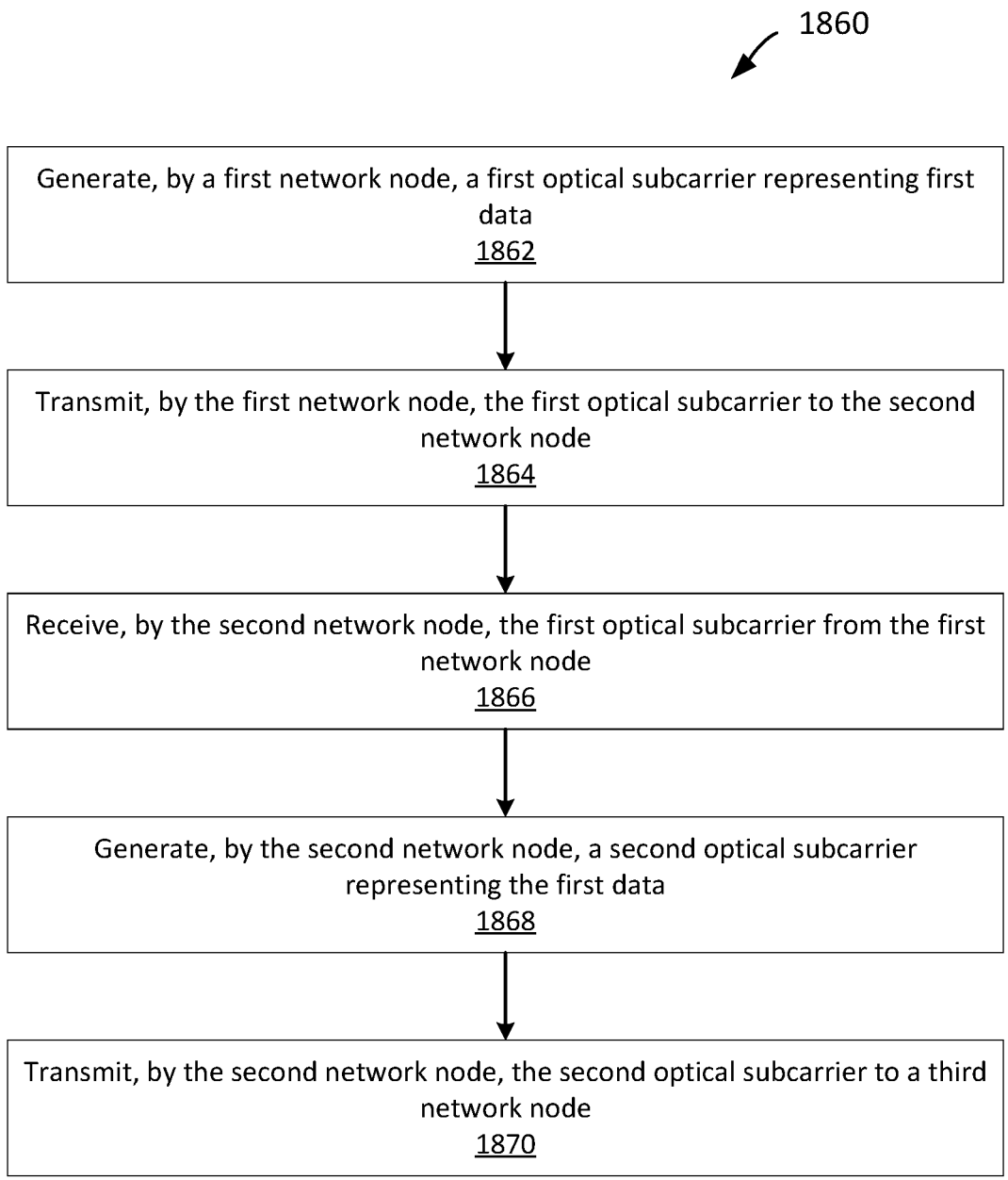
FIG. 18D is a flow diagram of another example process for transmitting data.

An example process 1860 for transmitting data is shown in FIG. 18D. In some implementations, the process 1860 can be performed by one or more of the components of the systems described herein.

According to the process 1860, a first network node generates a first optical subcarrier representing first data (step 1862).

The first network node transmits the first optical subcarrier to the second network node (step 1864).

The second network node receives the first optical subcarrier from the first network node (step 1866).

The second network node generates a second optical subcarrier representing the first data (step 1868). The second optical subcarrier is different from the first optical subcarrier.

The second network node transmits the second optical subcarrier to a third network node (step 1870).

In some implementations, the process can include receiving, by the third network node, the second optical subcarrier from the second network node, and determining, by the third network node, the first data based on the second optical subcarrier.

In some implementations, the process can also include generating, by the second network node, a third optical subcarrier representing the first data. The third wavelength can be different from the second optical subcarrier. The process can also include transmitting, by second network node, the third optical subcarrier to a fourth network node, receiving, by the fourth network node, the third optical subcarrier from the second network node, and determining, by fourth network node, the first data based on the third optical subcarrier.

In some implementations, the process can also include receiving, by third network node, the second optical subcarrier from the second network node, and generating, by third network node, a third optical subcarrier representing the first data. The third optical subcarrier can be different from the second optical subcarrier. The process can also include transmitting, by the third network node, the third optical subcarrier to a fourth network node, receiving, by the fourth network node, the third optical subcarrier from the third network node, and determining, by the fourth network node, the first data based on the third signal.

In some implementations, the third network node can be associated with the second optical subcarrier. Wherein a fourth network node can be associated with a third optical subcarrier. The third optical subcarrier can be different from the second optical subcarrier. The process can also include further transmitting, by the second network node, the second optical subcarrier to the third network node and the fourth network node concurrently.

In some implementations, the process can also include generating, by the second network node, a third optical subcarrier representing second data, and transmitting, by the second network node, the third optical subcarrier to the third network node and the fourth network node concurrently.

In some implementations, the process can also include transmitting, by the second network node, the second optical subcarrier and the third optical subcarrier concurrently to each of the third network node and the fourth network node.

In some implementations, the second optical subcarrier can be transmitted to the third network node and the fourth network node at a first time, and the third optical subcarrier can be transmitted to the third network node and the fourth network node at a second time different from the first time.

In some implementations, the process can also include generating, by a first laser of the first network node, the first optical subcarrier by modulating an output of the first laser according to a first carrier frequency.

In some implementations, the process can also include generating, by a second laser of the second network node, the second optical subcarrier by modulating an output of the second laser according to a second carrier frequency.

In some implementations, the first optical subcarrier and the second optical subcarrier can be Nyquist subcarriers.

In some implementations, the process can also include interpreting, by the second network node, the first optical subcarrier according to a local oscillator signal having a first frequency. The second optical subcarrier can be generated according to a transmitter oscillator signal having a second frequency, wherein the first frequency is equal to the second frequency. In some implementations, the local oscillator signal and the transmitter oscillator signal can be provided by a common laser.

Example Systems

Some implementations of subject matter and operations described in this specification can be implemented in digital electronic circuitry, or in computer software, firmware, or hardware, including the structures disclosed in this specification and their structural equivalents, or in combinations of one or more of them. For example, in some implementations, some or all of the components described herein can be implemented using digital electronic circuitry, or in computer software, firmware, or hardware, or in combinations of one or more of them. In another example, the process ###can be implemented using digital electronic circuitry, or in computer software, firmware, or hardware, or in combinations of one or more of them.

Some implementations described in this specification can be implemented as one or more groups or modules of digital electronic circuitry, computer software, firmware, or hardware, or in combinations of one or more of them. Although different modules can be used, each module need not be distinct, and multiple modules can be implemented on the same digital electronic circuitry, computer software, firmware, or hardware, or combination thereof.

Some implementations described in this specification can be implemented as one or more computer programs, i.e., one or more modules of computer program instructions, encoded on computer storage medium for execution by, or to control the operation of, data processing apparatus. A computer storage medium can be, or can be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

Some of the processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and processors of any kind of digital computer. Generally, a processor will receive instructions and data from a read only memory or a random access memory or both. A computer includes a processor for performing actions in accordance with instructions and one or more memory devices for storing instructions and data. A computer may also include, or be operatively coupled to receive data from or transfer data to, or both, one or more mass storage devices for storing data, e.g., magnetic, magneto optical disks, or optical disks. However, a computer need not have such devices. Devices suitable for storing computer program instructions and data include all forms of non-volatile memory, media and memory devices, including by way of example semiconductor memory devices (e.g., EPROM, EEPROM, flash memory devices, and others), magnetic disks (e.g., internal hard disks, removable disks, and others), magneto optical disks, and CD-ROM and DVD-ROM disks. The processor and the memory can be supplemented by, or incorporated in, special purpose logic circuitry.

A computer system may include a single computing device, or multiple computers that operate in proximity or generally remote from each other and typically interact through a communication network. Examples of communication networks include a local area network ("LAN") and a wide area network ("WAN"), an inter-network (e.g., the Internet), a network comprising a satellite link, and peer-to-peer networks (e.g., ad hoc peer-to-peer networks). A relationship of client and server may arise by virtue of computer programs running on the respective computers and having a client-server relationship to each other.

Figure 19:
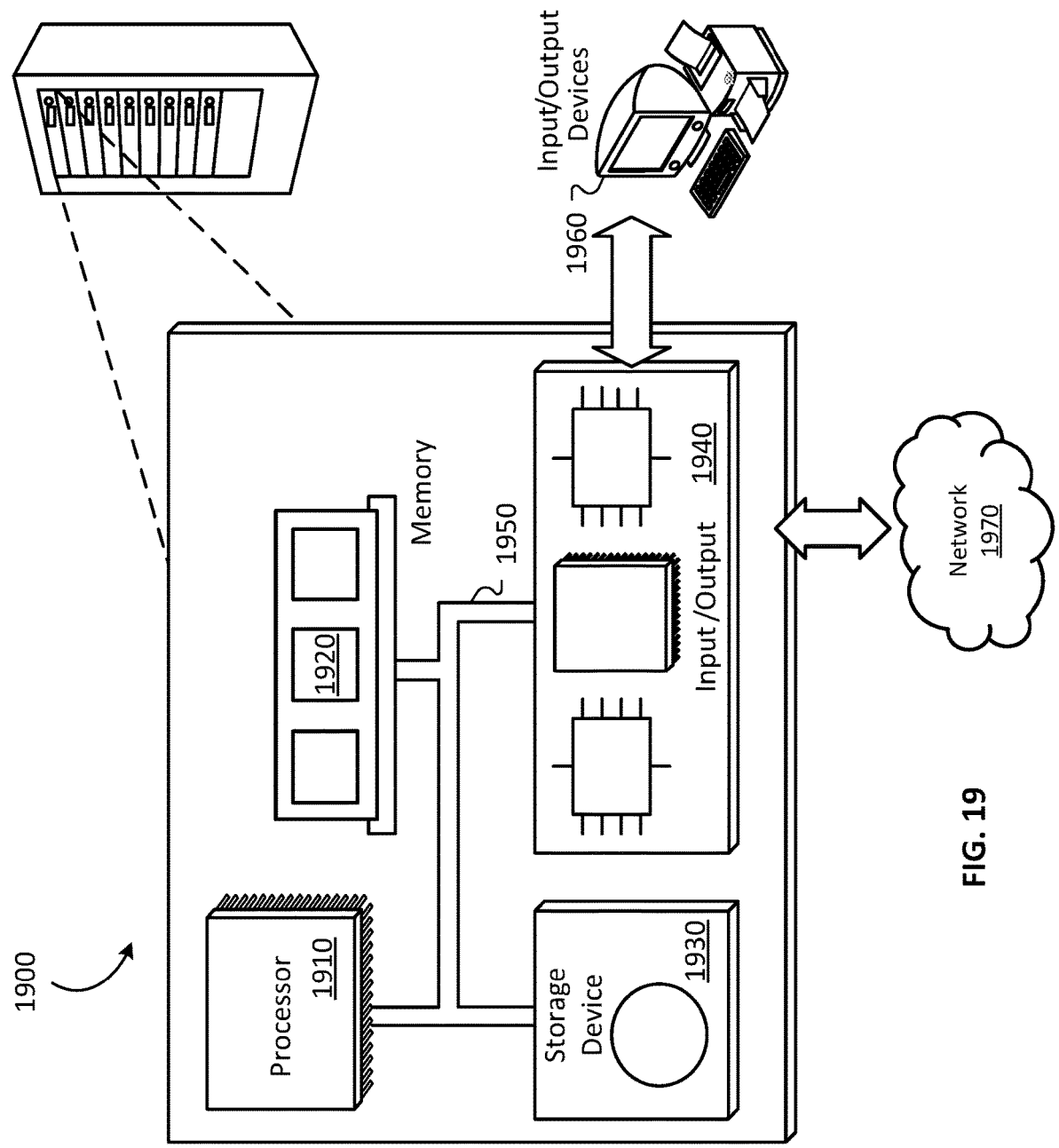
FIG. 19 is a diagram of an example computer system.

FIG. 19 shows an example computer system 1900 that includes a processor 1900, a memory 1920, a storage device 1930 and an input/output device 1940. Each of the components 1910, 1920, 1930 and 1940 can be interconnected, for example, by a system bus 1950. The processor 1910 is capable of processing instructions for execution within the system 1900. In some implementations, the processor 1910 is a single-threaded processor, a multi-threaded processor, or another type of processor. The processor 1910 is capable of processing instructions stored in the memory 1920 or on the storage device 1930. The memory 1920 and the storage device 1930 can store information within the system 1900.

The input/output device 1940 provides input/output operations for the system 1900. In some implementations, the input/output device 1940 can include one or more of a network interface device, e.g., an Ethernet card, a serial communication device, e.g., an RS-232 port, and/or a wireless interface device, e.g., an 802.11 card, a 3G wireless modem, a 4G wireless modem, a 5G wireless modem, etc. for communicating with a network 1970 (e.g., via one or more network devices, such as core switches, ToR switches, and/or other network devices). In some implementations, the input/output device can include driver devices configured to receive input data and send output data to other input/output devices, e.g., keyboard, printer and display devices 1960. In some implementations, mobile computing devices, mobile communication devices, and other devices can be used.

While this specification contains many details, these should not be construed as limitations on the scope of what may be claimed, but rather as descriptions of features specific to particular examples. Certain features that are described in this specification in the context of separate implementations can also be combined. Conversely, various features that are described in the context of a single implementation can also be implemented in multiple embodiments separately or in any suitable sub-combination.

A number of implementations have been described. Nevertheless, it will be understood that various modifications may be made without departing from the spirit and scope of the invention. Accordingly, other implementations are within the scope of the claims.

What is claimed is:

1. A node for a communications network, comprising:
   a receiver having a plurality of receiver outputs, wherein the receiver is configured to receive from the communications network a first modulated optical signal, comprising a received first plurality of optical subcarriers, and to supply a plurality of data streams, each of the plurality of data streams being a respective data stream detected by the receiver from a corresponding one of the received first plurality of optical subcarriers, and each of the plurality of receiver outputs supplying a respective one of the plurality of data streams;
   a switch circuit having a plurality of switch inputs and a plurality of switch outputs, wherein each of the plurality of switch inputs is communicatively coupled to the receiver and configured to receive a respective one of the plurality of data streams supplied by the plurality of receiver outputs, and wherein each of the plurality of switch outputs is configured to supply a respective one of the plurality of data streams received at the plurality of switch inputs; and
   a transmitter having a plurality of transmitter inputs, wherein each of the plurality of transmitter inputs is communicatively coupled to a corresponding one of the plurality of switch outputs and is configured to receive a corresponding one of the plurality of data streams supplied by the plurality of switch outputs,
   wherein the transmitter is configured to supply to the communications network a second modulated optical signal based on the plurality of data streams received at the plurality of transmitter inputs, the second modulated optical signal carrying a second plurality of optical subcarriers, each of the second plurality of optical subcarriers being associated with a corresponding one of the plurality of data streams received at the plurality of transmitter inputs.

2. The node of claim 1, wherein one of the received first plurality of optical subcarriers has a first frequency and is associated with one of the plurality of data streams, and one of the second plurality of optical subcarriers has a second frequency and is associated with said one of the plurality of data streams.

3. The node of claim 2, wherein said one of the received first plurality of optical subcarriers carries information indicative of said one of the plurality of data streams, and said one of the second plurality of optical subcarriers carries the information indicative of said one of the plurality of data streams.

4. The node of claim 1, wherein the switch circuit comprises a cross-point switch.

5. The node of claim 1, wherein the receiver comprises:
   an optical hybrid circuit configured to receive at least a portion of the first modulated optical signal and a local oscillator signal;
   a photodiode circuit configured to receive mixing products output from the optical hybrid circuit based on said at least the portion of the first modulated optical signal and the local oscillator signal, and supply first electrical signals based on the mixing products;
   analog-to-digital conversion circuitry configured to receive the first electrical signals and supply second electrical signals based on the first electrical signals, the second electrical signals being digital signals; and
   a digital signal processor configured to output the plurality of data streams based on the second electrical signals.

6. The node of claim 5, further comprising a local oscillator laser configured to supply the local oscillator signal.

7. The node of claim 1, wherein the transmitter comprises:
   a digital signal processor configured to receive the plurality of data streams and output a plurality of digital signals based on the plurality of data streams;
   digital-to-analog conversion circuitry configured to output analog signals based on the digital signals;
   a plurality of driver circuits configured to supply drive signals based on the analog signals;
   a laser configured to supply an optical signal; and
   a modulator configured to receive the optical signal and supply the second modulated optical signal based on the drive signals.

8. The node of claim 1, wherein each of the received first plurality of optical subcarriers is a Nyquist subcarrier.

9. The node of claim 1, wherein each of the second plurality of optical subcarriers is a Nyquist subcarrier.

10. The node of claim 1, wherein, during a first time interval, the switch circuit has a first switch configuration, such that during the first time interval, a first one of the second plurality of optical subcarriers having a first frequency carries information associated with one of the plurality of data streams, and, during a second time interval, the switch circuit has a second switch configuration, such that a second one of the second plurality of subcarriers carries the information.

11. The node of claim 1, wherein the switch circuit has a first switch configuration based on a first control signal supplied to the switch circuit and the switch circuit has a second switch configuration based on a second control signal supplied to the switch circuit.

12. A node for a communications network, comprising:
a receiver having a plurality of receiver outputs, wherein the receiver is configured to receive from the communications network a first modulated optical signal comprising a received first plurality of optical subcarriers, and to supply a plurality of data streams, each of the plurality of data streams being a respective data stream detected by the receiver from a corresponding one of the received first plurality of optical subcarriers, and each of the plurality of receiver outputs supplying a respective one of the plurality of data streams;

a switch circuit having a plurality of switch inputs and a plurality of switch outputs, wherein each of the plurality of switch inputs is communicatively coupled to the receiver and configured to receive a respective one of the plurality of data streams supplied by the plurality of receiver outputs, and wherein each of the plurality of switch outputs is configured to supply a respective one of the plurality of data streams received at the plurality of switch inputs; and a first transmitter having a plurality of inputs, wherein each of the plurality of inputs of the first transmitter is communicatively coupled to a corresponding one of first ones of the plurality of switch outputs and is configured to receive a corresponding one of first ones of the plurality of data streams supplied by the plurality of switch outputs, wherein the first transmitter is configured to supply to the communications network a second modulated optical signal based on said first ones the plurality of data streams received at the plurality of inputs of the first transmitter, the second modulated optical signal carrying a second plurality of optical subcarriers, each of the second plurality of optical subcarriers being associated with a corresponding one of said first ones the plurality of data streams received at the plurality of inputs of the first transmitter; and a second transmitter having a plurality of inputs, wherein each of the plurality of inputs of the second transmitter is communicatively coupled to a corresponding one of second ones of the plurality of switch outputs and is configured to receive a corresponding one of second ones of the plurality of data streams supplied by the plurality of switch outputs, wherein the second transmitter is configured to supply to the communications network a third modulated optical signal based on said second ones of the plurality of data streams received at the plurality of inputs of the second transmitter, the third modulated optical signal carrying a third plurality of optical subcarriers, each of the third plurality of optical subcarriers being associated with a corresponding one of the second ones of the plurality of data streams received at the plurality of inputs of the second transmitter.

* * * * *